US009547553B1

(12) United States Patent
Khermosh et al.

(10) Patent No.: US 9,547,553 B1
(45) Date of Patent: Jan. 17, 2017

(54) DATA RESILIENCY IN A SHARED MEMORY POOL

(71) Applicant: Spring Microsystems Ltd., Tel Aviv (IL)

(72) Inventors: Lior Khermosh, Givataim (IL); Avner Braverman, Tel-Aviv (IL); Ofir Shalvi, Raanana (IL); Ofer Bar-Or, Ramat Gan (IL); Gal Zuckerman, Holon (IL)

(73) Assignee: Parallel Machines Ltd., Tel Aviv (IL)

( * ) Notice: Subject to any disclaimer, the term of this patent is extended or adjusted under 35 U.S.C. 154(b) by 117 days.

(21) Appl. No.: 14/641,401

(22) Filed: Mar. 8, 2015

Related U.S. Application Data

(60) Provisional application No. 61/950,326, filed on Mar. 10, 2014, provisional application No. 62/089,453, (Continued)

(51) Int. Cl.
*G06F 11/00* (2006.01)
*G06F 11/10* (2006.01)
(Continued)

(52) U.S. Cl.
CPC ....... *G06F 11/1088* (2013.01); *G06F 11/1064* (2013.01); *G11C 7/1072* (2013.01); *G11C 29/52* (2013.01)

(58) Field of Classification Search
CPC G06F 11/1064; G06F 11/1088; G11C 7/1072; G11C 29/52
See application file for complete search history.

(56) References Cited

U.S. PATENT DOCUMENTS

| | | |
|---|---|---|
| 5,185,871 A | 2/1993 | Frey et al. |
| 5,251,308 A | 10/1993 | Steven et al. |

(Continued)

FOREIGN PATENT DOCUMENTS

| | | |
|---|---|---|
| EP | 0154551 | 12/1987 |
| EP | 0557736 | 11/2005 |
| WO | 2013/177313 | 11/2013 |

OTHER PUBLICATIONS

Lim, Kevin, et al. "Thin servers with smart pipes: designing SoC accelerators for memcached." ACM SIGARCH Computer Architecture News 41.3 (2013): 36-47.

(Continued)

*Primary Examiner* — Joshua P Lottich
(74) *Attorney, Agent, or Firm* — Active Knowledge Ltd.

(57) ABSTRACT

Various systems to achieve data resiliency in a shared memory pool are presented. Multiple memory modules are associated with multiple data interfaces, one or multiple erasure-coding interfaces are communicatively connected with the multiple data interfaces, and multiple compute elements are communicatively connected with one or multiple erasure-coding interfaces. Data sets are erasure-coded, and the resulting fragments are stored in random access memory modules distributed throughout the system. Storage in RAM allows real-time fetching of fragments using random-access read cycles and streaming of fragments using random-access write cycles, in which read operations include reconstruction of data sets from fetched data fragments, and write operations allow conversion of data sets into fragments which are then streamed and distributively stored. Distributed memory creates data resiliency to reconstruct original data sets in cases such as data corruption, failure of a memory module, failure of a data interface, or failure of a compute element.

10 Claims, 48 Drawing Sheets

Related U.S. Application Data filed on Dec. 9, 2014, provisional application No. 62/109,663, filed on Jan. 30, 2015, provisional application No. 62/121,523, filed on Feb. 27, 2015.

(51) Int. Cl.
  *G11C 7/10* (2006.01)
  *G11C 29/52* (2006.01)

(56) References Cited

U.S. PATENT DOCUMENTS

| | | |
|---|---|---|
| 5,423,019 A | 6/1995 | Lin et al. |
| 5,544,345 A | 8/1996 | Carpenter et al. |
| 5,586,264 A | 12/1996 | Belknap et al. |
| 5,655,100 A | 8/1997 | Ebrahim et al. |
| 5,664,148 A | 9/1997 | Mulla et al. |
| 5,704,053 A | 12/1997 | Santhanam |
| 5,765,036 A | 6/1998 | Lim |
| 6,243,709 B1 | 6/2001 | Tung |
| 6,289,506 B1 | 9/2001 | Kwong et al. |
| 6,507,834 B1 | 1/2003 | Kabra et al. |
| 6,880,049 B2 | 4/2005 | Gruner et al. |
| 6,889,288 B2 | 5/2005 | Bono et al. |
| 6,931,630 B1 | 8/2005 | Cotner et al. |
| 6,978,261 B2 | 12/2005 | Cotner et al. |
| 6,988,139 B1 | 1/2006 | Jervis et al. |
| 6,988,180 B2 | 1/2006 | Kadatch |
| 7,111,125 B2 | 9/2006 | Hooker |
| 7,266,716 B2 | 9/2007 | Frolund et al. |
| 7,318,215 B1 | 1/2008 | Krishnan et al. |
| 7,536,693 B1 | 5/2009 | Manczak et al. |
| 7,571,275 B2 | 8/2009 | Nelson |
| 7,587,545 B2 | 9/2009 | Kashiwaya et al. |
| 7,596,576 B2 | 9/2009 | Venkatesh et al. |
| 7,685,367 B2 | 3/2010 | Ruia et al. |
| 7,739,287 B1 | 6/2010 | Chapman et al. |
| 7,818,541 B2 | 10/2010 | Rhoades et al. |
| 7,912,835 B2 | 3/2011 | Rajamani et al. |
| 7,934,020 B1 | 4/2011 | Xu et al. |
| 8,041,940 B1 | 10/2011 | Natanzon et al. |
| 8,051,362 B2 | 11/2011 | Li et al. |
| 8,181,065 B2 | 5/2012 | Fachan et al. |
| 8,209,664 B2 | 6/2012 | Yu et al. |
| 8,219,758 B2 | 7/2012 | Wang et al. |
| 8,224,931 B1 | 7/2012 | Brandwine et al. |
| 8,239,847 B2 | 8/2012 | Yu et al. |
| 8,296,743 B2 | 10/2012 | Linderman et al. |
| 8,327,071 B1 | 12/2012 | Danskin et al. |
| 8,386,840 B2 | 2/2013 | Stougie et al. |
| 8,392,880 B2 | 3/2013 | Ahadian et al. |
| 8,396,946 B1 | 3/2013 | Brandwine et al. |
| 8,402,061 B1 | 3/2013 | Briggs et al. |
| 8,433,849 B2 | 4/2013 | De Schrijver et al. |
| 8,473,778 B2 | 6/2013 | Simitci et al. |
| 8,527,719 B2 | 9/2013 | Klapman et al. |
| 8,589,666 B2 | 11/2013 | Hammes |
| 8,626,725 B2 | 1/2014 | Netz et al. |
| 8,700,683 B2 | 4/2014 | Cooney et al. |
| 8,707,098 B2 | 4/2014 | Anderson et al. |
| 8,713,074 B2 | 4/2014 | Adler |
| 8,726,129 B1 | 5/2014 | Aguilera et al. |
| 8,738,855 B2 | 5/2014 | De Spiegeleer et al. |
| 8,793,674 B2 | 7/2014 | Ravi et al. |
| 8,825,959 B1 | 9/2014 | Switakowski et al. |
| 8,874,535 B2 | 10/2014 | McKenney |
| 8,914,333 B2 | 12/2014 | Bird et al. |
| 8,977,818 B2 | 3/2015 | Wang et al. |
| 9,003,082 B2 | 4/2015 | Okada et al. |
| 9,052,948 B2 | 6/2015 | Munshi et al. |
| 9,135,351 B2 | 9/2015 | Mizobuchi et al. |
| 2002/0188594 A1 | 12/2002 | Kulp et al. |
| 2004/0015878 A1 | 1/2004 | Saito |
| 2004/0073752 A1 | 4/2004 | Musumeci |
| 2005/0114827 A1 | 5/2005 | Lane et al. |
| 2006/0053424 A1 | 3/2006 | Koistinen et al. |
| 2006/0107096 A1* | 5/2006 | Findleton ............ G06F 11/1076 714/6.32 |
| 2007/0124415 A1 | 5/2007 | Lev-Ran et al. |
| 2008/0133844 A1 | 6/2008 | Ramani et al. |
| 2008/0250046 A1 | 10/2008 | Nelson |
| 2009/0119460 A1 | 5/2009 | Lin et al. |
| 2010/0010962 A1 | 1/2010 | Sarapuk |
| 2010/0023524 A1 | 1/2010 | Gladwin et al. |
| 2010/0174968 A1 | 7/2010 | Charles et al. |
| 2010/0180006 A1 | 7/2010 | Nourbakhsh et al. |
| 2011/0029840 A1 | 2/2011 | Ozzie et al. |
| 2011/0145511 A1 | 6/2011 | Woffinden |
| 2011/0161681 A1* | 6/2011 | Dhuse ................. G06F 11/1092 713/193 |
| 2011/0320558 A1 | 12/2011 | Gross et al. |
| 2012/0023362 A1* | 1/2012 | Kadhe ...................... G06F 3/06 714/6.3 |
| 2012/0059934 A1 | 3/2012 | Rafiq et al. |
| 2012/0317365 A1 | 12/2012 | Elhamias |
| 2013/0081066 A1 | 3/2013 | Munshi et al. |
| 2013/0326264 A1* | 12/2013 | Resch ................. G06F 11/1088 714/6.2 |
| 2014/0129881 A1 | 5/2014 | De Schrijver et al. |
| 2014/0143465 A1 | 5/2014 | Mealey et al. |
| 2014/0351547 A1 | 11/2014 | Dietterich et al. |
| 2014/0359044 A1 | 12/2014 | Davis et al. |
| 2015/0019829 A1 | 1/2015 | Sivasubramanian et al. |
| 2015/0149732 A1 | 5/2015 | Kiperberg et al. |
| 2016/0011939 A1* | 1/2016 | Luby ................... G06F 11/1076 714/764 |

OTHER PUBLICATIONS

Blott, M., and K. Vissers. "Dataflow Architectures for 10Gbps Line-Rate Key-Value Stores." HotChips 2013 (2013).
Matthew Huxtable "A high-performance key-value store Computer Science Tripos, Part II" St John's College, May 15, 2014.
Rixner, Scott. Stream processor architecture. Springer Science & Business Media, 2001.
Collins, Jamison, et al. "Pointer cache assisted prefetching." Proceedings of the 35th annual ACM/IEEE international symposium on Microarchitecture. IEEE Computer Society Press, 2002.
Offloading Computation to your GPU http://www.centerspace.net/blog/offloading-computation-to-your-gpu/.
Topham, Nigel, et al. "Compiling and optimizing for decoupled architectures. 2.1 The target architecture" Supercomputing, 1995. Proceedings of the IEEE/ACM SC95 Conference. IEEE, 1995.

* cited by examiner

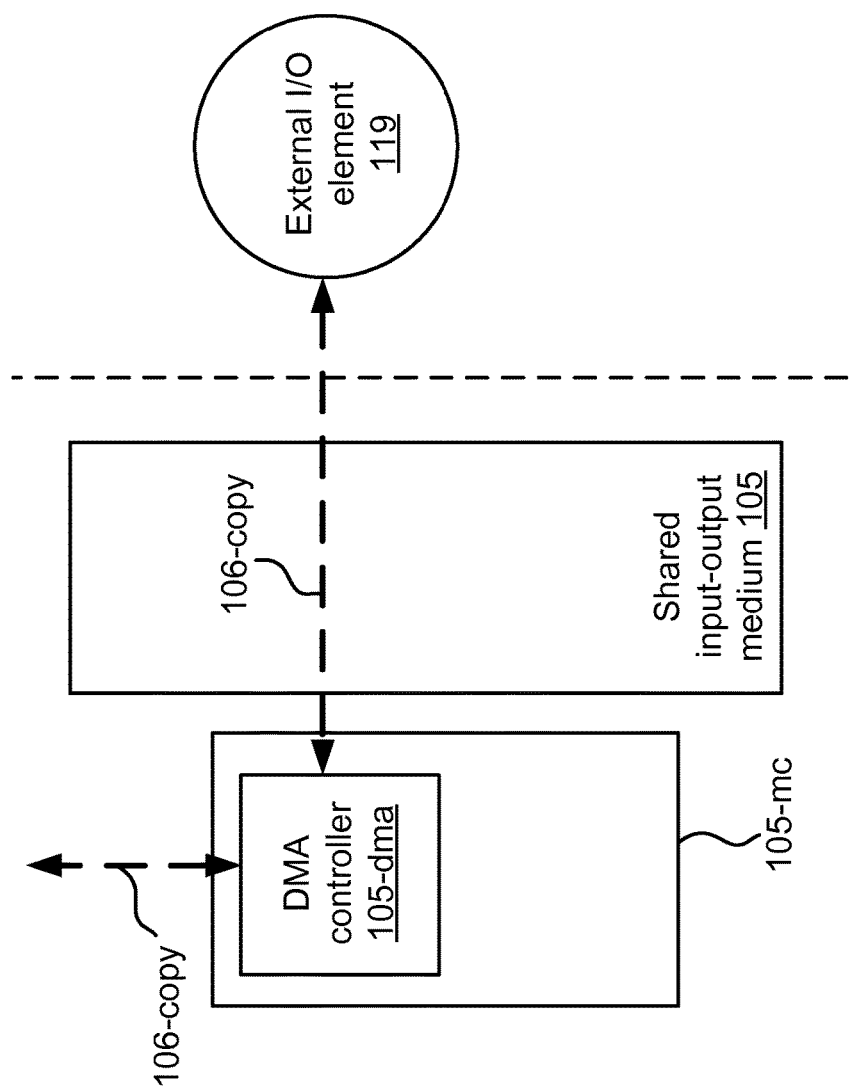

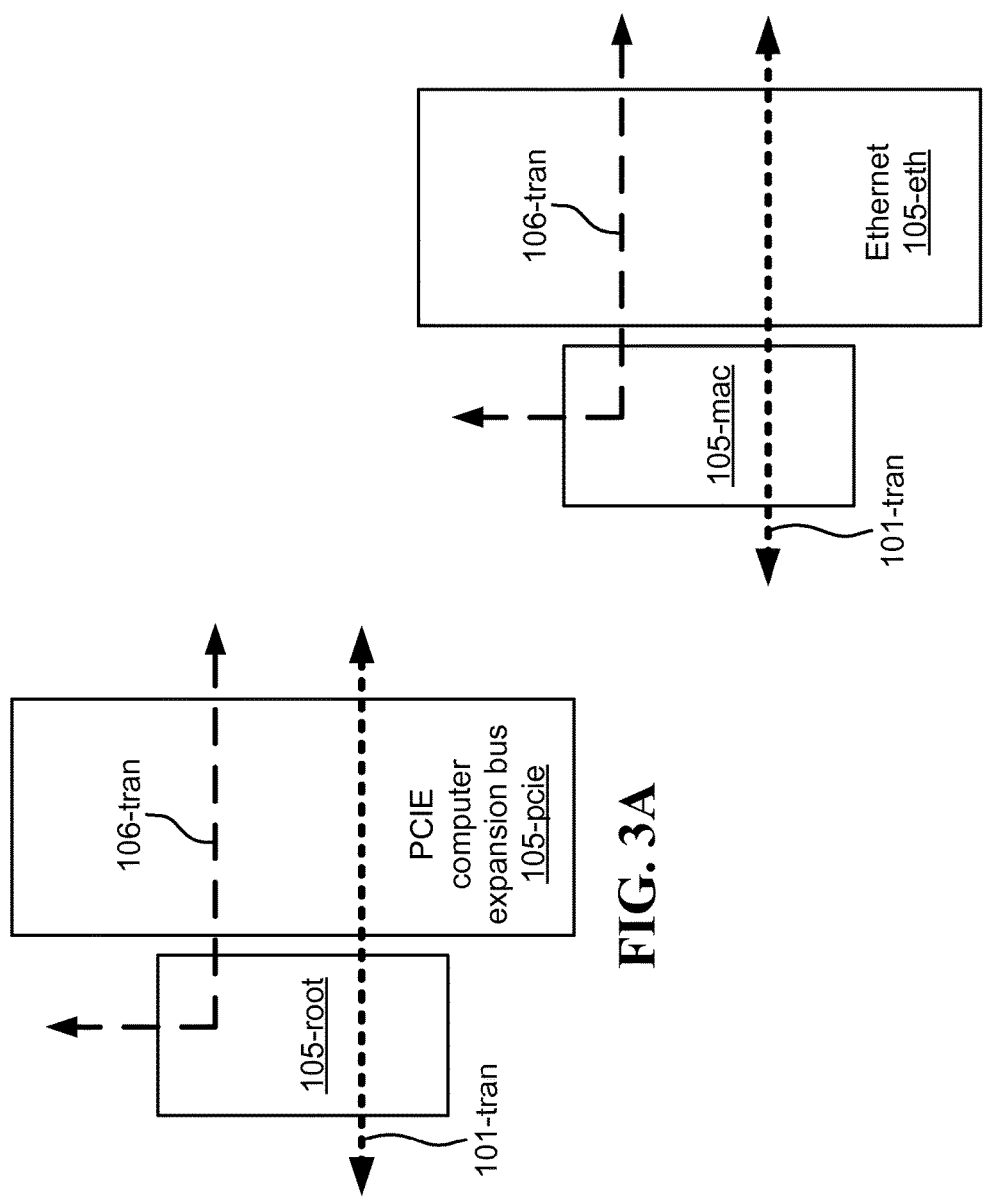

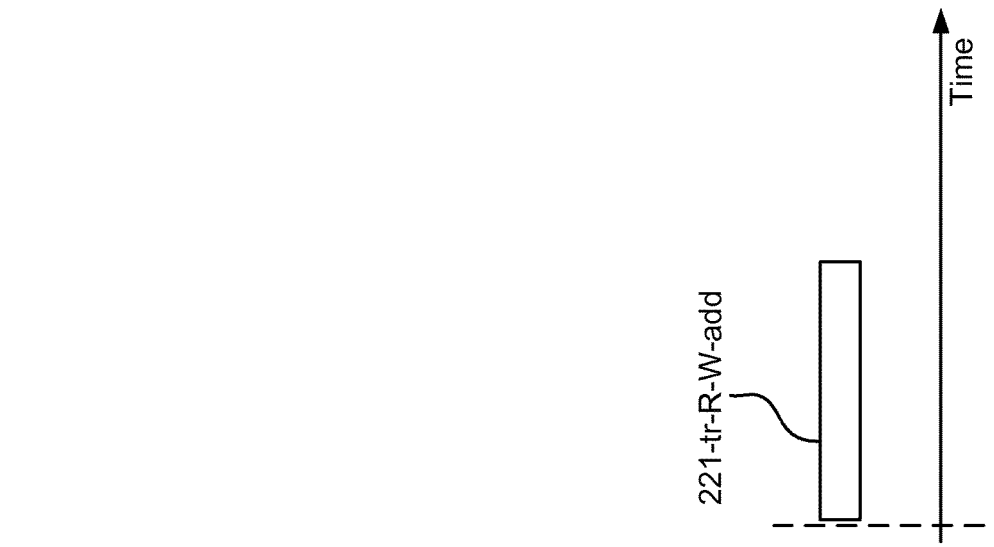
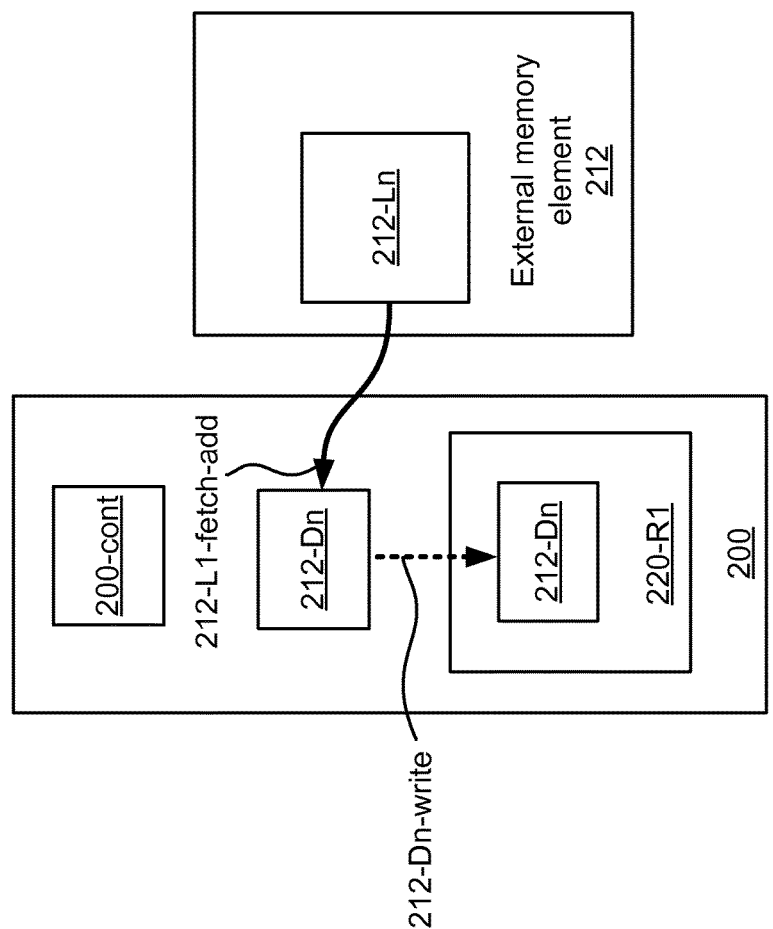
FIG. 7E
FIG. 7F

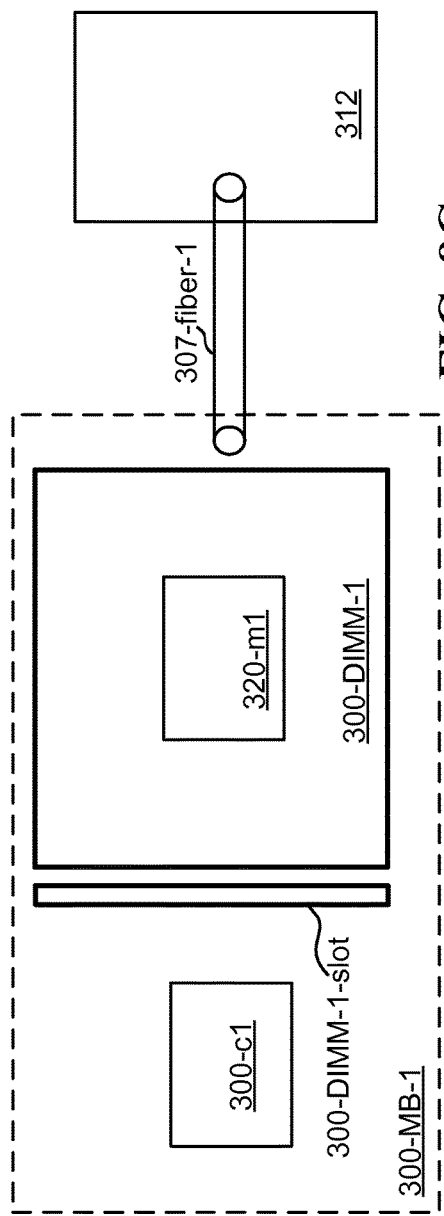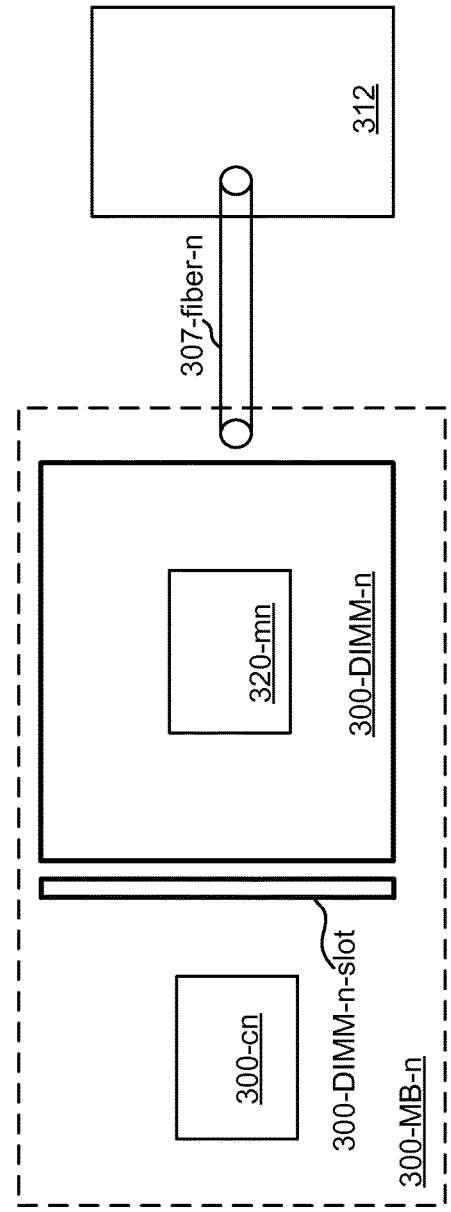

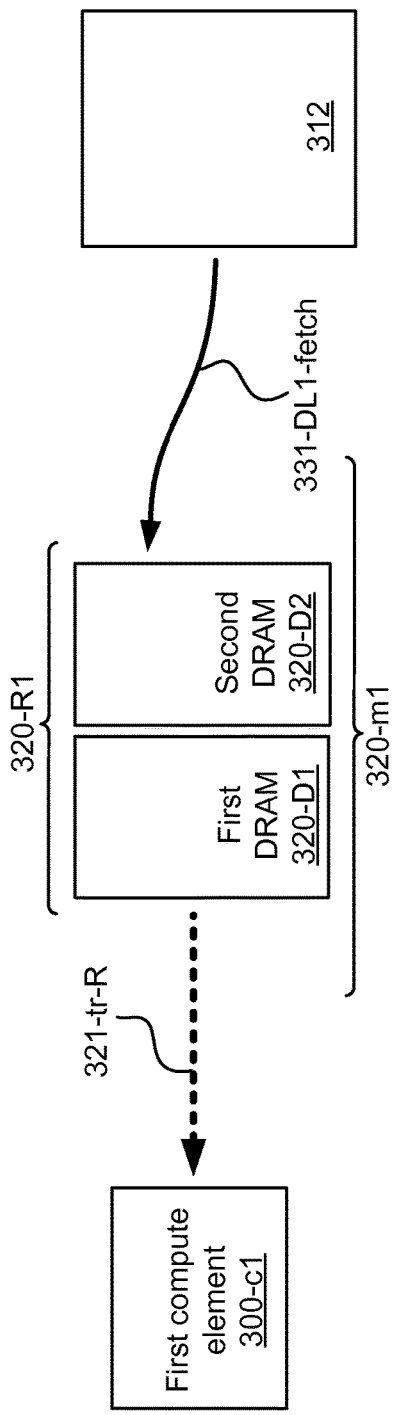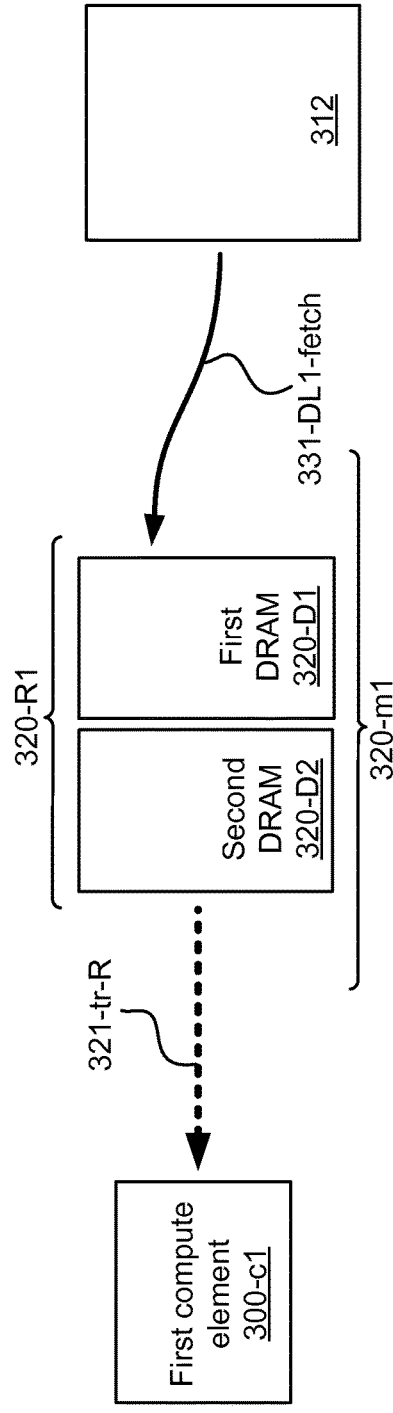

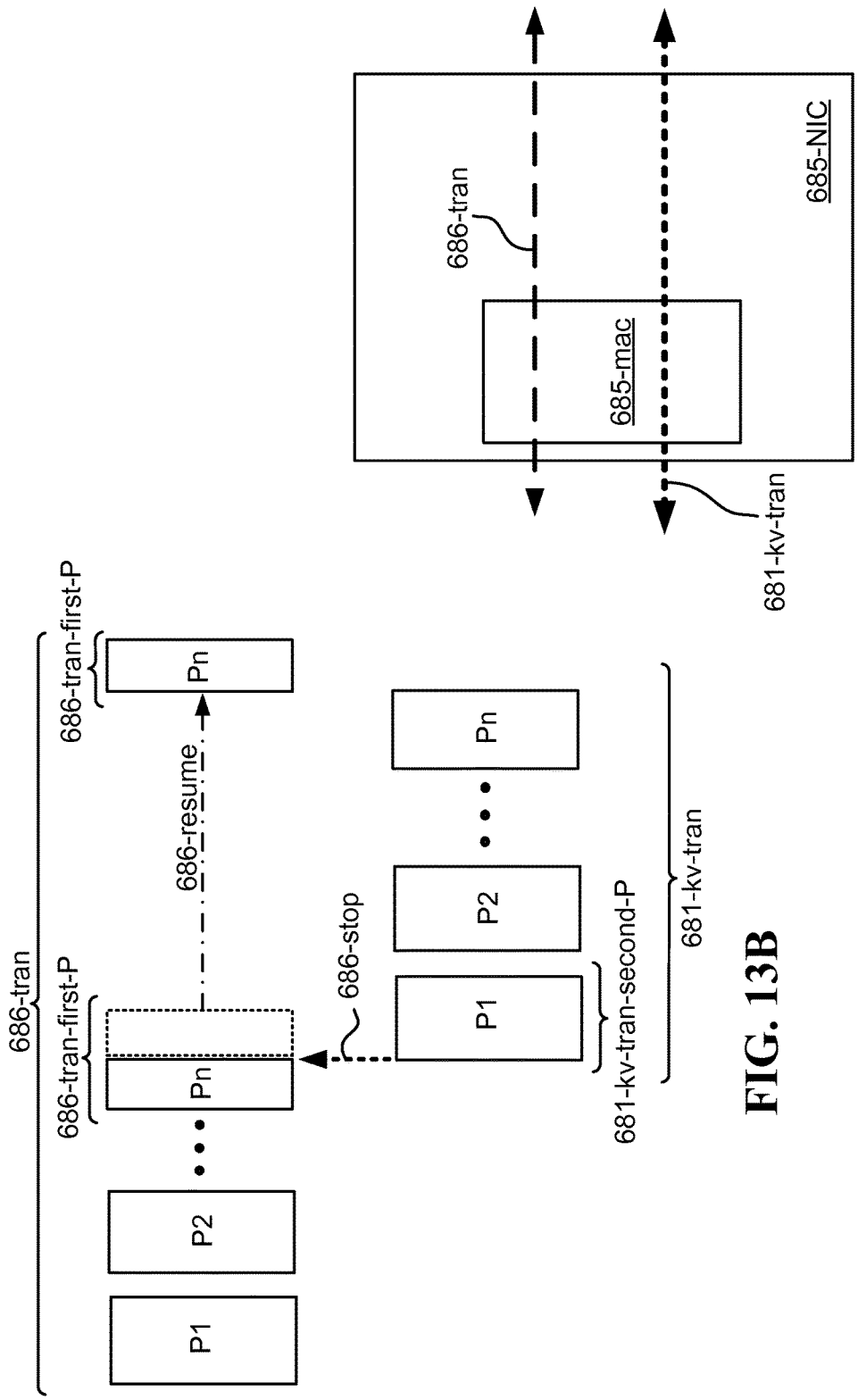

DATA RESILIENCY IN A SHARED MEMORY POOL

CROSS REFERENCE TO RELATED APPLICATIONS

The present application is related to and claims priority under 35 USC §120 to U.S. Provisional Application No. 61/950,326, filed on Mar. 10, 2014, which is hereby incorporated by reference.

The present application is also related to and claims priority under 35 USC §120 to U.S. Provisional Application No. 62/089,453, filed on Dec. 9, 2014, which is hereby incorporated by reference.

The present application is also related to and claims priority under 35 USC §120 to U.S. Provisional Application No. 62/109,663, filed on Jan. 30, 2015, which is hereby incorporated by reference.

The present application is also related to and claims priority under 35 USC §120 to U.S. Provisional Application No. 62/121,523, filed on Feb. 27, 2015, which is hereby incorporated by reference.

BACKGROUND

In a data processing system with multiple compute elements, one of the keys to high-quality performance is the provision of data resiliency in events such as loss or corruption of data, malfunction or destruction of software components, and malfunction or destruction of compute elements, data interfaces, memory modules, servers, and other physical elements of the system. However, constraints of speed and cost have impacted negatively on the provision of data resiliency. Needed are systems that maximize data resiliency without compromising speed and latency of memory transactions.

SUMMARY

Described herein are systems to provide data resiliency in events such as the loss or corruption of data, and the malfunction or destruction of elements of software or hardware in the system, while at the same time maximizing speed and minimizing latency of data access and providing options to effectively distribute the system across several elements.

One embodiment is a system operative to achieve data resiliency in a shared memory pool. In one particular form of such embodiment, the system includes a plurality of memory modules belonging to a shared memory pool and associated respectively with a plurality of data interfaces; a first erasure-coding interface communicatively connected with the plurality of data interfaces; and a first compute element communicatively connected with the first erasure-coding interface. Further, the plurality of memory modules are configured to distributively store a plurality of data sets, such that each data set is distributively stored among at least two of the memory modules in a form of a plurality of data fragments coded using a first erasure-coding scheme, and each data fragment is stored on a different one of the at least two memory modules. Further, the first compute element is configured to send to the first erasure-coding interface a request for one of the data sets. Further, the first erasure-coding interface is configured to (i) convert the request into a first plurality of secondary data requests; (ii) send said first plurality of secondary data requests respectively into at least a first sub-set of the plurality of data interfaces; (iii) receive as responses at least a sub-set of the plurality of data fragments associated with the one of the data sets; (iv) reconstruct the one of the data sets, using the first erasure-coding scheme, from the data fragments received; (v) and send the reconstruction to the first compute element as a response to the request made. Further, each of the plurality of data interfaces is configured to (i) receive, from the first erasure-coding interface, one of the plurality of secondary data requests; (ii) extract, from the respective memory module, using a random-access read cycle, one of the data fragments associated with the one secondary data request; and (iii) send the data fragment extracted to the first erasure-coding interface as part of the responses received by the first erasure-coding interface.

One embodiment is a system operative to stream data resiliently into a shared memory pool. In one particular form of such embodiment, the system includes a plurality of memory modules belonging to a shared memory pool and associated respectively with a plurality of data interfaces; a first erasure-coding interface communicatively connected with the plurality of data interfaces; and a first compute element communicatively connected with the first erasure-coding interface. Further, the first compute element is configured to stream a plurality of data sets into the first erasure-coding interface. Further, the first erasure-coding interface is configured to (i) receive the stream; (ii) convert in real-time each of the plurality of data sets in the stream into a plurality of data fragments using a first erasure-coding scheme; and (iii) stream each of said pluralities of data fragments respectively into said plurality of data interfaces, such that a plurality of sub-streams of data fragments are created in conjunction with the plurality of data interfaces. Further each of the data interfaces is configured to (i) receive one of the sub-streams of data fragments; and (ii) write in real-time each of the data fragments in the sub-stream into the respective memory module using a random-access write cycle. One result of the particular embodiments described here is a real-time erasure-coding of the stream of data sets into the shared memory pool as facilitated by the first erasure-coding interface and multiple random access write cycles each of which is associated with a data interface.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings:

FIG. 1D illustrates one embodiment of a system configured to implement a general communication transaction over a shared input-output medium;

FIG. 3A illustrates one embodiment of a system configured to mix cache related memory transactions together with general communication transactions over a shared input-output medium, in which such shared input-output medium is a PCIE computer expansion bus, and the medium controller is a root complex;

FIG. 3B illustrates one embodiment of a system configured to mix cache related memory transactions together with general communication transactions over a shared input-output medium, in which such shared input-output medium is an Ethernet connection, and the medium controller is a MAC layer;

FIG. 3C illustrates one embodiment of a system configured to mix cache related memory transactions together with general communication transactions over a shared input-output medium, in which such shared input-output medium is an InfiniBand interconnect;

FIG. 7E illustrates one embodiment of a system controller configured to fetch additional data elements from additional memory locations of an external memory, and write such data elements to RAM memory;

FIG. 7F illustrates one embodiment of a process by which a system the writing of additional data elements to RAM memory occurs essentially concurrently with additional synchronous random-access write cycles;

FIG. 8C illustrates one embodiment of a system configured to cache a shared memory pool using at least two memory modules, in which a first compute element is placed on a first motherboard, a first DIMM module is connected to the first motherboard via a first DIMM slot, and first data link is comprised of a first optical fiber;

FIG. 8D illustrates one embodiment of a system configured to cache a shared memory pool using at least two memory modules, in which a second compute element is placed on a second motherboard, a second DIMM module is connected to the second motherboard via a second DIMM slot, and a second data link is comprised of a second optical fiber;

FIG. 8H illustrates one embodiment of a system configured to cache a shared memory pool using at least two memory modules, wherein a memory module includes a first RAM comprising a first bank of RAM and a second bank of RAM;

FIG. 8I illustrates one embodiment of a system configured to cache a shared memory pool using at least two memory modules, wherein a memory module includes a first RAM comprising a first bank of RAM and a second bank of RAM;

FIG. 13B illustrates one embodiment of a system configured to interleave high priority key-value transactions together with lower priority transactions over a shared input-output medium, in which both types of transactions are packet-based transactions;

FIG. 13C illustrates one embodiment of part of a system configured to interleave high priority key-value transactions together with lower priority transactions over a shared input-output medium, comprising a network-interface-card (NIC) including a medium-access-controller (MAC);

DETAILED DESCRIPTION

Glossary

Figure 1A:
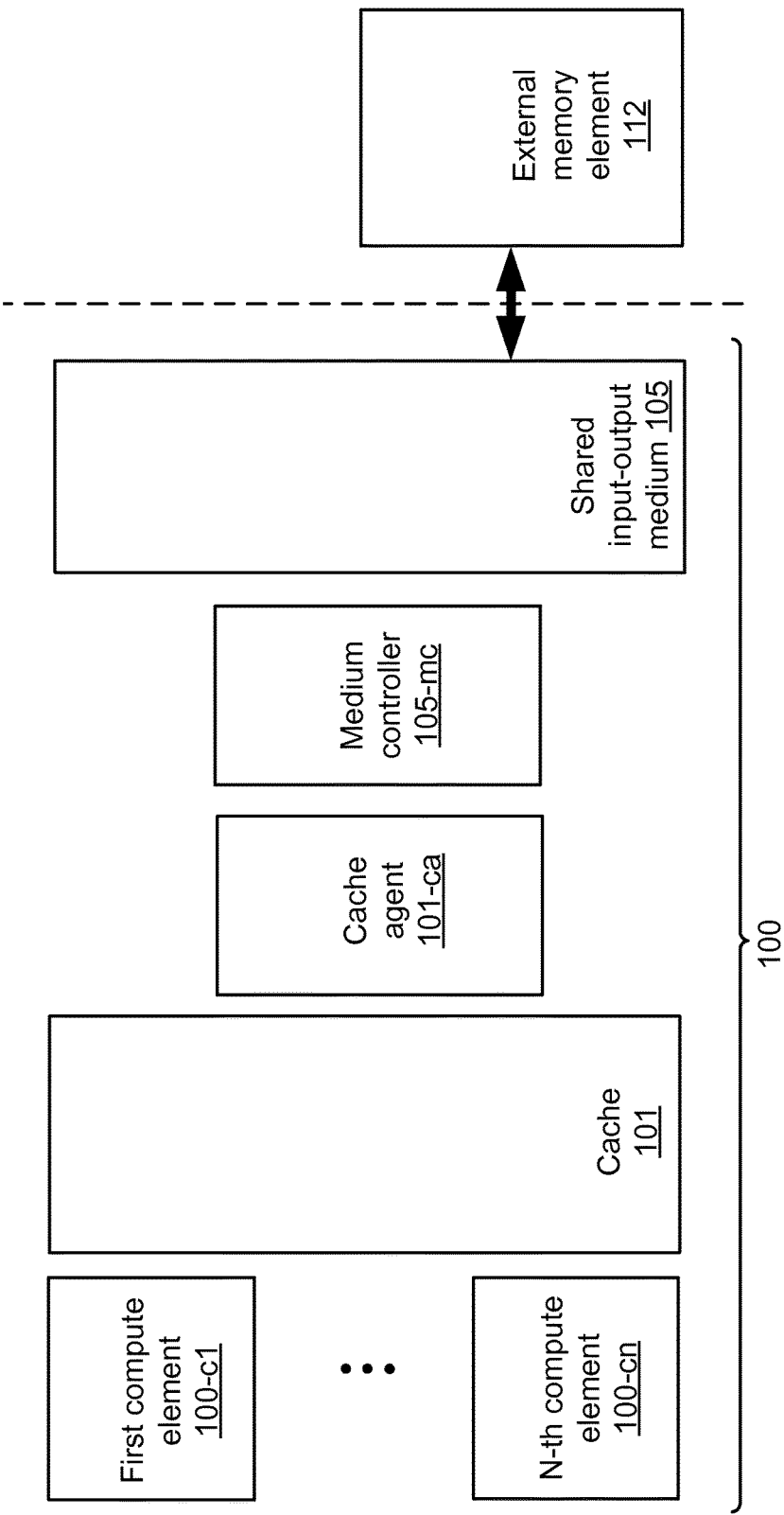
FIG. 1A illustrates one embodiment of a system configured to mix cache related memory transactions together with general communication transactions over a shared input-output medium.

In this description, "cache related memory transaction" or a "direct cache related memory transaction" is a transfer of one or more data packets to or from a cache memory. A "latency-critical cache transaction" is a cache transaction in which delay of a data packet to or from the cache memory is likely to delay execution of the task being implemented by the system.

In this description, "general communication transaction" is a transfer of one or more data packets from one part of a communication system to another part, where neither part is a cache memory.

In this description, a "communication transaction" is a transfer of one or more data packets from one part of a communication system to another part. This term includes both "cache related memory transaction" and "general communication transaction".

In this description, a "shared input-output medium" is part of a system that receives or sends both a data packet in a cache related memory transaction and a data packet in a general communication transaction. Non-limiting examples of "shared input-output medium" include a PCIE computer extension bus, an Ethernet connection, and an InfiniBand interconnect.

In this description, an "external I/O element" is a structural element outside of the system. Non-limiting examples include a hard disc, a graphic card, and a network adapter.

In this description, an "external memory element" is a structure outside the system that holds data which may be accessed by the system in order to complete a cache related memory transaction or other memory transactions.

In this description, "cache-coherency" is the outcome of a process by which consistency is achieved between a cache memory and one or more additional cache memory locations inside or external to the system. Generally, data will be copied from one source to the other, such that coherency is achieved and maintained. There may be a separate protocol, called a "cache-coherency protocol", in order to implement cache-coherency.

In this description, an "electro-optical interface" is a structure that allows conversion of an electrical signal into an optical signal, or vice versa.

In this description, a "prolonged synchronous random-access read cycle" is a synchronous RAM read cycle that has been lengthened in time to permit access from an external memory element.

In this description, "shared memory pool" is a plurality of memory modules that are accessible to at least two separate data consumers in order to facilitate memory disaggregation in a system.

In this description, "simultaneously" means "essentially simultaneously". In other words, two or more operations occur within a single time period. This does not mean necessarily that each operation consumes the same amount of time—that is one possibility, but in other embodiments simultaneously occurring operations consume different amounts of time. This also does not mean necessarily that the two operations are occurring continuously—that is one possibility, but in other embodiments an operation may occur in discrete steps within the single time period. In this description, "simultaneity" is the action of two or more operations occurring "simultaneously".

In this description, "efficiently" is a characterization of an operation whose intention and/or effect is to increase the utilization rate of one or more structural elements of a system. Hence, "to efficiently use a compute element" is an operation that is structured and timed such that the utilization rate of the compute element is increased. Hence, "efficiently mixing and timing at least two key-value transactions" is an operation by which two or more needed data values are identified, requested, received, and processed, in such a manner that the utilization rate of the compute element in increased.

In this description, "utilization rate" is the percentage of time that a structural element of a system is engaged in useful activity. The opposite of "utilization rate" is "idle rate".

In this description, a "needed data value" is a data element that is held by a server and needed by a compute element to complete a compute operation being conducted by the compute element. The phrase "data value" and the word "value" are the same as "needed data value", since it is understand that in all cases a "value" is a "data value" and in all cases a "data value" is needed by a compute element for the purpose just described.

In this description, "derive" is the operation by which a compute element determines that a needed data value is held by one or more specific servers. The phrase "derive" sometimes appears as "identify", since the objective and end of this operation is to identify the specific server or servers holding the needed data value. If a needed data value is held in two or more servers, in some embodiments the compute element will identify the specific server that will be asked to send the needed data value.

In this description, "request" is the operation by which a compute element asks to receive a needed set of data or data value from a server holding that set of data or data value. The request may be sent from the compute element to either a NIC and then to a switched network or directly to the switched network. The request is then sent from the switched network to the server holding the needed data value. The request may be sent over a data bus.

In this description, "propagation of a request" for a needed data value is the period of time that passes from the moment a compute element first sends a request to the moment that that the request is received by a server holding the needed data value.

In this description, "get" is the operation by which a compute element receives a needed data value from a server. The needed data value is sent from the server to a switching network, optionally to a NIC and then optionally to a DMA controller or directly to the DMA controller, and from the DMA controller or the NIC or the switching network either directly to the compute element or to a cache memory from which the compute element will receive the needed data value.

In this description, "process" is the operation by which a compute element performs computations on a needed data value that it has received. In other words, the compute element fulfills the need by performing computations on the needed data element. If, for example, the social security number of a person is required, the "needed data value" may be the person's name and number, and the "process" may by the operation by which the compute element strips off the number and then applies it in another computation or operation.

In this description, "compute element" is that part of the system which performs traditional computational operations. In this description, it may be the part of the system that performs the derive, request, and process operations. In some embodiments, the compute element also receives the needed data value from a server, via a switching network, a DMA, and optionally a NIC. In other embodiments, the requested data value is not received directly by the compute element, but is received rather by the cache memory, in which case the compute element obtains the needed value from the cache memory. A compute element may or may not be part of a CPU that includes multiple compute elements.

In this description, "executing the request" is the operation during which a server that has received a request for a needed data value identifies the location of the needed data value and prepares to send the needed data value to a switching network.

In this description, "key-value transaction" is the set of all the operations in which a location of a needed data value is "derived" from a key, the data value is "requested" optionally with the key sent by a compute element through a communication network to a server holding the data value, the request received by the server, "executed" by the server, the data value sent by the server through the communication network, "gotten" by the compute element, and "processed" by the compute element.

In this description, "latency-critical" means that a delay of processing a certain request for a value may cause a delay in system operation, thereby introducing an inefficiency into the system and degrading system performance. In some embodiments, the period of time for a "latency-critical" operation is predefined, which means that exceeding that predefined time will or at least may degrade system performance, whereas completing the operation within that period of time will not degrade system performance. In other embodiments, the time period that is "latency-critical" is predefined, but is also flexible depending on circumstances at the particular moment of performing the latency-critical operation.

In this description, "determining" whether a compute element is authorized to access a particular data set in a shared memory pool is the process that determines whether a particular compute element in a system has been authorized by some reliable source to access a particular data set that is stored in a shared memory pool.

In this description, "accessing" a data set encompasses any or all of entering an original value in a data set, requesting to receive an existing data set, receiving an existing data set, and modifying one or more values in an existing data set.

In this description, "preventing" delivery of a data set to a compute element is the process by which an access controller or other part of a system prevents such data set from being delivered to the compute element, even though specifically requested by the compute element. In some cases, denial of access is total, such that the compute element may not access any part of the data set. In some cases, denial access is partial, such that the compute element may access part but not all of a data set. In some cases, denial is conditional, such that the compute element may not access the data set in its current form, but the system may modify the data set such that the compute element may access the modified data set. The prevention of delivery may be achieved using various techniques, such as blocking of communication, interfering with electronic processes, interfering with software processes, altering addresses, altering data, or any other way resulting in such prevention.

In this description, "data set" is a data structure that a compute element might access in order for the compute element to process a certain function. A data set may be a single data item, or may be multiple data items of any number or length.

In this description, a "server" may be a computer of any kind, a motherboard (MB), or any other holder of structures for either or both of data memory and data processing.

In this description, "random access memory" may include RAM, DRAM, flash memory, or any other type of memory element that allows random access to the memory element, or at least a random access read cycle in conjunction with the memory element. The term does not include any type of storage element that must be accessed sequentially, such as a sequentially-accessed hard disk drive (HDD) or a sequentially accessed optical disc.

In this description, "data interface" is a unit or sub-system that controls the flow of data between two or more parts of a system. A data interface may alter the data flowing through it. A data interface may handle communication aspects related to the flow of data, such as networking. A data interface may access memory modules storing the data. A data interface may handle messages in conjunction with the two or more parts of the system. A data interface may handle signaling aspects related to controlling any of the parts of the system. Some possible non-limiting examples of a "data interface" include an ASIC, an FPGA, a CPU, a microcontroller, a communication controller, a memory buffer, glue logic, and combinations thereof.

In this description, "data corpus" is the entire amount of data included in related data sets, which together make up a complete file or other complete unit of information that may be accessed and processed by multiple compute elements. As one example, the data corpus may be a copy of all the pages in the Internet, and each data set would be a single page.

In this description, a "memory module" is a physical entity in a system that stores data and that may be accessed independently of any other memory module in the system and in parallel to any other memory module in the system. Possible examples include a DIMM card or other physical entity that may be attached or removed from the system, or a memory chip that is part of the system but that is not necessarily removed or re-attached at will.

In this description, "data resiliency" means the ability of a system to reconstruct a data set, even if the system does not have all of the data that makes up that data set. Any number of problems may arise in that require "data resiliency", including, without limitation, (i) the destruction of data, (ii) the corruption of data, (iii) the destruction of any part of the operating, application, or other software in the system, (iv) the corruption of any part of operating, application, or other software in the system, (v) the destruction of a compute element, erasure-coding interface, data interface, memory module, server, or other physical element of the system, and (vi) the malfunction, whether temporary or permanent, of a compute element, erasure-coding interface, data interface, memory module, server, or other physical element of the system. In all such cases, the system is designed and functions to provide "data resiliency" to overcome the problem, and thus provide correct and whole data sets.

FIG. 1A illustrates one embodiment of a system 100 configured to mix cache related memory transactions together with general communication transactions over a shared input-output medium 105. The system 100 includes a number of computing elements, including a first compute element 100-*c*1 through N-th compute element 100-*cn*. The compute elements are in communicative contact with a cache memory 101, which is in communicative contact with a cache agent 101-*ca* that controls communication between the cache memory 101 and a medium controller 105-*mc*. The medium controller 105-*mc* controls communication between the cache agent 101-*ca* and a shared input-output medium 105, which is communicative contact with an external memory elements 112 that is outside the system 100.

Figure 1B:
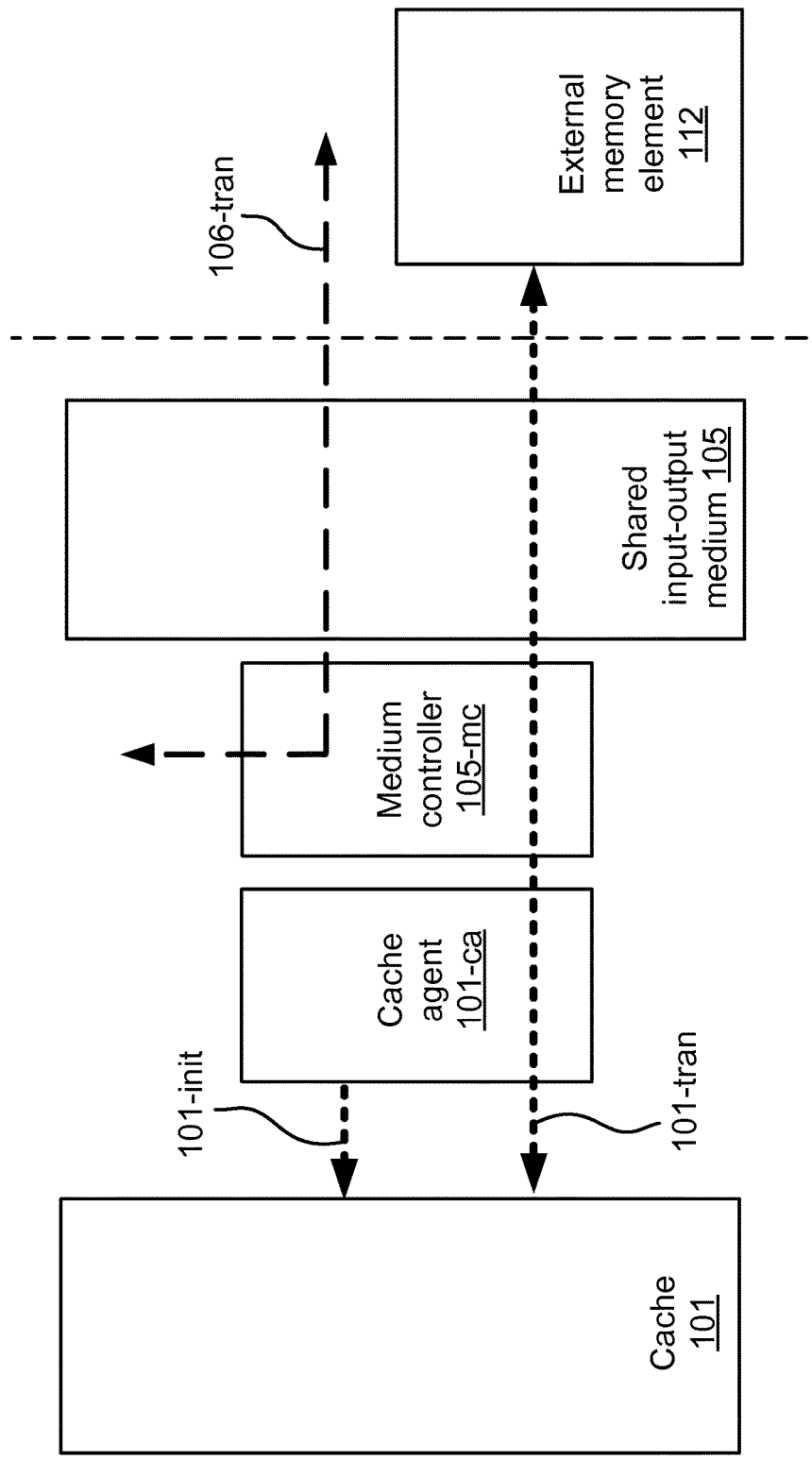
FIG. 1B illustrates one embodiment of a system configured to mix cache related memory transactions together with general communication transactions over a shared input-output medium, in which there is a conflict between a cache related memory I/O data packet and a general communication I/O data packet.

FIG. 1B illustrates one embodiment of a system 100 configured to mix cache related memory transactions together with general communication transactions over a shared input-output medium 105, in which there is a conflict between a cache related memory I/O data packet and a general communication I/O data packet. Here two transactions are illustrated. One transaction 101-*tran* is a cache related memory transaction between the cache memory 101 and the external memory element 112, via the cache agent 101-*ca*, the medium controller 105-*mc*, and the shared input-output medium 105. Transaction 101-*tran* can go to the cache memory 101, or to the external memory element 112, or in both directions, and may include a cache-coherency transaction. In some embodiments, there is an additional path 101-*init* between the cache agent 101-*ca* and the cache memory 101, in which the cache agent initiates transaction 101-*tran*. The second transaction 106-*tran*, is a general communication transaction between a part of the system other than the cache memory 101, and some external element other than the external memory element 112, such as an external I/O elements 119 in FIG. 1D. This transaction 106-*tran* also goes through the shared input-output medium 105 and the medium controller 105-*mc*, but then continues to another part of the system rather than to the cache agent 101-*ca*.

Figure 1C:
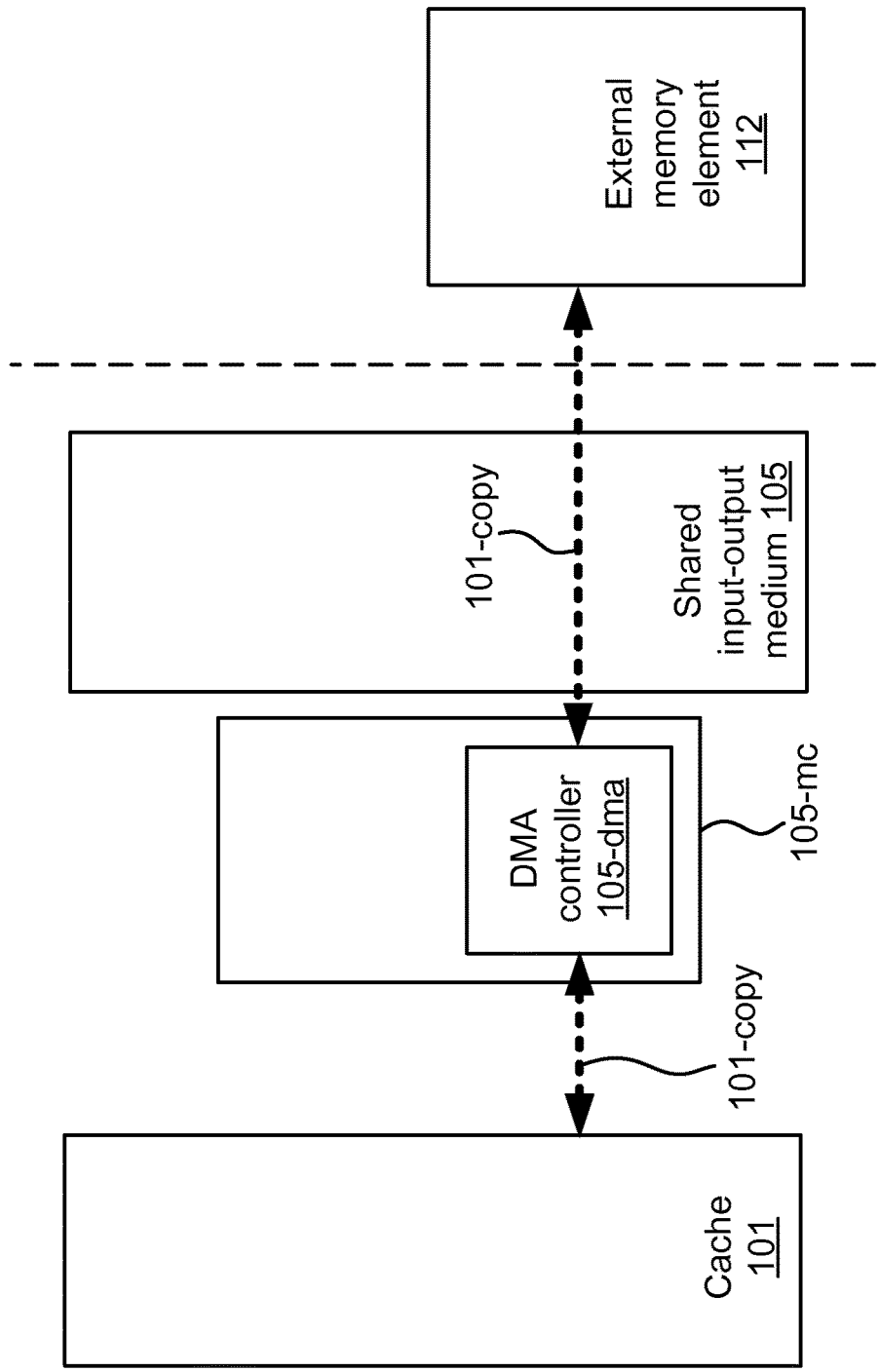
FIG. 1C illustrates one embodiment of a system configured to implement a cache related memory transaction over a shared input-output medium.

FIG. 1C illustrates one embodiment of a system configured to implement a cache related memory transaction over a shared input-output medium 105. The DMA controller 105-*dma* performs copy operations 101-copy from the cache memory 101 into the media controller 105-*mc*, and from the media controller to the external memory element 112, or vice-versa.

FIG. 1D illustrates one embodiment of a system configured to implement a general communication transaction over a shared input-output medium 105. The DMA controller 105-*dma* performs copy operations 106-copy from a non-cache related source (not shown) into the media controller 105-*mc*, and from the media controller to the external I/O element 119, or vice-versa.

Figure 2A:
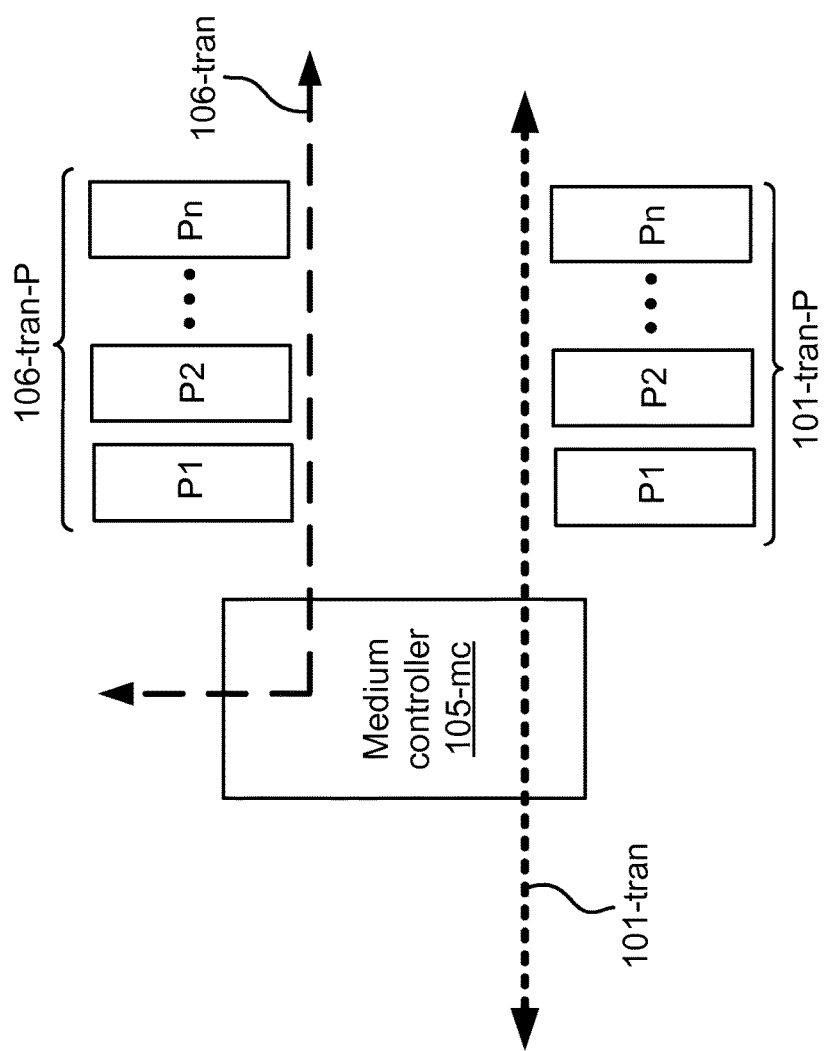
FIG. 2A illustrates one embodiment of a system configured to transmit data packets associated with both either a cache related memory transaction or a general communication transactions.

FIG. 2A illustrates one embodiment of a system configured to transmit data packets associated with both either a cache related memory transaction or a general communication transactions. It illustrates that transactions occur in the form of data packets. The cache related memory transaction 101-*tran* includes a number of data packets, P1, P2, through Pn, that will pass through the medium controller 105-*mc*. Again, the data packets may flow in either or both ways, since data packets may transmit to or from the cache memory. The cache related memory transaction 101-*tran* is a packetized transaction 101-*tran*-P. In the same, or at least an overlapping time period, there is a general communication transaction 106-*tran* which includes a number of data packets P1, P2, through Pn, which are all part of the general communication transaction 106-*tran* that is a packetized transaction 106-*tran*-P. This packetized transaction 106-*tran*-P also passes through the medium controller 105-*mc*, and may pass in both directions.

Figure 2B:
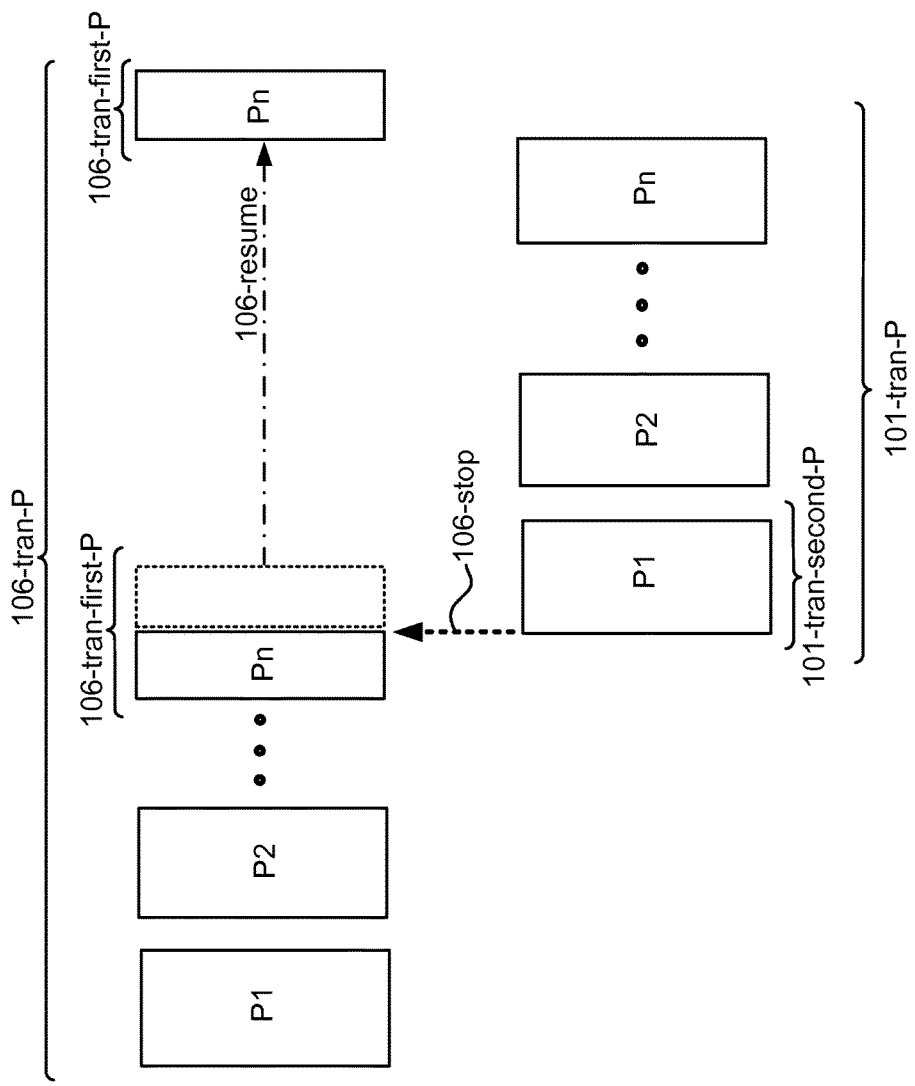
FIG. 2B illustrates one embodiment of a system designed to temporarily stop and then resume the communication of data packets for general communication transactions.

FIG. 2B illustrates one embodiment of a system designed to temporarily stop and then resume the communication of data packets for general communication transactions. Here, a general packetized communication transaction 106-*tran*-P includes a first packet 106-*tran*-first-P. After transaction 106-*tran*-P has begun, but while first packet 106-*tran*-first-P is still in process, a packetized cache related memory transaction 101-*tran*-P begins with a second packet 101-*trans*-second-P. When the system understands that there are two transactions occurring at the same time, one of which is cache related memory 101-*tran*-P and the other 106-*tran*-P not, the system will cause the general communication transaction to stop 106-stop transmission of the particular data packet 106-*tran*-first-P. After all of the data packets of 101-*tran*-P have passed the system, the system will then allow the general communication transaction to resume 106-resume and complete the transmission of packet 106-*tran*-first-P. In some embodiments, the system will allow completion of a data packet from 106-*tran*-P when such packet is in mid-transmission, but in some embodiments the system will stop the data packet flow of 106-*tran*-P even in mid-packet, and will then repeat that packet when the transaction is resumed 106-resume. In some of the various embodiments, the particular element that understands there are two transactions at the same time, and that stops and then resumes 106-*tran*-P, is the medium controller element 105-*mc* or some other controller such as those illustrated and explained in FIGS. 3A, 3B, and 3C, below.

FIG. 3A illustrates one embodiment of a system configured to mix cache related memory transactions together with general communication transactions over a shared input-output medium, in which such shared input-output medium is a PCIE computer expansion bus 105-*pcie*, and the medium controller is a root complex 105-root. In FIG. 3A, the specific shared input-output medium 105 is a PCIE computer expansion bus 105-*pcie*, and the specific medium controller 105-*mc* is a root complex 105-root. Both the cache related memory transaction 101-*tran* and the general communication transaction 106-*tran* pass through both 105-*pcie* and 105-root.

FIG. 3B illustrates one embodiment of a system configured to mix cache related memory transactions together with general communication transactions over a shared input-output medium, in which such shared input-output medium is an Ethernet connection 105-*eth*, and the medium controller is a MAC layer 105-*mac*. In FIG. 3B, the specific shared input-output medium 105 is an Ethernet connection 105-*eth*, and the specific medium controller 105-*mc* is a MAC layer 105-*mac*. Both the cache related memory transaction 101-*tran* and the general communication transaction 106-*tran* pass through both 105-*eth* and 105-*mac*.

FIG. 3C illustrates one embodiment of a system configured to mix cache related memory transactions together with general communication transactions over a shared input-output medium, in which such shared input-output medium is an InfiniBand interconnect 105-*inf*.

Figure 4:
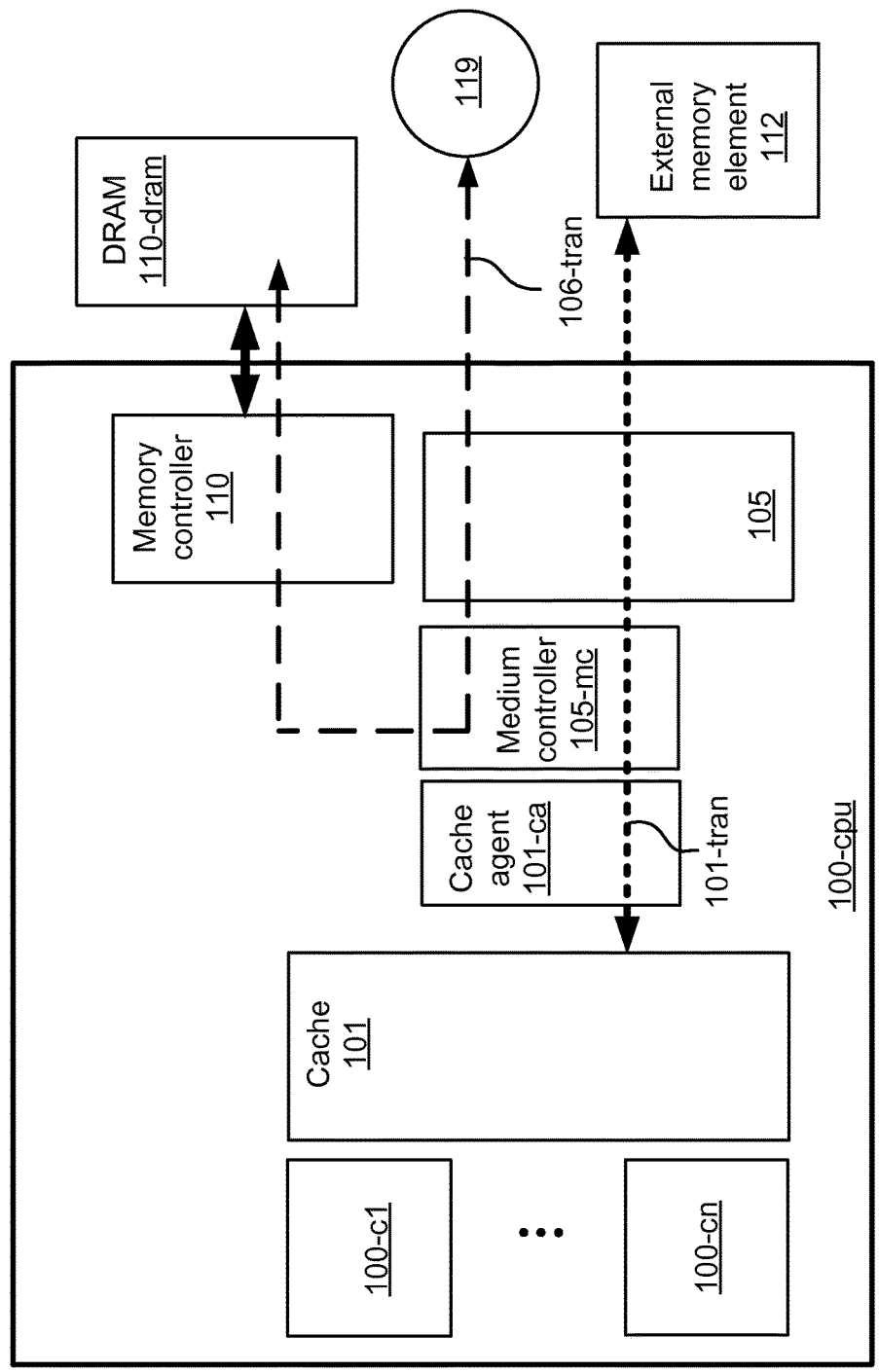
FIG. 4 illustrates one embodiment of a system configured to mix cache related memory transactions together with general communication transactions over a shared input-output medium, in which there is a conflict between a cache related memory I/O data packet and a general communication I/O data packet, and in which the system is implemented in a single microchip. In some embodiments, the various elements presented in FIG. 4 may be implemented in two or more microchips.

FIG. 4 illustrates one embodiment of a system configured to mix cache related memory transactions together with general communication transactions over a shared input-output medium 105, in which there is a conflict between a cache related memory I/O data packet and a general communication I/O data packet, and in which the system is implemented in a single microchip. In some embodiments, the various elements presented in FIG. 4 may be implemented in two or more microchips. In FIG. 4, various elements of the system previously described are implemented in a single microchip 100-*cpu*. Such elements include various processing elements, 100*c*-1 through 100-*cn*, a cache memory 101, a cache agent 101-*ca*, a medium controller 105-*mc*, and a shared input-output medium 105. In FIG. 4, there is a cache related memory transaction 101-*tran* between cache memory 101 and an external memory element 112. There is further a general communication transaction 106-*tran* between an external I/O element 119, such as a hard disc, a graphic card, or a network adapter, and a structure other than the cache memory 101. In the particular embodiment illustrated in FIG. 4, the non-cache structure is a DRAM 110-*dram*, and the communication path between 110-*dram* and 119 includes a memory controller 110 as shown. The DRAM 110-*dram* may be part of a computer, and the entire microchip 100-*cpu* may itself be part of that computer. In other embodiments, the structure other than cache memory 101 may also be on chip 100-*cpu* but not cache memory 101, or the structure may be another component external to the chip 100-*cpu* other than DRAM 100-*dram*.

Figure 5A:
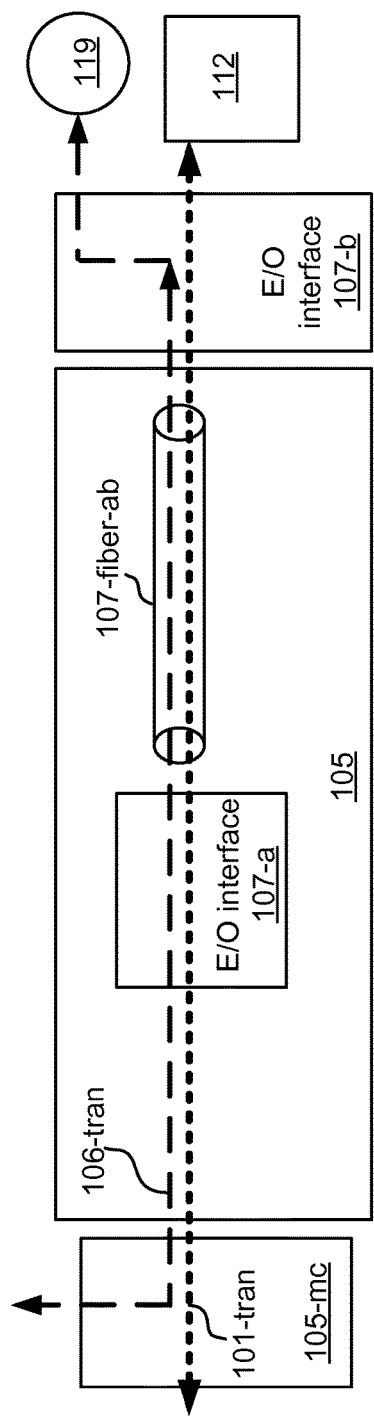
FIG. 5A illustrates one embodiment of a system configured to mix cache related memory transactions together with general communication transactions over a shared input-output medium, in which there is a conflict between a cache related memory I/O data packet and a general communication I/O data packet, and in which there is a fiber optic line and electrical/optical interfaces.

FIG. 5A illustrates one embodiment of a system configured to mix cache related memory transactions together with general communication transactions over a shared input-output medium 105, in which there is a conflict between a cache related memory I/O data packet and a general communication I/O data packet, and in which there is a fiber optic line 107-fiber-ab and electrical/optical interfaces 107-*a* and 107-*b*. In FIG. 5A, there is a cache related memory transaction 101-*tran* between cache memory 101 (not shown in FIG. 5A) and external memory element 112, in which data packets may move in both directions to and from the external I/O memory element 112, and electrical-optical interface 107*b*, a shared input-output medium 105 which as illustrated here is a fiber optic line 107-fiber-ab and another electrical-optical interface 107-*a*, and a medium controller 105-*mc*. The connection from 112 to 107-*b* is electrical, the electrical signal is converted to optical signal at 107-*b*, and the signal is then reconverted back to an electrical signal at 107-*a*. FIG. 5A includes also a general communication transaction 106-*tran* between an external I/O element 119 and either a part of the system that is either not the cache memory 101 (not shown in FIG. 5A) or that is outside of the system, such as 110-*dram* (not shown in FIG. 5A). The signal conversions for 106-*tran* are the same as for 101-*tran*. In the event that 101-*tran* and 106-*tran* occur simultaneously or at least with an overlap in time, the medium control 101-*mc* will either stop and resume, or at least delay, the 106-*tran* data packets to give priority to the 101-*tran* data packets.

Figure 5B:
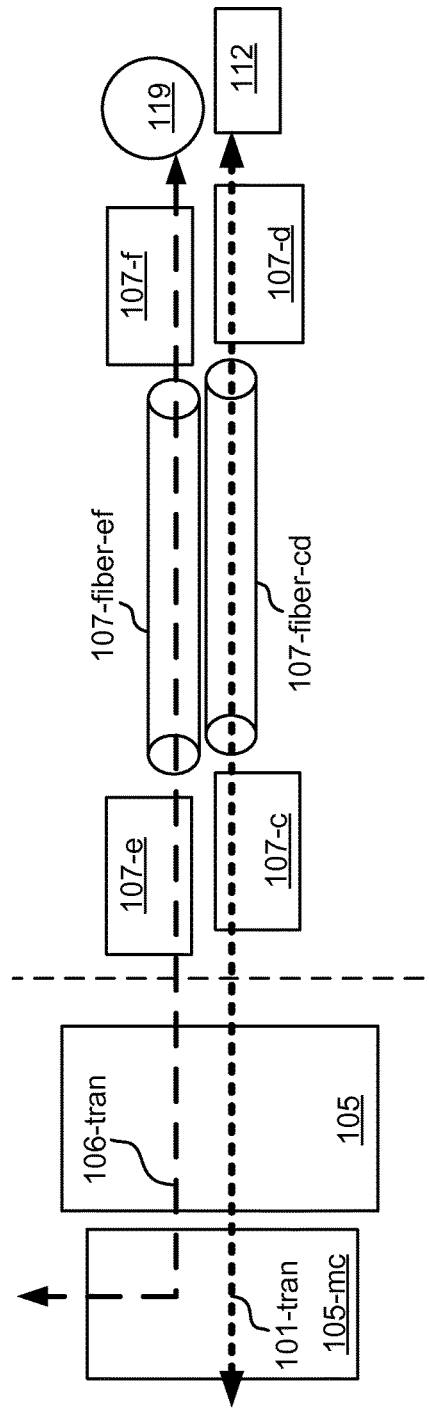
FIG. 5B illustrates one embodiment of a system configured to mix cache related memory transactions together with general communication transactions over a shared input-output medium, in which there is a conflict between a cache related memory I/O data packet and a general communication I/O data packet, and in which there are two or more fiber optic lines, and in which each fiber optic line has two or more electrical/optical interfaces.

FIG. 5B illustrates one embodiment of a system configured to mix cache related memory transactions together with general communication transactions over a shared input-output medium 105, in which there is a conflict between a cache related memory I/O data packet and a general communication I/O data packet, and in which there are two or more fiber optic lines 107-fiber-cd and 107-fiber-ef, and in which each fiber optic line has two or more electrical/optical interfaces, 107-*c* and 107-*d* for 107-fiber-cd, and 107-*e* and 107-*f* for 107-fiber-ef. FIG. 5B presents one alternative structure to the structure shown in FIG. 5A. In FIG. 5B, the electrical-optical interfaces and the fiber optic line are not shared. Rather, cache related memory transaction 101-*tran* between external memory element 112 and cache memory 101 (not shown in FIG. 5B) occurs over e/o interface 107-*d* not shared with 106-*tran*, fiber optic line 107-fiber-cd not shared with 106-*tran*, e/o interface 107-*c* not shared with 106-*tran*, and medium controller 105-*mc* which is shared with 106-*tran*, and which senses multiple transactions and gives priority to 101-*tran* data packets. Also, general communication transaction 106-*tran* between external I/O element 119 and a non-cache element (not shown in FIG. 5B) occurs over e/o interface 107*d* not shared with 101-*tran*, fiber optic line 107-fiber-ef not shared with 101-*tran*, e/o interface 107-*e* not shared with 101-*tran*, and medium controller 105-*mc* which is shared with 101-*tran*, senses multiple transactions, and give priority to 101-*tran* data packets.

One embodiment is a system 100 configured to mix cache related memory transactions together with general communication transactions over a shared input-output medium. Various embodiments include a shared input-output medium 105 associated with a medium controller 105-*mc*, a cache agent 101-*ca*, and a first cache memory 101 associated with said cache agent 101-*ca*. Further, in some embodiments, the cache agent 101-*ca* is configured to initiate 101-init direct cache related memory transactions 101-*tran* between the first cache memory 101 and an external memory element 112, via said shared input-output medium 105. Further, in some embodiments the medium controller 105-*mc* is configured to block general communication transactions 106-*tran* via said shared input-output medium 105 during the direct cache related memory transactions 101-*tran*, thereby achieving the mix of transactions without delaying the direct cache related memory transactions 101-*tran*.

In one alternative embodiment to the system just described, the medium controller 105-*mc* includes a direct-memory-access (DMA) controller 105-*dma* configured to perform the direct cache related memory transactions 101-*tran* by executing a direct copy operation 101-copy between the first cache memory 101 and the external memory element 112 via the shared input-output medium 105.

In one possible variation of the alternative embodiment just described, the direct-memory-access (DMA) controller 105-*dma* is further configured to perform the general communication transactions 106-*tran* by executing another direct copy operation 106-copy in conjunction with an external input-output element 119 via the shared input-output medium 105.

In a second alternative embodiment to the system of mixing cache related memory transactions together with general communication transactions, further the direct cache related memory transactions 101-*tran* are latency-critical cache transactions. Further, the medium controller 105-*mc* is configured to interrupt any of the general communication transactions 106-*tran* and immediately commence the direct cache related memory transactions 101-*tran*, thereby facilitating the latency criticality.

In one possible variation of the second alternative embodiment just described, further both said direct cache related memory transactions 101-*tran* and general communication transactions 106-*tran* are packet-based transactions 101-*tran*-P, and 106-*tran*-P is performed via the medium controller 105-*mc* in conjunction with the shared input-output medium 105. Further, the medium controller 105-*mc* is configured to stop 106-stop on-going communication of a first packet 106-*tran*-first-P belonging to the general communication transactions 106-*tran* via the shared input-output medium 105, and substantially immediately commence communication of a second packet 101-*tran*-second-P belonging to the direct cache related memory transactions 101-*tran* via the shared input-output medium 105 instead, thereby achieving the interruption at the packet level.

In one possible configuration of the possible variation just described, further the medium controller 105-*mc* is configured to resume 106-resume communication of the first packet 106-*tran*-first-P after the second packet 101-*tran*-second-P has finished communicating, thereby facilitating packet fragmentation.

In a third alternative embodiment to the system of mixing cache related memory transactions together with general communication transactions, the shared input-output medium 105 is based on an interconnect element selected from a group consisting of (i) peripheral-component-interconnect-express (PCIE) computer expansion bus 105-*pcie*, (ii) Ethernet 105-*eth*, and (iii) InfiniBand 105-*inf*.

In one embodiment associated with the PCIE computer expansion bus 105-*pcie*, the medium controller 105-*mc* may be implemented as part of a root-complex 105-*root* associated with said PCIE computer expansion bus 105-*pcie*.

In one embodiment associated with the Ethernet 105-*eth*, the medium controller 105-*mc* may be implemented as part of a media-access-controller (MAC) 105-*mac* associated with said Ethernet 105-*eth*.

In a fourth alternative embodiment to the system of mixing cache related memory transactions together with general communication transactions, further the direct cache related memory transactions 101-*tran* and general communication transactions 106-*tran* are packet-based transactions 101-*tran*-P, and 106-*tran*-P is performed via the medium controller 105-*mc* in conjunction with said the shared input-output medium 105. Further, the medium controller 105-*mc* is configured to deny access to the shared input-output medium 105 from a first packet 106-*tran*-first-P belonging to the general communication transactions 106-*tran*, and instead to grant access to the shared input-output medium 105 to a second packet 101-*tran*-second-P belonging to the direct cache related memory transactions 101-*tran*, thereby giving higher priority to the direct cache related memory transactions 101-*tran* over the general communication transactions 106-*tran*.

In a fifth alternative embodiment to the system of mixing cache related memory transactions together with general communication transactions, further there is at least a first compute element 100-*c*1 associated with the cache memory 101, and there is a memory controller 110 associated with an external dynamic-random-access-memory (DRAM) 110-*dram*. Further, the system 100 is integrated inside a central-processing-unit (CPU) integrated-circuit 100-*cpu*, and at least some of the general communication transactions 106-*tran* are associated with the memory controller 110 and DRAM 110-*dram*.

In a sixth alternative embodiment to the system of mixing cache related memory transactions together with general communication transactions, further the system achieves the mix without delaying the direct cache related memory transactions 101-*tran*, which allows the system 100 to execute cache-coherency protocols in conjunction with the cache memory 101 and the external memory element 112.

In a seventh alternative embodiment to the system of mixing cache related memory transactions together with general communication transactions, the shared input-output medium 105 includes an electro-optical interface 107-*a* and an optical fiber 107-fiber-ab operative to transport the direct cache related memory transactions 101-*tran* and the general communication transactions 106-*tran*.

In an eighth alternative embodiment to the system of mixing cache related memory transactions together with general communication transactions, further including a first 107-*c* and a second 107-*d* electro-optical interface, both of which are associated with a first optical fiber 107-fiber-cd, and are operative to transport the direct cache related memory transactions 101-*tran* in conjunction with the medium controller 105 and the external memory element 112.

In a possible variation of the eighth alternative embodiment just described, further including a third 107-*e* and a fourth 1074 electro-optical interface, both of which are associated with a second optical fiber 107-fiber-ef, and are operative to transport the general communication transactions 106-*tran* in conjunction with the medium controller 105 and an external input-output element 119.

Figure 6A:
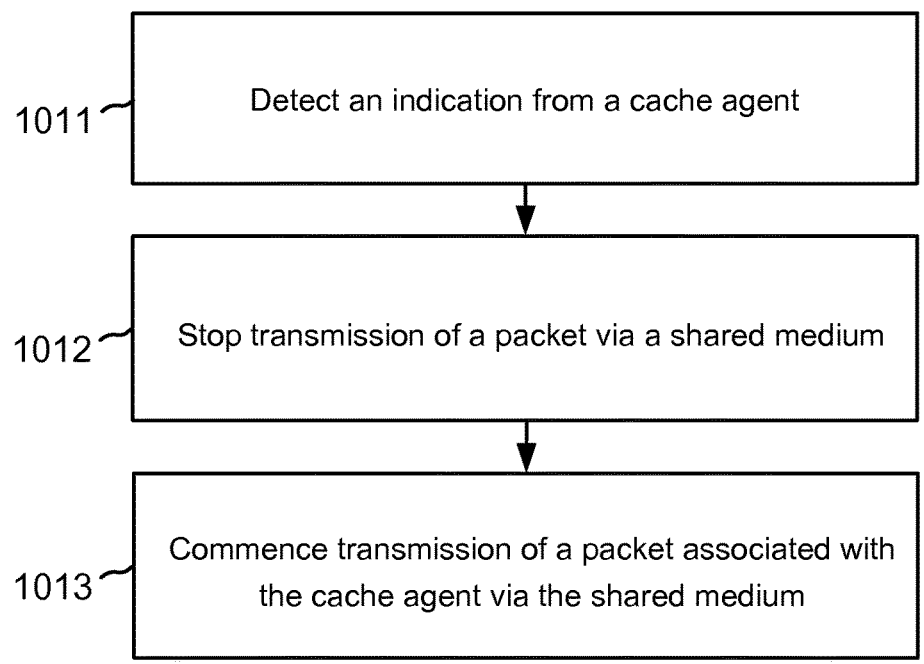
FIG. 6A illustrates one embodiment of a method for stopping transmission of a data packet associated with a general communication transaction, and starting transmission of a data packet associated with a cache agent.

FIG. 6A illustrates one embodiment of a method for mixing cache related memory transactions 101-*tran* together with general communication transactions 106-*tran* over a shared input-output medium 105 without adversely affecting cache performance. In step 1011, a medium controller 105-*mc* detects, in a medium controller 105-*mc* associated with a shared input-output medium 105, an indication from a cache agent 101-*ca* associated with a cache memory 101, that a second packet 101-*tran*-second-P associated with a cache related memory transactions 101-*tran* is pending. In step 1012, as a result of the indication, the medium controller 105-*mc* stops transmission of a first packet 106-*tran*-first-P associated with a general communication transactions 106-*tran* via the shared input-output medium 105. In step 1013, the medium controller 105-*mc* commences transmission of the second packet 101-*tran*-second-P via said the input-output medium 105, thereby preserving cache performance in conjunction with the cache related memory transactions 101-*tran*.

In a first alternative embodiment to the method just described, further the cache performance is associated with a performance parameter selected from a group consisting of: (i) latency, and (ii) bandwidth.

In a second alternative embodiment to the method just described for mixing cache related memory transactions together with general communication transactions over a shared input-output medium without adversely affecting cache performance, further the general communication transactions 106-*tran* are packet-based transactions 106-*tran*-P performed via the medium controller 105-*mc* in conjunction with the shared input-output medium 105. Also, the cache performance is associated with latency and this latency is lower than a time required to transmit a shortest packet belonging to said packet-based transaction 106-*tran*-P.

Figure 6B:
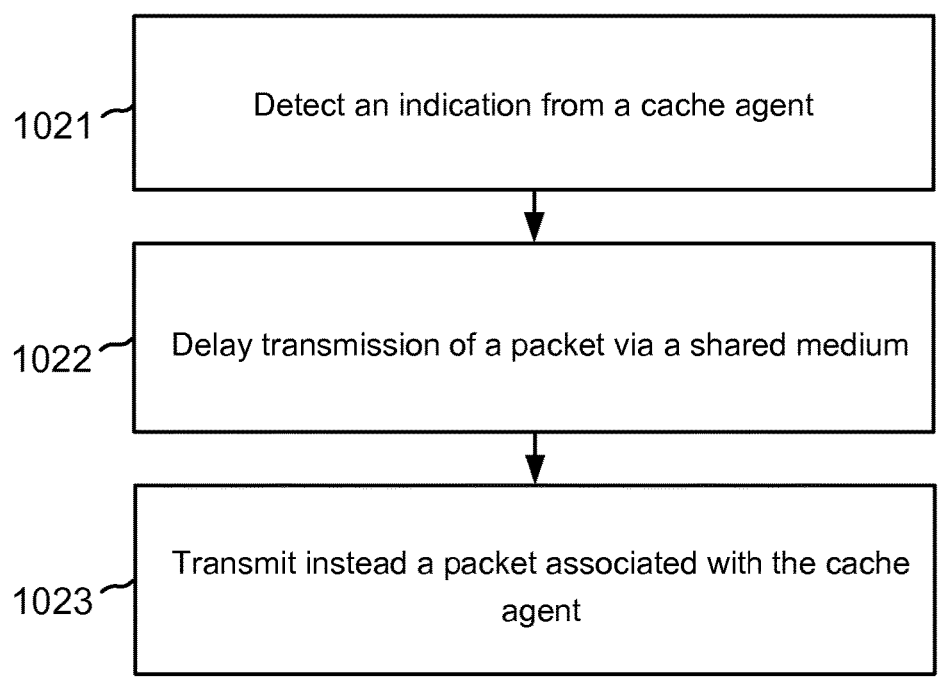
FIG. 6B illustrates one embodiment of a method for delaying transmission of a data packet associated with a general communication transaction, and transmitting instead a data packet associated with a cache agent.

FIG. 6B illustrates one embodiment of a method for mixing cache related memory transactions together with general communication transactions over a shared input-output medium without adversely affecting cache performance. In step 1021, a medium controller 105-*mc* associated with a shared input-output medium 105 detects an indication from a cache agent 101-*ca* associated with a cache memory 101, that a second packet 101-*tran*-second-P associated with a cache related memory transactions 101-*tran* is pending. In step 1022, as a result of the indication, the medium controller 105-*mc* delays transmission of a first packet 106-*tran*-first-P associated with a general communication transaction 106-*tran* via the shared input-output medium 105. In step 1023, the medium controller 105-*mc* transmits instead the second packet 101-*tran*-second-P via the shared input-output medium 105, thereby preserving cache performance in conjunction with the cache related memory transactions 101-*tran*.

In a first alternative embodiment to the method just described, the cache performance is associated with a performance parameter selected from a group consisting of: (i) latency, and (ii) bandwidth.

In a second alternative embodiment to the method just described for mixing cache related memory transactions together with general communication transactions over a shared input-output medium without adversely affecting cache performance, further the general communication transactions 106-*tran* are packet-based transactions 106-*tran*-P performed via the medium controller 105-*mc* in conjunction with the shared input-output medium 105. Also, the cache performance is associated with latency; and said latency is lower than a time required to transmit a shortest packet belonging to said packet-based transaction 106-*tran*-P.

Figure 7A:
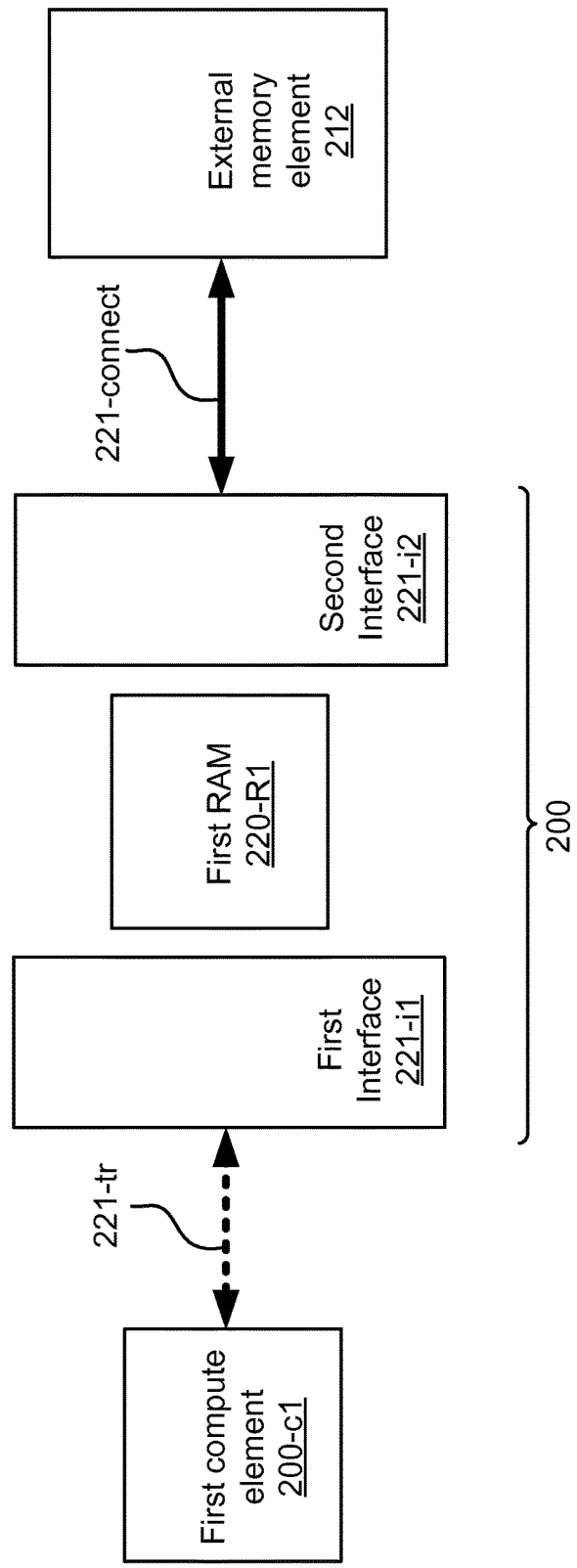
FIG. 7A illustrates one embodiment of a system configured to cache automatically an external memory element as a result of a random-access read cycle.

FIG. 7A illustrates one embodiment of a system configured to cache automatically an external memory element as a result of a random-access read cycle. A system 200 is configured to cache automatically an external memory element as a result of a random-access read cycle. In one particular embodiment, the system includes a first random-access memory (RAM) 220-R1, a first interface 221-*i*1 configured to connect the system 200 with a compute element 200-*c*1 using synchronous random access transactions 221-*tr*, and a second interface 221-*i*2 configured to connect 221-connect the system 200 with an external memory 212.

Figure 7B:
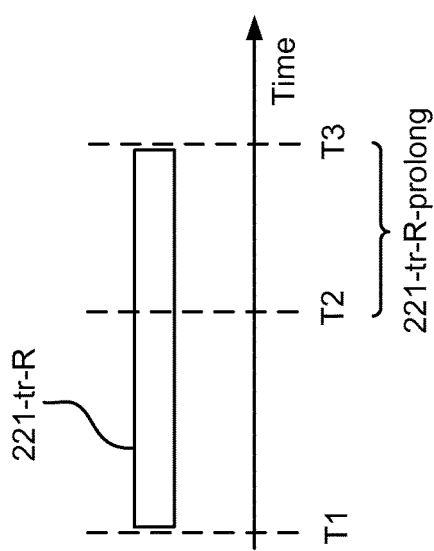
FIG. 7B illustrates one embodiment of prolonged synchronous random-access read cycle.

FIG. 7B illustrates one embodiment of prolonged synchronous random-access read cycle. The system 200 is configured to prolong 221-*tr*-R-prolong a synchronous random-access read cycle 221-*tr*-R from the time period between T1 and T2 to the time period between T1 to T3, the prolongation being the period between T2 and T3.

Figure 7C:
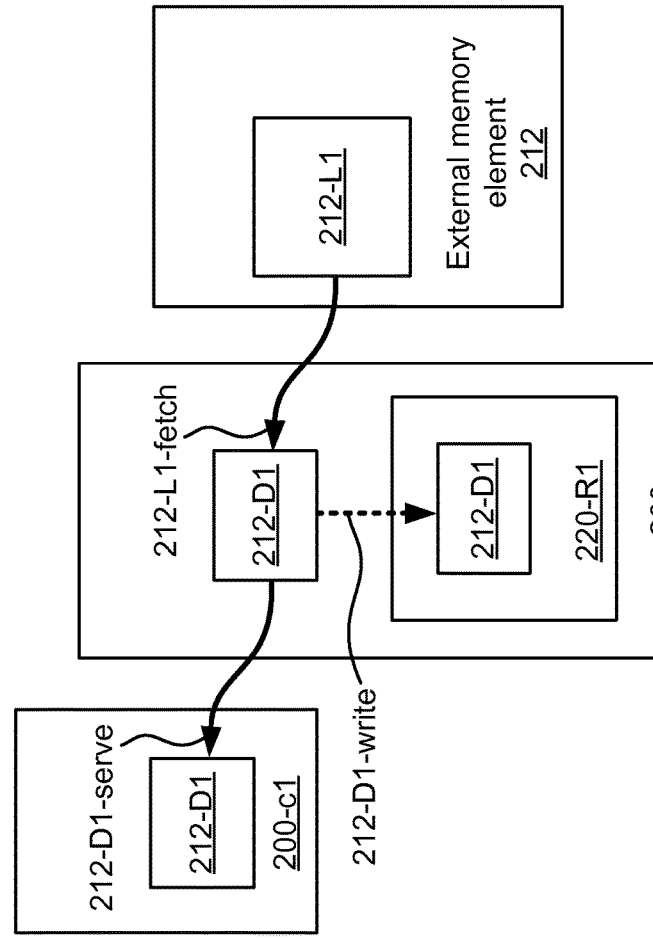
FIG. 7C illustrates one embodiment of a system with a random access memory that is fetching at least one data element from an external memory element, serving it to a compute element, and writing it to the random access memory.

FIG. 7C illustrates one embodiment of a system with a random access memory that is fetching at least one data element from an external memory element, serving it to a compute element, and writing it to the random access memory. In one particular embodiment, the prolong 221-*tr*-R-prolong (FIG. 7B) is initiated by the first computer element 200-*c*1 when the synchronous random-access read cycle 221-*tr*-R (FIG. 7B) is detected to be addressed to a first memory location 212-L1 of the external memory element 212 currently not cached by the first random-access memory 220-R1 (FIG. 7A). The system 200 is further configured to fetch 212-L1-fetch, via the second interface 221-*i*2 (FIG. 7A), from the external memory element 212, at least one data element 212-D1 associated with the first memory location 212-L1. The system is further configured to serve 212-D1-serve to the first compute element 200-*c*1, as part of the synchronous random-access read cycle 221-*tr*-R (FIG. 7B) prolonged, via the first interface 221-*i*1 (FIG. 7A), the at least one data element 212-D1 that was previously fetched, thereby concluding successfully the synchronous random-access read cycle 221-*tr*-R (FIG. 7B). The system is further configured to write 212-D1-write the at least one data element 212-D1 to the first random-access memory 220-R1, thereby caching automatically the first memory location 212-L1 for faster future access by the first compute element 200-*c*1.

Figure 7D:
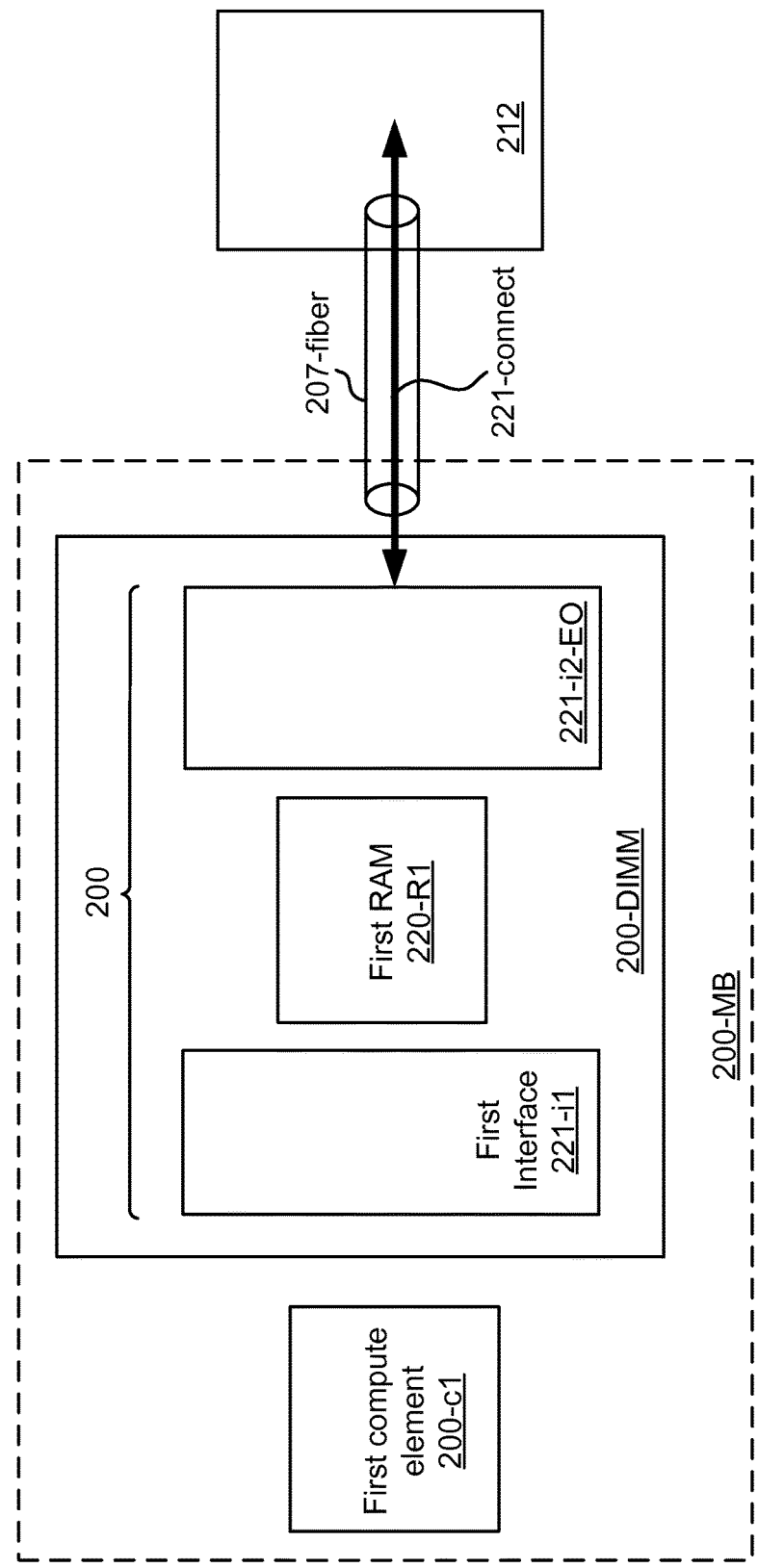
FIG. 7D illustrates one embodiment of a DIMM system configured to implement communication between an external memory element, a first RAM, and a first computer element.

FIG. 7D illustrates one embodiment of a DIMM system configured to implement communication between an external memory element, a first RAM, and a first computer element. In one particular embodiment, the first compute element 200-*c*1 is placed on a first motherboard 200-MB. Further, the system 200 is implemented on a first printed-circuit-board (PCB) having a form factor of a dual-in-line-memory-module (DIMM) 200-DIMM, such that the system 200 is connected to the first motherboard 200-MB like a dual-in-line-memory-module, and such that the first compute element 200-*c*1 perceives the system 200 as essentially a dual-in-line-memory-module. Further, the external memory element 212 is not placed on said first motherboard 200-MB. Further, the second interface 221-*i*2 (FIG. 7A) is an electrical-optical interface 221-*i*2-EO, connected to the external memory element 212 via an optical fiber 207-fiber, together operative to facilitate said connection 221-connect. In the embodiment shown in FIG. 7D, first RAM 220-R1 and first interface 221-*i*1 are structured and function as described in FIG. 7A.

FIG. 7E illustrates one embodiment of a system controller configured to fetch additional data elements from additional memory locations of an external memory, and write such data elements to RAM memory. The system 200 includes a system controller 200-*cont* that is configured to fetch 212-L1-fetch-add additional data elements 212-Dn respectively from additional memory locations 212-Ln of the external memory element 212, wherein the additional memory locations 212-Ln are estimated, based at least in part on the first memory location 212-L1 (FIG. 7C), to be accessed in the future by the compute element 200-*c*1 (FIG. 7A). The system controller 200-cont is further configured to write 212-Dn-write the additional data elements 212-Dn fetched to the first random-access memory 220-R1, thereby caching automatically the additional memory locations 212-Ln for faster future access by the first compute element 200-*c*1 (FIG. 7A).

FIG. 7F illustrates one embodiment of a process by which a system 200 (FIG. 7E) writing of additional data elements to RAM memory occurs concurrently with additional synchronous random-access write cycles. In FIG. 7E, the writing 212-Dn-write (FIG. 7E) of the additional data elements 212-Dn (FIG. 7E) is operated essentially concurrently with additional 221-*tr*-R-W-add synchronous random-access read cycles or synchronous random-access write cycles made by said first compute element 200-*c*1 (FIG. 7A) in conjunction with the first interface 221-*i*1 (FIG. 7A) and the first random-access memory 220-R1 (FIG. 7E).

Figure 8A:
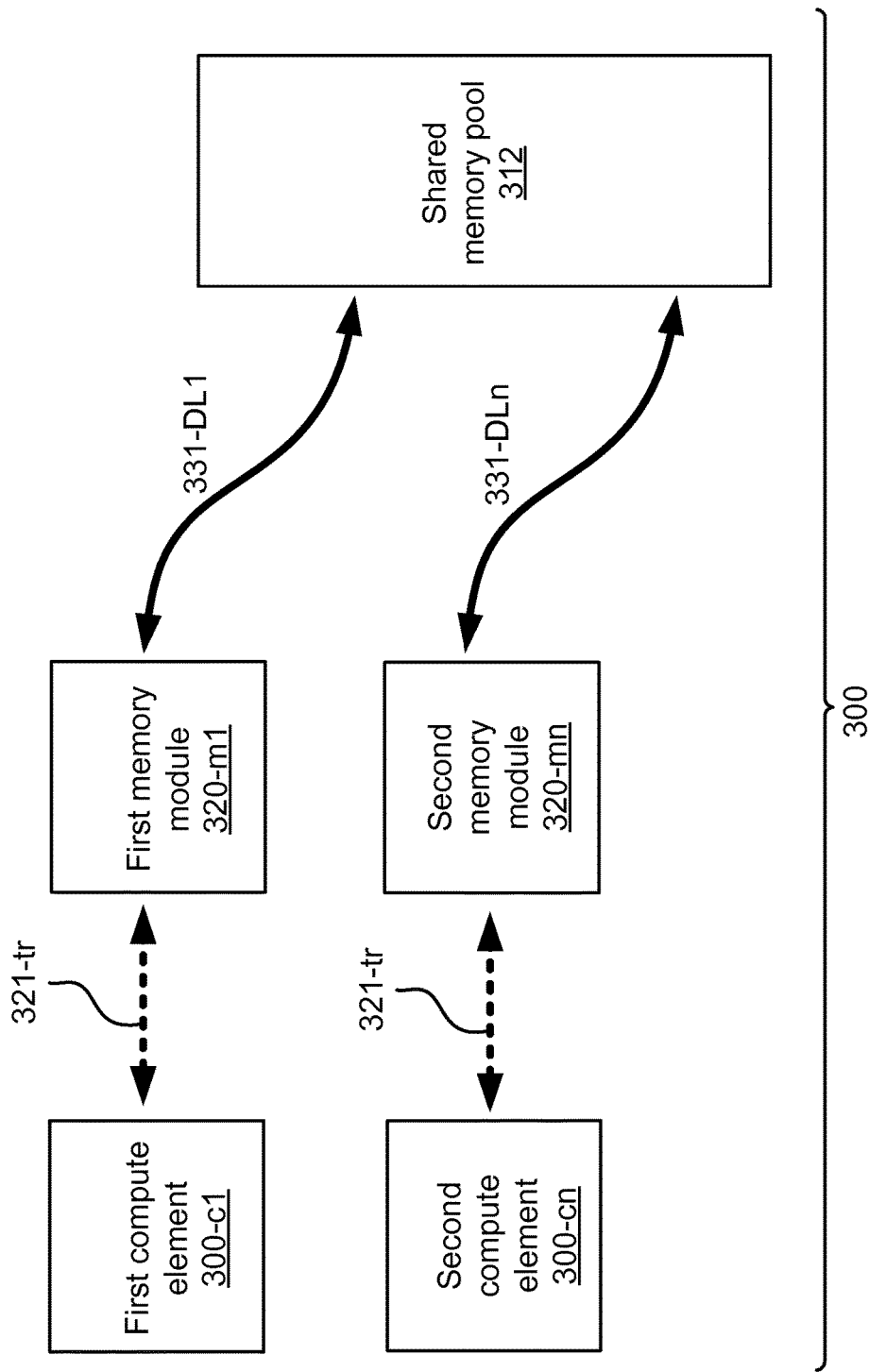
FIG. 8A illustrates one embodiment of a system configured to cache a shared memory pool using at least two memory modules.

FIG. 8A illustrates one embodiment of a system configured to cache a shared memory pool using at least two memory modules. In one particular embodiment, the system 300 includes first 300-*c*1 and second 300-*cn* compute elements associated respectively with first 320-*m*1 and second 320-*mn* memory modules, each of said compute elements configured to communicate with its respective memory module using synchronous random access transactions 321-*tr*. The system includes further a shared memory pool 312 connected with the first and second memory modules via first 331-DL1 and second 331-DLn data links, respectively.

Figure 8B:
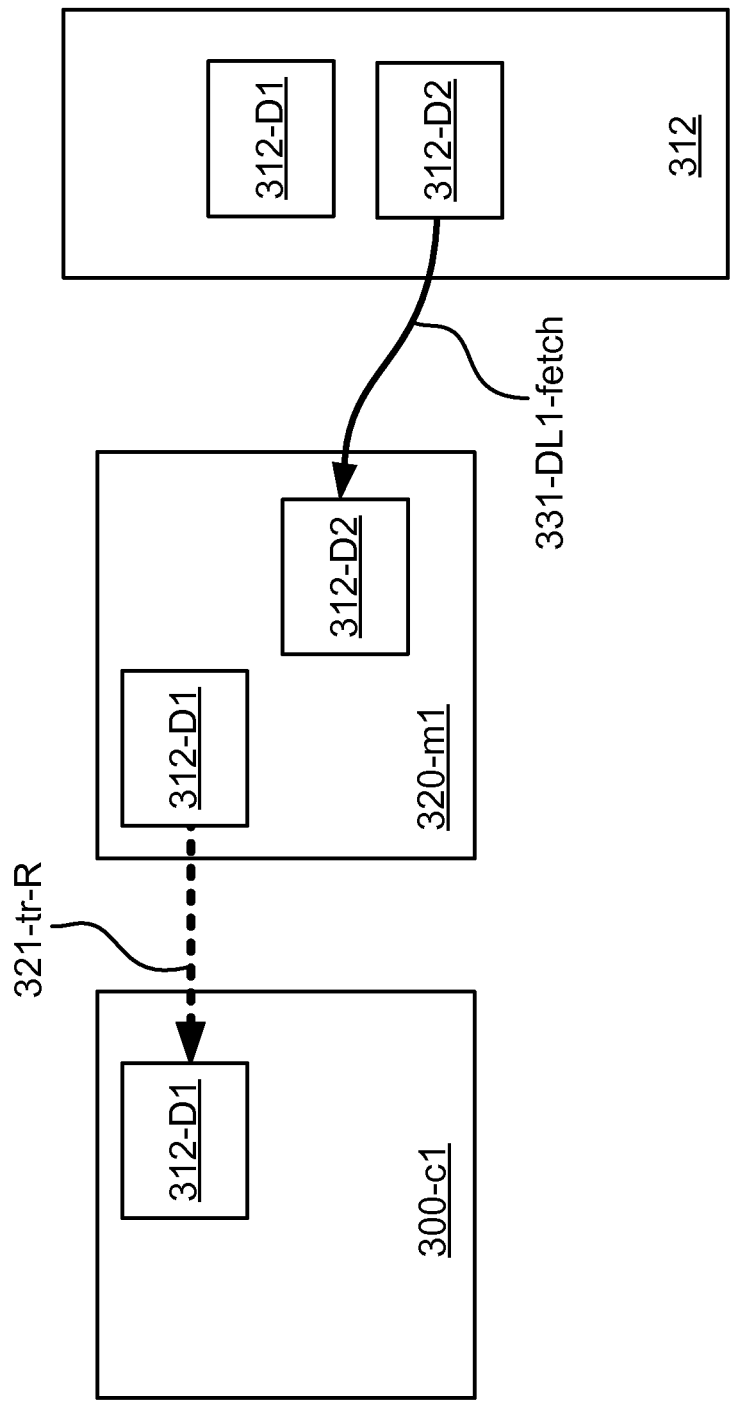
FIG. 8B illustrates one embodiment of system configured to fetch sets of data from a shared memory pool.

FIG. 8B illustrates one embodiment of system 300 (FIG. 8A) configured to fetch, by a first compute element, sets of data from a shared memory pool. FIG. 8B illustrates an additional embodiment of the system 300 (FIG. 8A) illustrated in FIG. 8A, wherein the system 300 is (FIG. 8A) configured to use the first 320-*m*1 and second 320-*mn* (FIG. 8A) memory modules as a cache to the shared memory pool 312, such that sets of data 312-D1 cached on the first 320-*m*1 or second 320-*mn* (FIG. 8A) memory modules are read 321-*tr*-R by the respective compute element 300-*c*1 or 300-*cn* (FIG. 8A) using the synchronous random access transactions 321-*tr* (FIG. 8A), and other sets of data 312-D2 that are not cached on said first or second memory module are fetched 331-DL1-fetch from the shared memory pool 312 into the first 320-*m*1 or second 320-*mn* (FIG. 8A) memory modules upon demand from the respective compute elements 300-*c*1 and 300-*cn* (FIG. 8A).

FIG. 8C illustrates one embodiment of a system configured to cache a shared memory pool using at least two memory modules, in which a first compute element is placed on a first motherboard, a first DIMM module is connected to the first motherboard via a first DIMM slot, and first data link is comprised of a first optical fiber. In one particular embodiment of the system 300 (FIG. 8A), the first 320-$m$1 memory module is a first dual-in-line-memory-module (DIMM) 300-DIMM-1. Further, the first compute element 300-$c$1 is placed on a first motherboard 300-MB-1, the first dual-in-line-memory-module 300-DIMM-1 is connected to the first motherboard 300-MB-1 via a first dual-in-line-memory-module slot 300-DIMM-1-slot, and the first data link 331-DL1 (FIG. 8A) includes a first optical fiber 307-fiber-1 with a connection to a shared memory pool 312.

FIG. 8D illustrates one embodiment of a system configured to cache a shared memory pool using at least two memory modules, in which a second compute element is placed on a second motherboard, a second DIMM module is connected to the second motherboard via a second DIMM slot, and a second data link is comprised of a second optical fiber. FIG. 8D illustrates one particular embodiment of the system 300 (FIG. 8A) illustrated in FIG. 8C, in which further the second 320-$mn$ memory module is a second dual-in-line-memory-module 300-DIMM-n, the second compute element 300-$cn$ is placed on a second motherboard 300-MB-n, the second dual-in-line-memory-module 300-DIMM-n is connected to the second motherboard 300-MB-n via a second dual-in-line-memory-module slot 300-DIMM-n-slot, and the second data link 331-DLn (FIG. 8A) includes a second optical fiber 307-fiber-n connected to a shared memory pool 312.

Figure 8E:
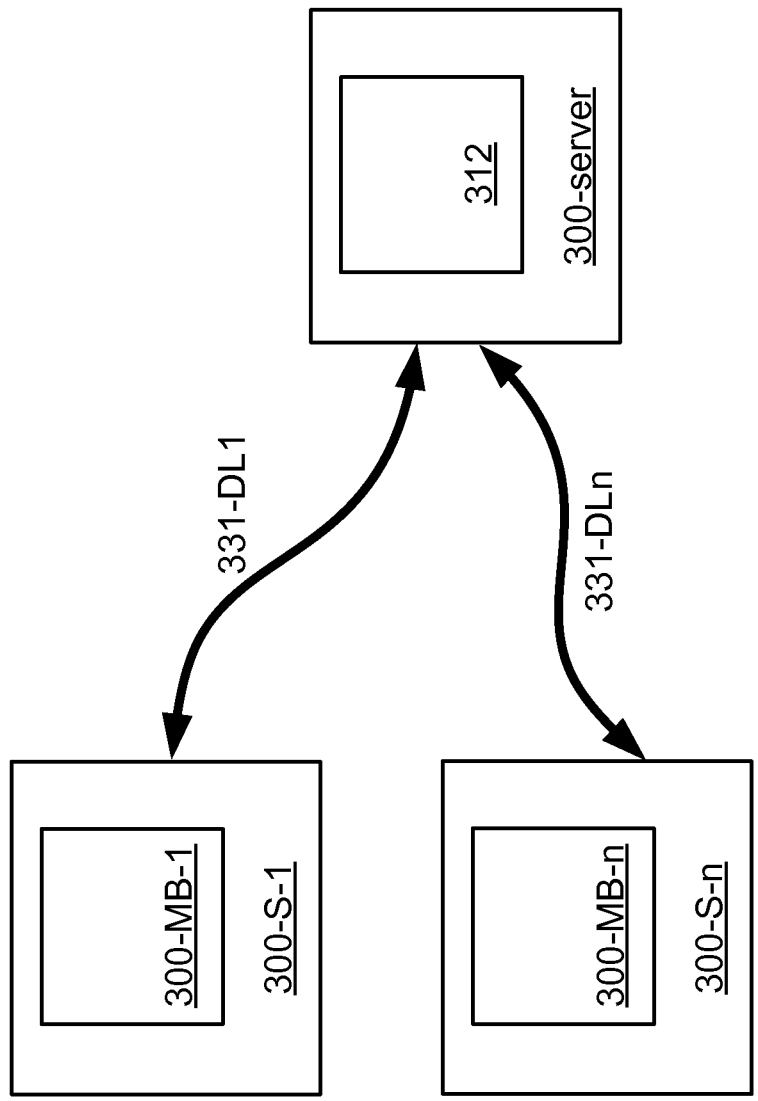
FIG. 8E illustrates one embodiment of a system configured to cache a shared memory pool using at least two memory modules, in which each of the memory modules and the shared memory pool resides in a different server.

FIG. 8E illustrates one embodiment of a system configured to cache a shared memory pool using at least two memory modules, in which each of the memory modules and the shared memory pool resides in a different server. FIG. 8E illustrates one particular embodiment of the system 300 (FIG. 8A) illustrated in FIG. 8D, in which further the first 300-MB-1 and second 300-MB-n motherboards are placed in a first 300-S-1 and a second 300-S-n server, respectively, and the shared memory pool 312 is placed in a third server 300-server, in which there is a first data link 331-DL1 between the first server 300-S1 and the third server 300-server and in which there is a second data link 331-DLn between the second server 300-S-n and the third server 300-server. The structure presented in FIG. 8E thereby facilitates distributed operation and memory disaggregation.

Figure 8F:
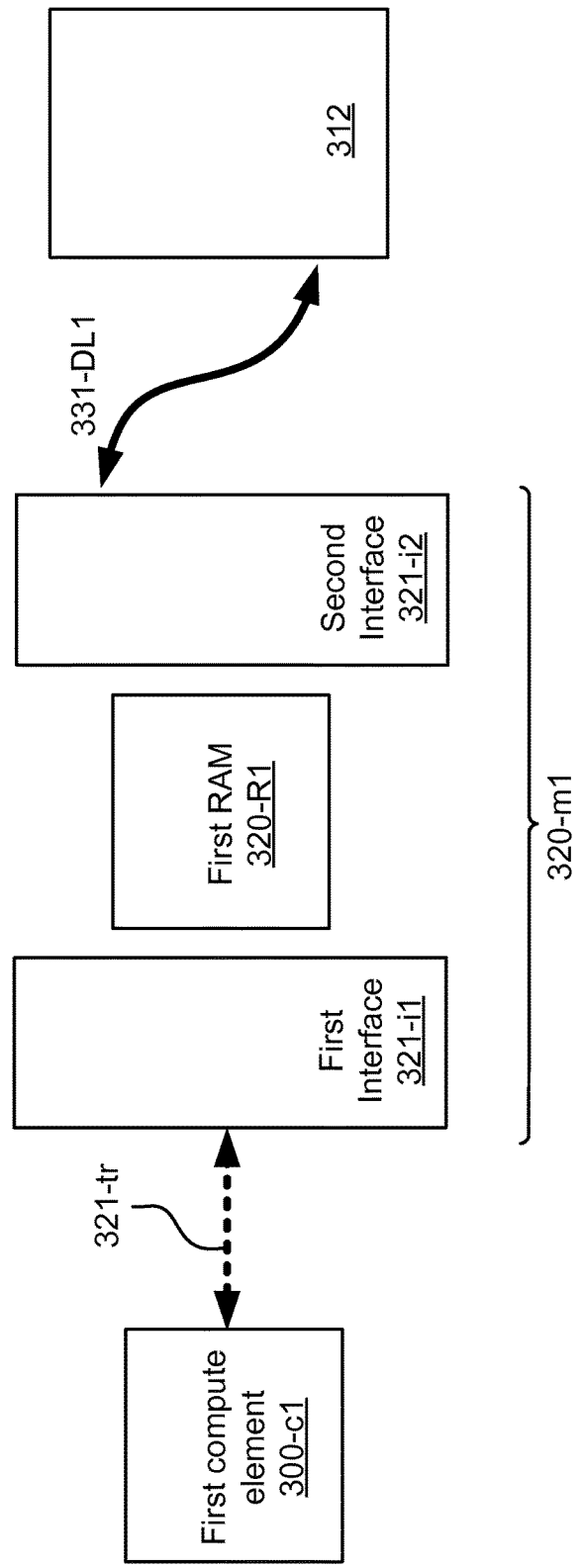
FIG. 8F illustrates one embodiment of a system configured to cache a shared memory pool using at least two memory modules, in which a first memory module includes a first RAM operative to cache sets of data, a first interface is configured to communicate with a first compute element, and a second interface is configured to transact with the shared memory pool.

FIG. 8F illustrates one embodiment of a system configured to cache a shared memory pool using at least two memory modules, in which a first memory module includes a first RAM operative to cache sets of data, a first interface is configured to communicate with a first compute element, and a second interface is configured to transact with the shared memory pool. In the system 300 (FIG. 8A) the first memory module 320-$m$1 includes a first random-access memory 320-R1 configured to cache the sets of data 312-D1 (FIG. 8B), a first interface 321-$ii$ configured to communicate with the first compute element 300-$c$1 using the synchronous random access transactions 321-$tr$, and a second interface 321-$i$2 configured to transact with the external shared memory pool 312 via the first data link 331-DL1.

Figure 8G:
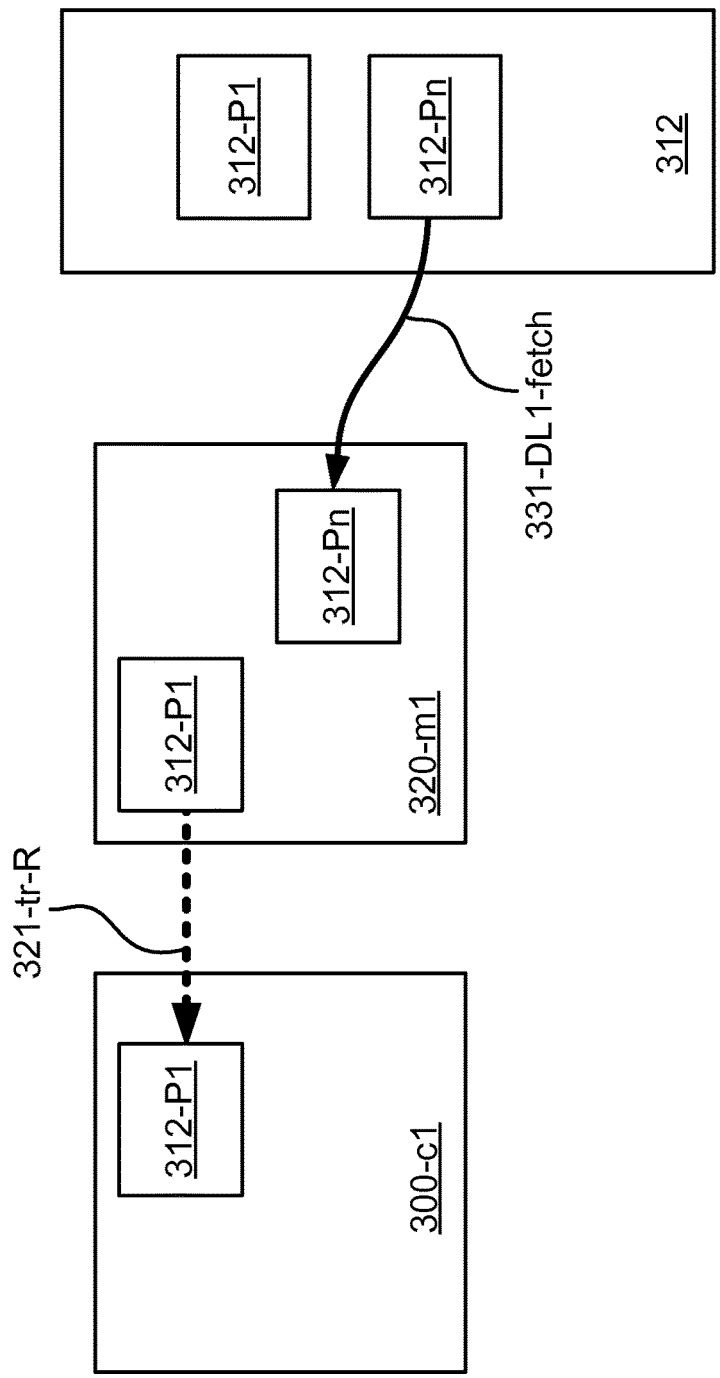
FIG. 8G illustrates one embodiment of a system configured to cache a shared memory pool using at least two memory modules, in which sets of data are arranged in a page format.

FIG. 8G illustrates one embodiment of a system configured to cache a shared memory pool using at least two memory modules, in which sets of data are arranged in a page format. In this system 300 (FIG. 8A), the sets of data 312-D1 (FIG. 8B) and other sets of data 312-D2 (FIG. 8B) are arranged in a page format 312-P1, 312-Pn respectively. Also, the system 300 (FIG. 8A) is further configured to conclude that at least some of said other sets of data 312-D2 (FIG. 8B) are currently not cached on the first memory module 320-$m$1, and consequently to issue, in said first compute element 300-$c$1, a page fault condition. The system 300 (FIG. 8A) consequently fetches 331-DL1-fetch at least one page 312-Pn from the shared memory pool 312, wherein the at least one page 312-Pn contains the at least some of the other sets of data 312-D2 (FIG. 8B). The system (FIG. 8A) further caches the at least one page 312-Pn in the first memory module 320-$m$1 for further use.

FIG. 8H illustrates one embodiment of a system configured to cache a shared memory pool using at least two memory modules, wherein a memory module includes a first RAM comprising a first bank of RAM and a second bank of RAM. FIG. 8H and FIG. 8I together illustrate one embodiment of a system 300 (FIG. 8A) that facilitates operation of the first random-access memory 320-R1 similar to a dual-ported random-access memory. In FIG. 8H, the first memory module 320-$m$1 includes a first random-access memory 320-R1 which itself includes first 320-D1 and second 320-D2 banks of dynamic-random-access-memory (DRAM). Concurrency is facilitated by the reading 321-$tr$-R (FIG. 8H) made from the first bank 320-D1 (FIG. 8H) by the first compute element while at the same time fetching 331-DL1-fetch (FIG. 8H) is done with the second bank 320-D2 (FIG. 8H).

FIG. 8I illustrates one embodiment of a system configured to cache a shared memory pool using at least two memory modules, wherein a memory module includes a first RAM comprising a first bank of RAM and a second bank of RAM. In FIG. 8I, the first memory module 320-$m$1 includes a first random-access memory 320-R1 which itself includes first 320-D1 and second 320-D2 banks of dynamic-random-access-memory (DRAM). Concurrency is facilitated by the reading 321-$tr$-R (FIG. 8I) made from the second bank 320-D2 (FIG. 8I) by the first compute element while at the same time fetching 331-DL1-fetch (FIG. 8I) is done with the first bank 320-D1 (FIG. 8I). The reading and fetching in FIG. 8I are implemented alternately with the reading and fetching in FIG. 8H, thereby facilitating operation of the first random-access memory 320-R1 as a dual-ported random-access memory.

Figure 9:
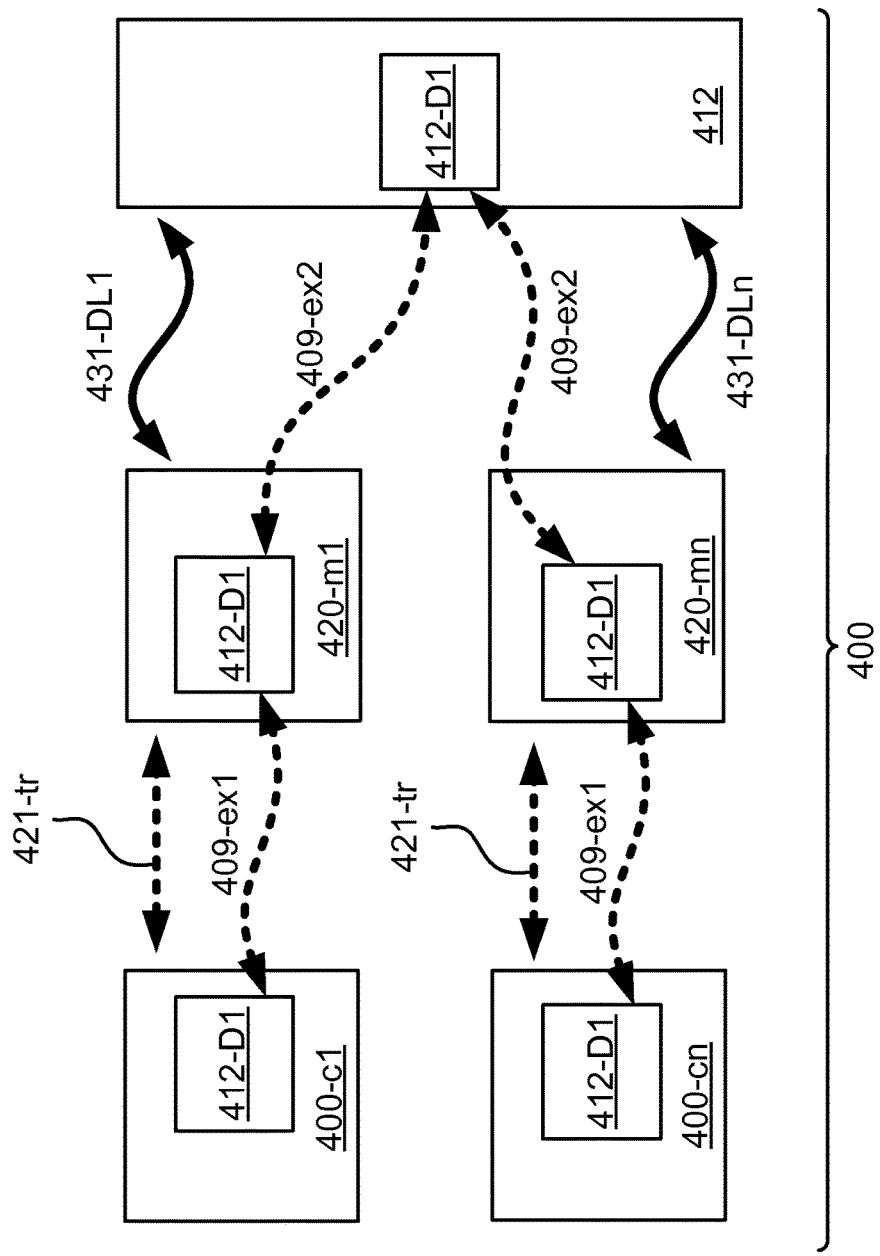
FIG. 9 illustrates one embodiment of a system configured to propagate data among a plurality of computer elements via a shared memory pool.

FIG. 9 illustrates one embodiment of a system 400 configured to propagate data among a plurality of computer elements via a shared memory pool. In one particular embodiment, the system 400 includes a plurality of compute elements 400-$c$1, 400-$cn$ associated respectively with a plurality of memory modules 420-$m$1, 420-$mn$, each compute element configured to exchange 409-$ex$1 data 412-D1 with the respective memory module using synchronous random access memory transactions 421-$tr$. The system 400 includes further a shared memory pool 412 connected with the plurality of memory modules 420-$m$1, 420-$mn$ via a plurality of data links 431-DL1, 431-DLn respectively. In some embodiments, the system 400 is configured to use the plurality of data links 431-DL1, 431-DLn to further exchange 409-$ex$2 the data 412-D1 between the plurality of memory modules 420-$m$1, 420-$mn$ and the shared memory pool 412, such that at least some of the data 412-D1 propagates from one 400-$c$1 of the plurality of compute elements to the shared memory pool 412, and from the shared memory pool 412 to another one 400-$cn$ of the plurality of compute elements.

Figure 10A:
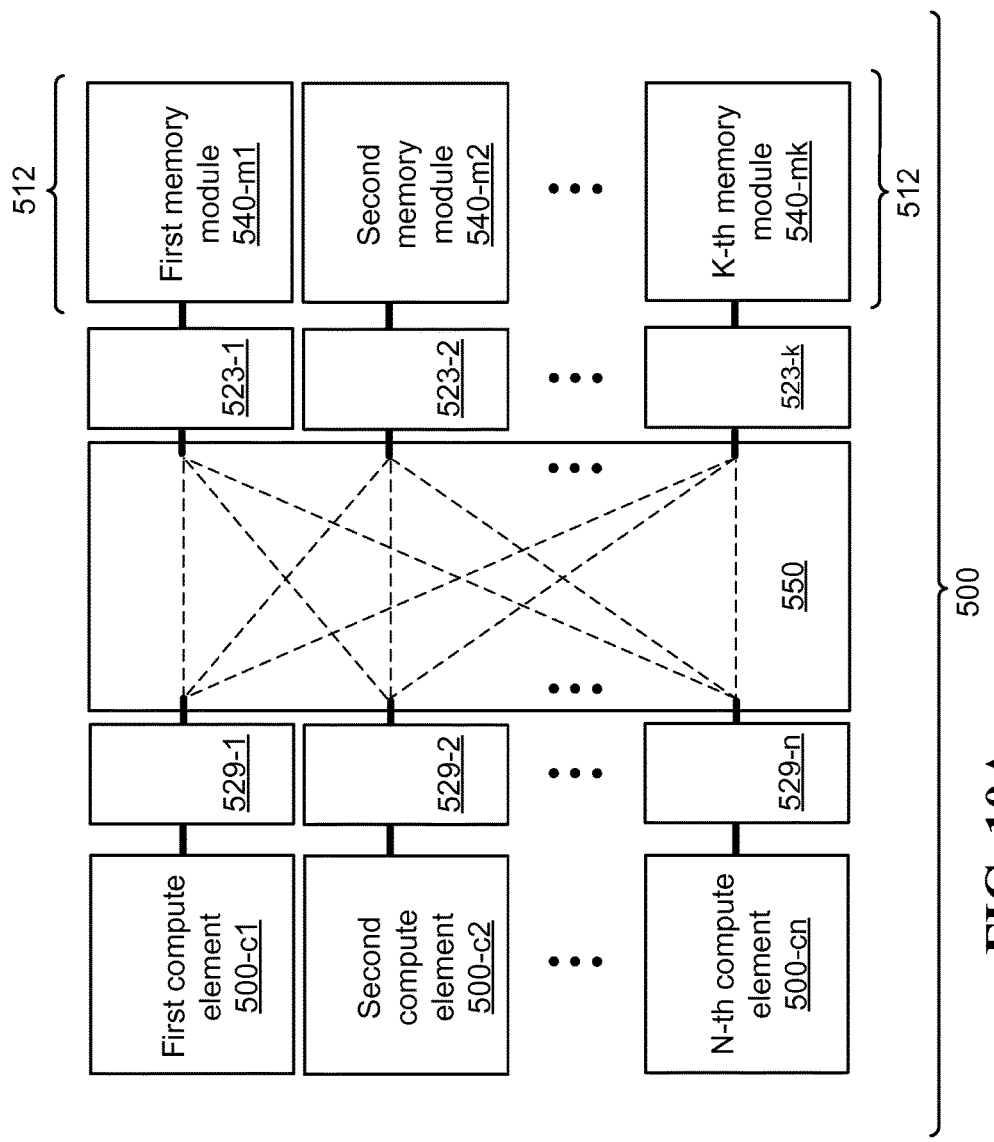
FIG. 10A illustrates one embodiment of a system configured to allow a plurality of compute elements concurrent access to a shared memory pool, including one configuration of a switching network.

FIG. 10A illustrates one embodiment of a system 500 configured to allow a plurality of compute elements concurrent access to a shared memory pool, including one configuration of a switching network 550. In one particular embodiment, the system 500 includes a first plurality of data interfaces 529-1, 529-2, 529-n configured to connect respectively to a plurality of compute elements 500-c1, 500-c2, 500-cn with the switching network 550. The system further includes a shared memory pool 512, which itself includes a plurality of memory modules 540-m1, 540-m2, 540-mn, connected to the switching network 550 via a second plurality of data interfaces 523-1, 523-2, 523-k, respectively.

Figure 10B:
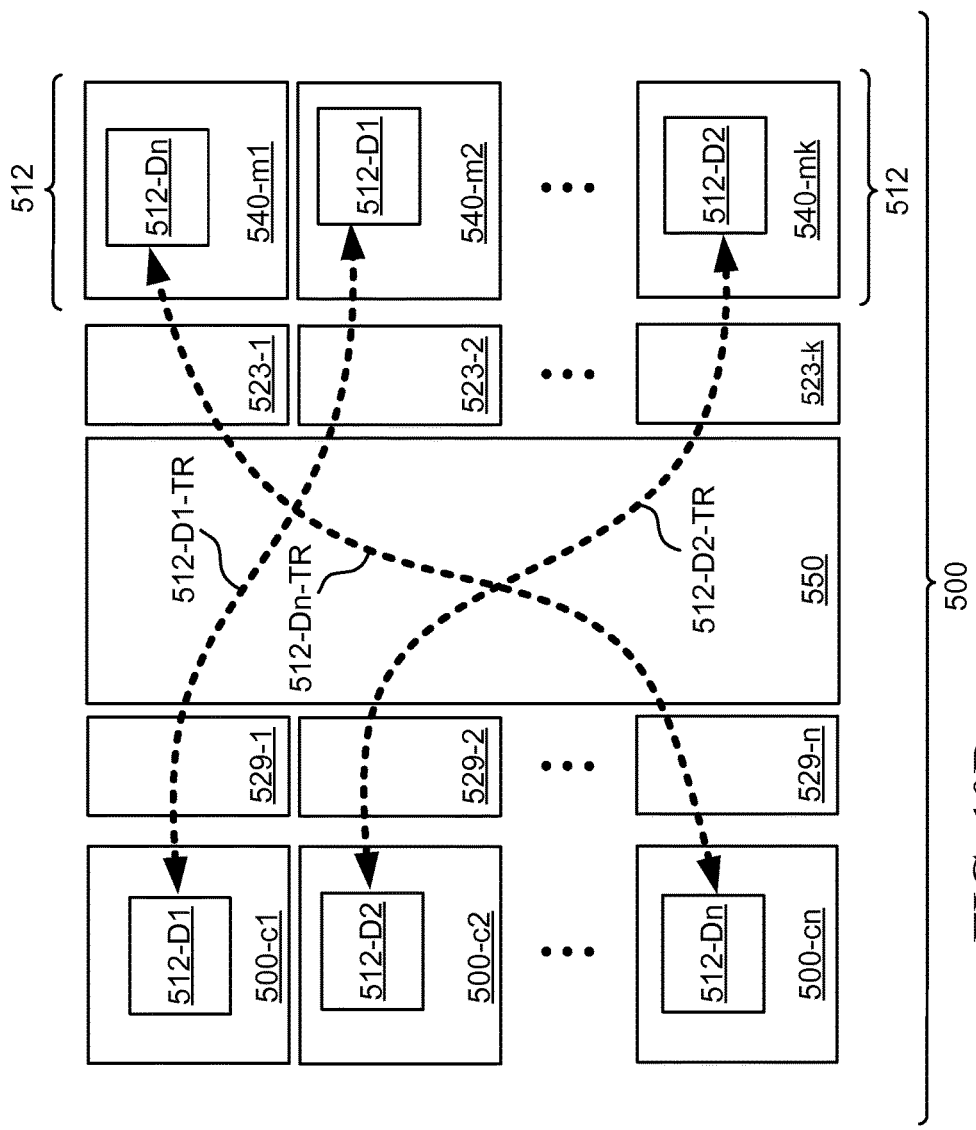
FIG. 10B illustrates one embodiment of a system configured to allow a plurality of compute elements concurrent access to a shared memory pool, including one configuration of a switching network.

FIG. 10B illustrates one embodiment of a system configured to allow a plurality of compute elements concurrent access to a shared memory pool, including one configuration of a switching network. In one particular embodiment, the system 500 includes a switching network 550 operative to transport concurrently sets of data 512-D1, 512-D2, 512-Dn associated with a plurality of memory transactions 512-D1-TR, 512-D2-TR, 512-Dn-TR. The system further includes a first plurality of data interfaces 529-1, 529-2, 529-n configured to connect respectively a plurality of compute elements 500-c1, 500-c2, 500-cn with the switching network 500. The system further includes a shared memory pool 512, which itself includes a plurality of memory modules 540-m1, 540-m2, 540-mk, connected to the switching network 550 via a second plurality of data interfaces 523-1, 523-2, 523-k respectively, where the shared memory pool 512 is configured to store or serve the sets of data 512-D1, 512-D2, 512-Dn concurrently by utilizing the plurality of memory modules concurrently, thereby facilitating a parallel memory access by the plurality of compute elements 500-c1, 500-c2, 500-cn in conjunction with the plurality of memory transactions 512-D1-TR, 512-D2-TR, 512-Dn-TR via the switching network 550.

Figure 10C:
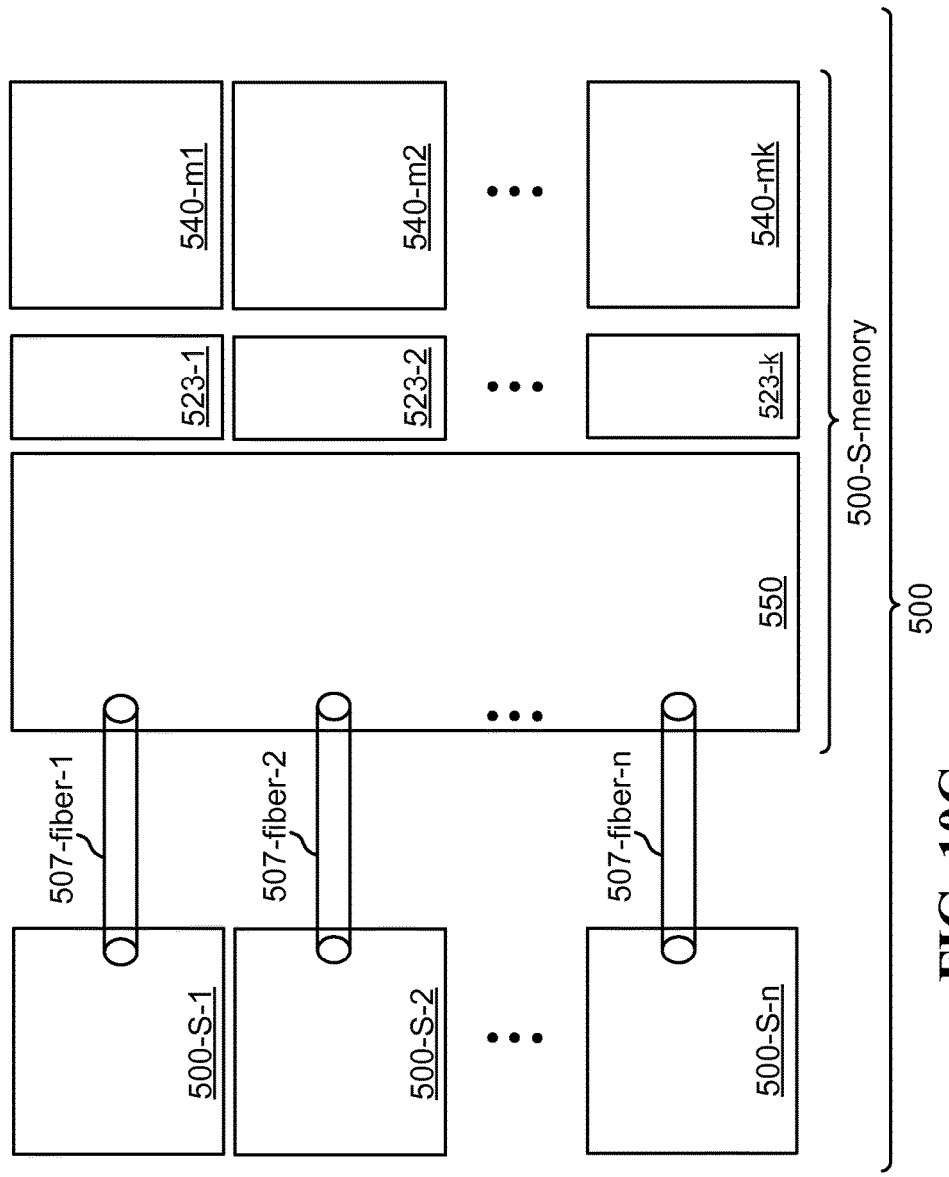
FIG. 10C illustrates one embodiment of a system configured to allow a plurality of compute elements concurrent access to a shared memory pool, including one configuration of a switching network and a plurality of optical fiber data interfaces.

FIG. 10C illustrates one embodiment of a system 500 configured to allow a plurality of compute elements concurrent access to a shared memory pool, including one configuration of a switching network and a plurality of optical fiber data interfaces. In one particular embodiment, the system 500 includes a plurality of servers 500-S-1, 500-S-2, 500-S-n housing respectively said plurality of compute elements 500-c1 (FIG. 10B), 500-c2 (FIG. 10B), 500-cn (FIG. 10B), and a memory-server 500-S-memory housing said switching network 550 and a second plurality of data interfaces 523-1, 523-2, 523-k, which are connected to, respectively, memory modules 540-m1, 540-m2, and 540-mk. The system 500 further includes a first plurality of data interfaces 529-1 (FIG. 10B), 529-2 (FIG. 10B), 529-n (FIG. 10B), which themselves include, respectively, a plurality of optical fibers 507-fiber-1, 507-fiber-2, 507-fiber-n configured to transport a plurality of memory transactions 512-D1-TR (FIG. 10B), 512-D2-TR (FIG. 10B), 512-Dn-TR (FIG. 10B) between the plurality of servers 500-S-1, 500-S-2, 500-S-n and the memory-server 500-S-memory.

Figure 10D:
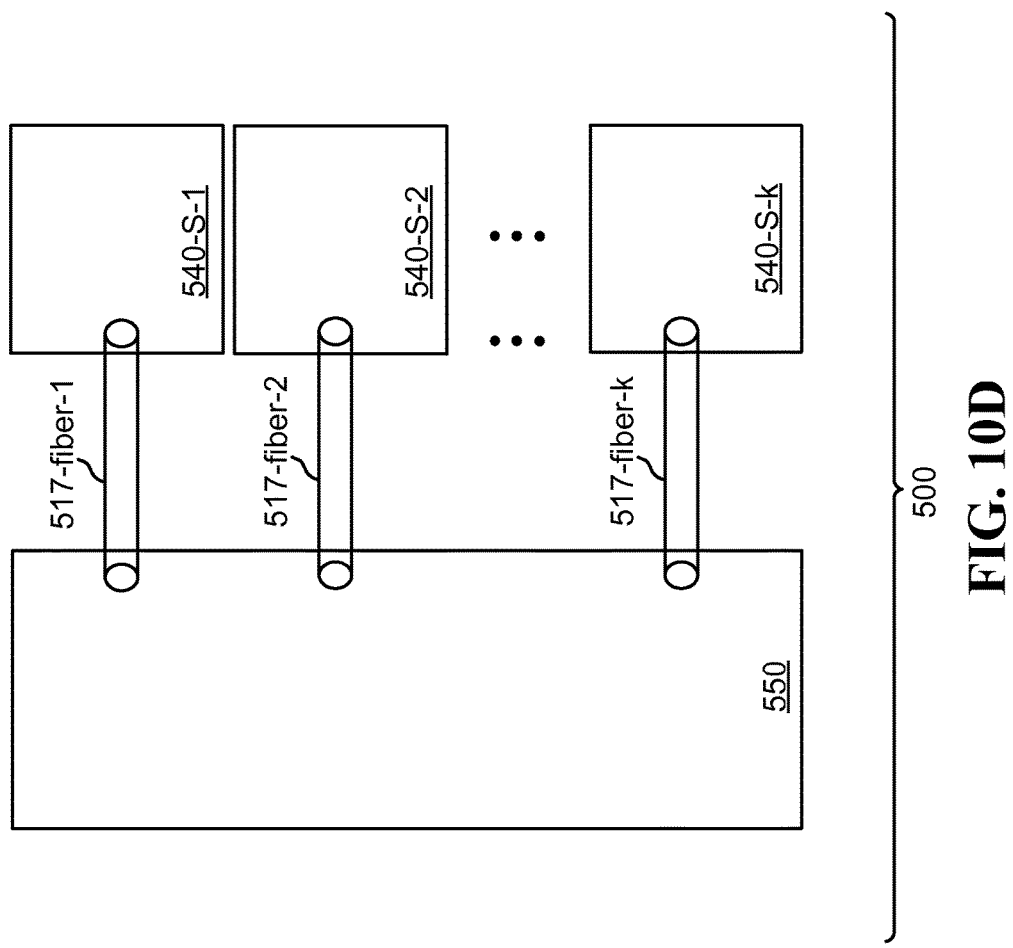
FIG. 10D illustrates one embodiment of a system configured to allow a plurality of compute elements concurrent access to a shared memory pool, including one configuration of a switching network, and a second plurality of servers housing a second plurality of memory modules.

FIG. 10D illustrates one embodiment of a system 500 configured to allow a plurality of compute elements concurrent access to a shared memory pool, including one configuration of a switching network 550, and a second plurality of servers housing a second plurality of memory modules. In one particular embodiment, the system 500 includes a second plurality of servers 540-S-1, 540-S-2, 540-S-k housing respectively a plurality of memory modules 540-m1 (FIG. 10C), 540-m2 (FIG. 10C), 540-mk (FIG. 10C). In some particular embodiments, a second plurality of data interfaces 523-1 (FIG. 10C), 523-2 (FIG. 10C), 523-k (FIG. 10C) comprises respectively a plurality of optical fibers 517-fiber-1, 517-fiber-2, 517-fiber-k configured to transport a plurality of memory transactions 512-D1-TR (FIG. 10B), 512-D2-TR (FIG. 10B), 512-Dn-TR (FIG. 10B) between the second plurality of servers 540-S-1, 540-S-2, 540-S-k and the switching network 550.

One embodiment is a system 200 configured to cache automatically an external memory element 212 as a result of a random-access read cycle 221-tr-R. In one embodiment, the system includes a first random-access memory (RAM) 220-R1, a first interface 221-i1 configured to connect the system 200 with a first compute element 200-c1 using synchronous random access transactions 221-tr, and a second interface 221-i2 configured to connect 221-connect the system 200 with an external memory element 212. In some embodiments the system is configured to prolong 221-tr-prolong a synchronous random-access read cycle 221-tr-R initiated by the first compute element 200-c1 in conjunction with the first interface 221-i1 when the synchronous random-access read cycle 221-tr-R is detected to be addressed to a first memory location 221-L1 of the external memory element 212 currently not cached by the first random-access memory 220-R-1, fetch 212-L1-fetch via the second interface 221-i2 from the external memory element 212 at least one data element 212-D1 associated with the first memory location 212-L1, serve 212-D1-serve to the first compute element 200-c1 as part of said synchronous random-access read cycle 221-tr-R prolonged via the first interface 221-i1 the at least one data element 212-D1 that was previously fetched thereby concluding successfully said synchronous random-access read cycle 221-tr-R, and optionally write 212-D1-write the at least one data element 212-D1 to the first random-access memory 220-R1 thereby caching automatically the first memory location 212-L1 for faster future access by the first compute element 200-c1.

In one alternative embodiment to the system 200 just described to cache automatically an external memory element 212, further the first compute element is placed on a first motherboard 200-MB, the system 200 is implemented on a first printed-circuit-board (PCB) having a form factor of a dual-in-line-memory-module (DIMM) 200-DIMM such that the system 200 is connected to the first motherboard 200-MB like a dual-in-line-memory-module and such that said first compute element 200-c1 perceives the system 200 as essentially a dual-in-line-memory-module, the external memory element 212 is not placed on the first motherboard 200-MB, and the second interface 221-i2 is an electrical-optical interface 221-i2-EO connected to said external memory element 212 via an optical fiber 207-fiber together operative to facilitate the connection 221-connect.

In a second alternative embodiment to the system 200 described above to cache automatically an external memory element 212, further the synchronous random-access read cycle 221-tr-R is performed using a signal configuration selected from a group consisting of (i) single-data-rate (SDR), (ii) double-data-rate (DDR), and (iii) quad-data-rate (QDR).

In a third alternative embodiment to the system 200 described above to cache automatically an external memory element 212, further the prolonging 221-tr-R-prolong of the synchronous random-access read cycle 221-tr-R is done in order to allow enough time for the system 200 to perform the fetch 212-L1-fetch, and further the synchronous random-access read cycle 221-tr-R is allowed to conclude at such time that said serving 212-D1-serve is possible, thereby ending said prolonging 221-tr-R-prolong.

In one possible variation of the third alternative embodiment just described, further the synchronous random-access read cycle 221-tr-R is performed over a double-data-rate (DDR) bus configuration, and the prolonging 221-tr-R-prolong is done using a procedure selected from a group consisting of: (i) manipulating a data strobe signal belonging to said DDR bus configuration, (ii) manipulating an error signal belonging to said DDR bus configuration, (iii) reducing dynamically a clock frame of the DDR bus configuration, (iv) adjusting dynamically a latency configuration associated with said DDR bus configuration, and (v) any general procedure operative to affect timing of said synchronous random-access read cycle 221-*tr*-R.

In a fourth alternative embodiment to the system 200 described above to cache automatically an external memory element 212, further a system controller 200-cont is included and configured to fetch 212-L1-fetch-add additional data elements 212-Dn respectively from additional memory locations 212-Ln of the external memory element 212 where the additional memory locations are estimated based at least in part on the first memory location 212-L1 and the memory locations are to be accessed in the future by said compute element 200-*c*1, and write 212-Dn-write the additional data elements 212-Dn fetched to the first random-access memory 220-R1 thereby caching automatically the additional memory locations 212-Ln for faster future access by the first compute element.

In one possible variation of the fourth alternative embodiment just described, further the writing 212-Dn-write of the additional data elements 212-Dn is operated concurrently with additional 221-*tr*-R-W-add synchronous random-access read cycles or synchronous random-access write cycles made by the first compute element 200-*c*1 in conjunction with the first interface 221-*i*1 and the first random-access memory 220-R1.

In one possible configuration of the possible variation just described, further the concurrent operation is made possible at least in part by the first random-access memory 220-R1 being a dual-ported random-access memory.

One embodiment is a system 300 configured to cache a shared memory pool 312 using at least two memory modules, including a first compute element 300-*c*1 and a second computer element 300-*cn* which are associated with, respectively, a first memory module 320-*m*1 and a second memory module 320-*mn* memory module, where each of the compute elements is configured to communicate with its respective memory module using synchronous random access transactions 321-*tr*. Also, a shared memory pool 312 connected with the first 320-*m*1 and second 320-*mn* memory modules via a first data link 331-DL1 and a second data link 331-DLn, respectively. In some embodiments, the system 300 is configured to use the first 320-*m*1 and second 320-*mn* memory modules as a cache to the shared memory pool 312, such that sets of data 312-D1 cached on the first 320-*m*1 or second 320-*mn* memory modules are read 321-*tr*-R by the respective compute element using the synchronous random access transactions 321-*tr*, and other sets of data 312-D2 that are not cached on the first 320-*m*1 or second 320-*mn* memory modules are fetched 331-DL1-fetch from the shared memory pool 312 into the first 320-*m*1 or the second 320-*mn* memory module upon demand from the memory module's respective compute element.

In one alternative embodiment to the system 300 just described to cache a shared memory pool 312 using at least two memory modules, further the first 320-*m*1 memory module is a first dual-in-line-memory-module (DIMM) 300-DIMM-1.

In one possible variation of the alternative embodiment just described, further the first compute element 300-*c*1 is placed on a first motherboard 300-MB-1, the first dual-in-line-memory-module 300-DIMM-1 is connected to the first motherboard 300-MB-1 via a first dual-in-line-memory-module slot 300-DIMM-1-slot, and the first data link 331-DL1 includes a first optical fiber 307-fiber-1.

In one possible configuration of the possible variation just described, further, the second 320-*mn* memory module is a second dual-in-line-memory-module 300-DIMM-n, the second compute element 300-*cn* is placed on a second motherboard 300-MB-n, the second dual-in-line-memory-module 300-DIMM-n is connected to the second motherboard 300-MB-n via a second dual-in-line-memory-module slot 300-DIMM-n-slot, the second data link 331-DLn includes a second optical fiber 307-fiber-n, the first 300-MB-1 and second 300-MB-n motherboard are placed in a first 300-S-1 and a second 300-S-n server, respectively, and the shared memory pool is placed in a third server 300-server thereby facilitating distributed operation and memory disaggregation.

In a second alternative embodiment to the system 300 described above to cache a shared memory pool 312 using at least two memory modules, further the first memory module 320-*m*1 includes a first random-access memory 320-R1 operative to cache the sets of data 312-D1, a first interface 321-*ii* configured to communicate with the first compute element 300-*c*1 using the synchronous random access transactions 321-*tr*, and a second interface 321-*i*2 configured to transact with the external shared memory pool 312 via the first data link 331-DL1.

In a third alternative embodiment to the system 300 described above to cache a shared memory pool 312 using at least two memory modules, further the sets of data 312-D1 and other sets of data 312-D2 are arranged in a page format 312-P1 and 312-Pn, respectively. In some embodiments, the system 300 is further configured to conclude that at least some of the other sets of data 312-D2 are currently not cached on said first memory module 320-*m*1, to issue in the first compute element 300-*c*1 a page fault condition, to fetch 331-DL1-fetch by the first compute element 300-*c*1 at least one page 312-Pn from said shared memory pool 312 where the at least one page 312-Pn contains at least some of the other sets of data 312-D2, and cache the at least one page 312-Pn in said first memory module 320-*m*1 for further use.

In a fourth alternative embodiment to the system 300 described above to cache a shared memory pool 312 using at least two memory modules, further the first memory module 320-*m*1 is configured to facilitate the reading 321-*tr*-R of the sets of data 312-D1 concurrently with the fetching 331-DL1-fetch of the other sets of data 312-D2, such that the fetching 331-DL1-fetch of the other sets of data 312-D2 does not reduce data throughput associated with the readings 321-*tr*-R.

In one possible variation of the fourth alternative embodiment just described, further, the first memory module 320-*m*1 comprises a first random-access memory 320-R1 including a first 320-D1 and a second 320-D2 bank of dynamic-random-access-memory (DRAM). In some embodiments, the concurrency is facilitated by the reading 321-*tr*-R in FIG. 8H made from the first bank 320-D1 in FIG. 8H when the fetching 331-DL1-fetch in FIG. 8H is done with the second bank 320-D2 in FIG. 8H, and by the reading 321-*tr*-R FIG. 8I made from the second bank 320-D2 in FIG. 8I when the fetching 331-DL1-fetch in FIG. 8I is done with the first bank 320-D1 in FIG. 8I, effectively facilitating operation of the first random-access memory 320-R1 as a dual-ported random-access memory.

One embodiment is a system 400 configured to propagate data among a plurality of compute elements via a shared memory pool 412, including a plurality of compute elements 400-*c*1, 400-*cn* associated with, respectively, a plurality of memory modules 420-*m*1, 420-*mn*, where each compute element is configured to exchange 409-*ex*1 data 412-D1 with its respective memory module using synchronous random access memory transactions 421-*tr*. In this embodiment, further a shared memory pool 412 is connected with the plurality of memory modules 420-*m*1, 420-*mn* via a plurality of data links 431-DL1, 431-DLn, respectively. In some embodiments, the system 400 is configured to use the plurality of data links 431-DL1, 431-DLn to further exchange 409-*ex*2 the data 412-D1 between the plurality of memory modules 420-*m*1, 420-*mn* and the shared memory pool 412, such that at least some of the data 412-D1 propagates from one 400-*c*1 of the plurality of compute elements to the shared memory pool 412 and from the shared memory pool 412 to another one 400-*cn* of the plurality of compute elements.

One embodiment is a system 500 configured to allow a plurality of compute elements concurrent access to a shared memory pool 512, including a switching network 550 operative to transport concurrently sets of data 512-D1, 512-D2, 512-Dn associated with a plurality of memory transactions 512-D1-TR, 512-D2-TR, 512-Dn-TR. In this embodiment, further a first plurality of data interfaces 529-1, 529-2, 529-*n* configured to connect, respectively, a plurality of compute elements 500-*c*1, 500-*c*2, 500-*cn* with the switching network 500. In this embodiment, further a shared memory pool 512 including a plurality of memory modules 540-*m*1, 540-*m*2, 540-*mk*, connected to the switching network 550 via a second plurality of data interfaces 523-1, 523-2, 523-*k* respectively, wherein the shared memory pool 512 is configured to store or serve the sets of data 512-D1, 512-D2, 512-Dn concurrently by utilizing the plurality of memory modules concurrently, thereby facilitating a parallel memory access by the plurality of compute elements 500-*c*1, 500-*c*2, 500-*cn* in conjunction with the plurality of memory transactions 512-D1-TR, 512-D2-TR, 512-Dn-TR via the switching network.

One alternative embodiment to the system just described 500 to allow a plurality of compute elements concurrent access to a shared memory pool 512, further including a plurality of servers 500-S-1, 500-S-2, 500-S-n housing respectively the plurality of compute elements 500-*c*1, 500-*c*2, 500-*cn*, and a memory-server 500-S-memory housing the switching network 550 and the second plurality of data interfaces 523-1, 523-2, 523-*k*. In some embodiments, the first plurality of data interfaces 529-1, 529-2, 529-*n* includes respectively a plurality of optical fibers 507-fiber-1, 507-fiber-2, 507-fiber-n configured to transport the plurality of memory transactions 512-D1-TR, 512-D2-TR, 512-Dn-TR between the plurality of servers 500-S-1, 500-S-2, 500-S-n and the memory-server 500-S-memory. In some embodiments, the at least one of the first plurality of data interfaces 529-1, 529-2, 529-*n* is a shared input-output medium. In some embodiments, at least one of the plurality of memory transactions 512-D1-TR, 512-D2-TR, 512-Dn-TR is done in conjunction with at least one of the plurality of compute elements 500-*c*1, 500-*c*2, 500-*cn* using synchronous random access transactions.

In a second alternative embodiment to the system 500 described above to allow a plurality of compute elements concurrent access to a shared memory pool 512, further the first plurality of data interfaces 529-1, 529-2, 529-*n* include at least 8 (eight) data interfaces, the plurality of memory modules 540-*m*1, 540-*m*2, 540-*mk* include at least 8 (eight) memory modules, and the plurality of memory transactions 512-D1-TR, 512-D2-TR, 512-Dn-TR has an aggregated bandwidth of at least 400 Giga-bits-per-second.

In a third alternative embodiment to the system 500 described above to allow a plurality of compute elements concurrent access to a shared memory pool 512, further each of the plurality of memory modules 540-*m*1, 540-*m*2, 540-*mk* is a dynamic-random-access-memory accessed by the respective one of the second plurality of data interfaces 523-1, 523-2, 523-*k* using synchronous random access memory transactions, and the latency achieved with each of the plurality of memory transactions 512-D1-TR, 512-D2-TR, 512-Dn-TR is lower than 2 (two) microseconds.

In a fourth alternative embodiment to the system 500 described above to allow a plurality of compute elements concurrent access to a shared memory pool 512, further the switching network 550 is a switching network selected from a group consisting of: (i) a non-blocking switching network, (ii) a fat tree packet switching network, (iii) a cross-bar switching network, and (iv) an integrated-circuit (IC) configured to multiplex said sets of data 512-D1, 512-D2, 512-Dn in conjunction with said plurality of memory modules 540-*m*1, 540-*m*2, 540-*mk* thereby facilitating said transporting concurrently of said sets of data 512-D1, 512-D2, 512-Dn.

In a fifth alternative embodiment to the system 500 described above to allow a plurality of compute elements concurrent access to a shared memory pool 512, further including a second plurality of serves 540-S-1, 540-S-2, 540-S-k housing respectively the plurality of memory modules 540-*m*1, 540-*m*2, 540-*mk* In some embodiments, the second plurality of data interfaces 523-1, 523-2, 523-*k* includes respectively a plurality of optical fibers 517-fiber-1, 517-fiber-2, 517-fiber-k configured to transport the plurality of memory transactions 512-D1-TR, 512-D2-TR, 512-Dn-TR between the second plurality of servers 540-S-1, 540-S-2, 540-S-k and the switching network 550.

Figure 11A:
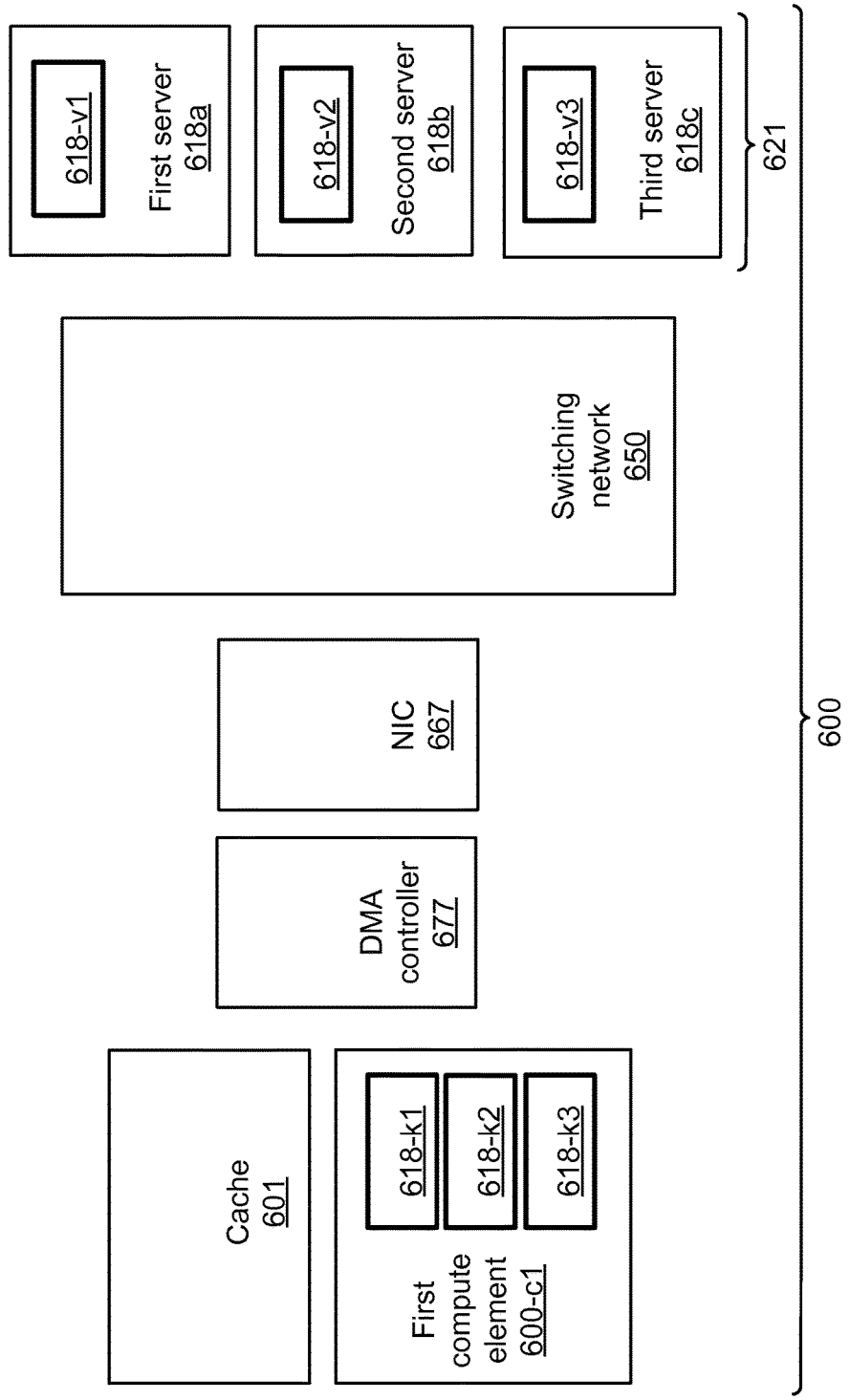
FIG. 11A illustrates one embodiment of a system configured to use a compute element to process a plurality of values distributed over a plurality of servers using a plurality of keys.

FIG. 11A illustrates one embodiment of a system 600 configured to use a compute element to process a plurality of values distributed over a plurality of servers using a plurality of keys. The system 600 includes a cache memory 601, and a first compute element 601-*c*1 associated with and in communicative contact with the cache memory 601. The first compute element 601-*c*1 includes two or more keys, 618-*k*1, 618-*k*2, 618-*k*3, where each key is associated with a respective data value, 618-*k*1 with 618-*v*1, 618-*k*2 with 618-*v*2, and 618-*k*3 with 618-*v*3. The data values are stored in multiple servers. In FIG. 11A, 618-*v*1 is stored in first server 618*a*, 618-*v*2 is stored in second server 618*b*, and 618-*v*3 is stored in third server 618*c*. It will be understood, however, that two or more specific data values may be served in a single server, although the entire system 600 includes two or more servers. The servers as a whole are a server stack that is referenced herein as a distributed key-value-store (KVS) 621. The first compute element 600-*c*1 and the distributed KVS 621 are in communicative contact through a switching network 650, which handles requests for data values from the first compute element 600-*c*1 to the KVS 621, and which handles also data values sent from the KVS 621 to either the first compute element 600-*c*1 or the cache memory 601. In some embodiments, the system 600 includes also a direct-memory-access (DMA) controller 677, which receives data values from the switching network 650, and which may pass such data values directly to the cache memory 601 rather than to the first compute element 600-*c*1, thereby temporarily freeing the first compute element 600-*c*1 to perform work other than receiving and processing a data value. The temporary freeing of the first compute element 600-*c*1 is one aspect of system 600 timing that facilitates a higher utilization rate for the first compute element 600-*c*1. In some embodiments, the system 600 includes also a network-interface-card (NIC) 667, which is configured to associate the first compute element 600-*c*1 and the cache memory 601 with the switching network 650. In some embodiments, the NIC 667 is further configured to block or delay any communication currently preventing the NIC 667 from immediately sending a request for data value from the first compute element 600-*c*1 to the KVS 621, thereby preventing a situation in which the first compute element 600-*c*1 must wait before sending such a request. This blocking or delaying by the NIC 667 facilitates efficient usage and a higher utilization rate of the first compute element 600-*c*1. In FIG. 11A, the order of structural elements between cache memory 601 and first compute element 600-*c*1 on the one hand and the KVS 621 on the other hand is DMA controller 677, then NIC 667, then switching network 650, but this is only one of many possible configurations, since any of the three elements 677, 667, or 650, may be either on the left, or in the middle, or on the right, and indeed in alternative embodiments, the DMA controller 677 and NIC 667 may be parallel, such that they are not in direct contact with one another but each one is in contact with the switching network 667 and with either the cache memory 601 or the first compute element 600-*c*1 or with both the cache memory 601 and the first compute element 600-*c*1.

In some embodiments of FIG. 11A, the KVS 621 is a shared memory pool 512 from FIG. 10B, which includes multiple memory modules 540-*m*1, 540-*m*2, 540-*mk*, where each memory module is associated with a particular server. In FIG. 11A as shown, memory module 540-*m*1 would be associated with first server 618*a*, memory module 540-*m*2 would be associated with second server 618*b*, and memory module 540-*mk* would be associated with third server 618*c*. However, many different configurations are possible, and a single server may include two or more memory modules, provided that the entire system includes a multiplicity of memory modules and a multiplicity of servers, and that all of the memory modules are included in at least two servers. In a configuration with memory modules, the data values are stored in the memory modules, for example data value 618-*v*1 in memory module 540-*m*1, data value 618-*v*2 in memory module 540-*m*2, and data value 618-*v*3 in memory module 540-*mk*, but this is only one of multiple possible configurations, provided that all of the data values are stored in two or more memory modules that are located in two or more servers. In some embodiments, one or more of the multiple memory modules 540-*m*1, 540-*m*2, 540-*mk*, are based on random-access-memory (RAM), which may be a dynamic RAM (DRAM) or a flash memory in two non limiting examples, and at least as far as read cycles are concerned, thereby facilitating the execution of data value requests from the first compute element 600-*c*1. In some embodiments, a memory module can execute a data value request in a period between 200 and 2,500 nanoseconds.

Figure 11B:
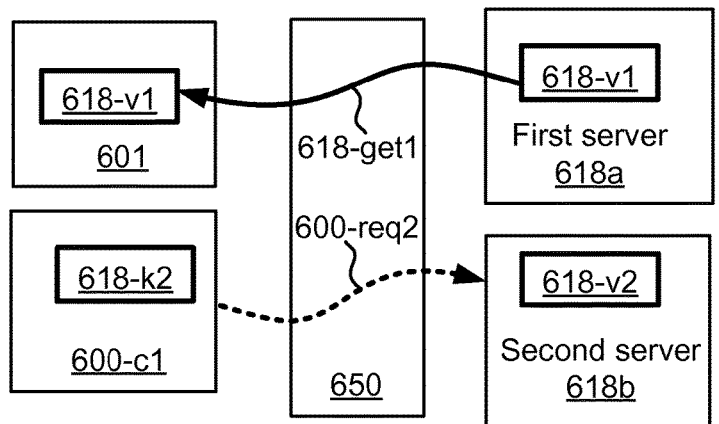
FIG. 11B illustrates one embodiment of a system configured to request and receive data values needed for data processing.

FIG. 11B illustrates one embodiment of a system configured to request and receive data values needed for data processing. FIG. 11B illustrates two transfers of information, one at the top and one at the bottom, although both transfers pass through the switching network 650. At the top, cache memory 601 receives 618-get1 a first data value 618-*v*1 which was sent by the first server 618*a* to the switching network 650. In some embodiments, the first data value 618-*v*1 is sent directly from the switching network to the cache memory 601, while in other embodiments the first data value 618-*v*1 is sent from the switching network to a DMA controller 677 (or rather pulled by the DMA controller) and then to the cache memory 601, while in other embodiments the first data value 618-*v*1 is sent from the switching network 650 directly to the first compute element 600-*c*1, and in other embodiments the first data value 618-*v*1 is sent from the switching network 650 to a DMA controller 677 and then to the first compute element 600-*c*1.

In FIG. 11B, in the bottom transfer of information, a first compute element 600-*c*1 uses a key, here 618-*k*2 to identify the server location of a needed data value, here second data value 618-*v*2. The first compute element 600-*c*1 then sends a request 600-*req*2 to receive this data value 618-*v*2, where such request 600-*req*2 is sent to the switching network 650 and then to the server holding the data value 618-*v*2, here second server 618*b*.

Figure 11C:
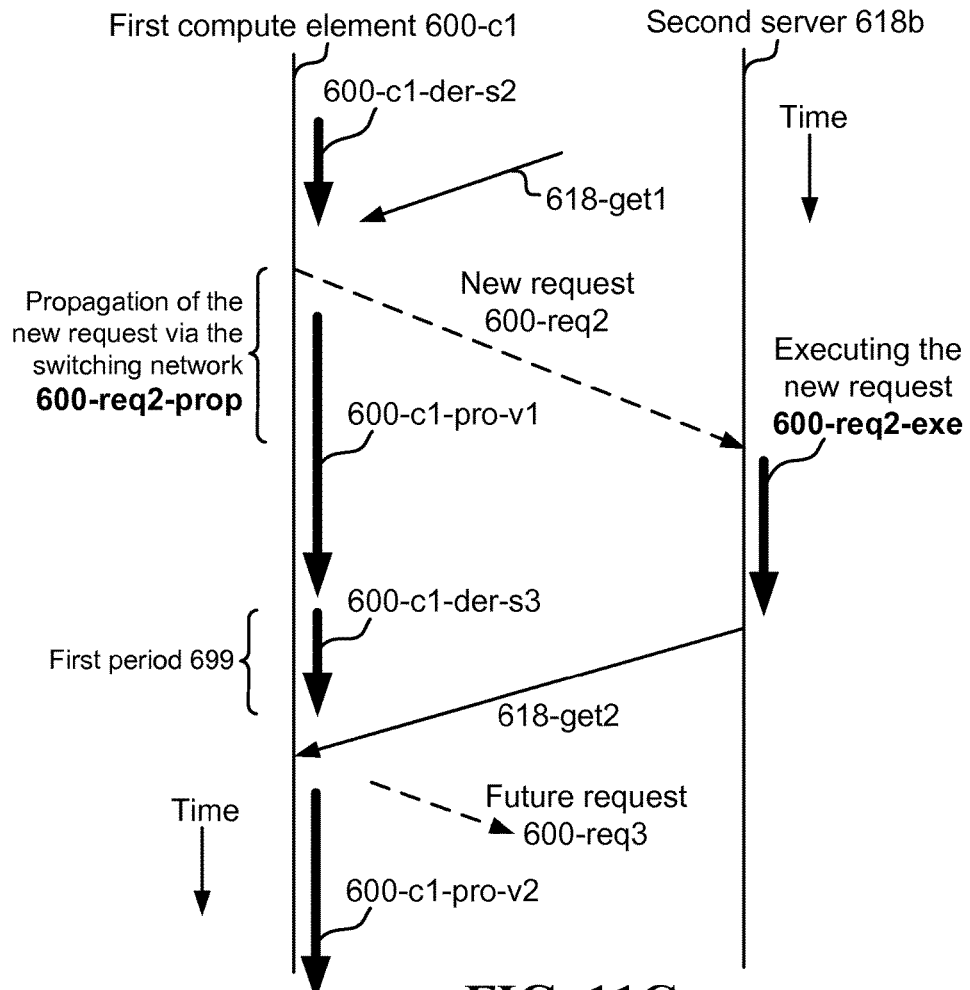
FIG. 11C illustrates one embodiment of a system configured to streamline a process of retrieving a plurality of values from a plurality of servers using a plurality of keys.

FIG. 11C illustrates one embodiment of a system configured to streamline a process of retrieving a plurality of values from a plurality of servers using a plurality of keys. In FIG. 11C, the system 600 is configured to perform four general tasks:

- to use keys 618-*k*2, 618-*k*3, to derive 600-*c*1-*der*-*s*2, 600-*c*1-*der*-*s*3 identities of servers holding needed data values,
- to send requests 600-*req*2, 600-*req*3 for needed data values to the specific servers in the KVS 621 holding the needed data values,
- to receive the needed data values 618-get1, 618-*get*2 from the servers via the switching network 650 or the DMA controller 677 or the cache memory 601, and
- to process 600-*c*1-*pro*-*v*1, 600-*c*1-*pro*-*v*2 the received data values as required.

In some embodiments, the first compute element 600-*c*1 is dedicated to the four general tasks described immediately above. Dedications to these tasks can enhance the utilization rate of the first compute element 600-*c*1, and thereby increase the relative efficiency of its usage.

In the specific embodiment shown in FIG. 11C, time flows from the top to the bottom, actions of the first compute element 600-*c*1 are illustrated on the left, actions of the second server 618*b* are illustrated on the right, and interactions between the first compute element 600-*c*1 and the second server 618*b* are illustrated by lines pointing between these two structures in which information transfers are via the switched network 650. The server location (e.g. the address of the server) associated with a second needed data value is derived 600-*c*1-*der*-*s*2 by the first compute element 600-*c*1, after which the first compute element 600-*c*1 receives 618-get1 a first needed data value that was previously requested, and the first compute element 600-*c*1 sends a new request for a second needed data value 600-*req*2 to the second server 618*b*, after which the first compute element 600-*c*1 processes the first data value 600-*c*1-*pro*-*v*1, and the first compute element derives the server location of a third needed data value 600-*c*1-*der*-*s*3, after which the first compute element 600-*c*1 receives 618-*get*2 the second needed data value, and the first compute element sends a future request 600-*req*3 for the third needed data value, after which the first compute element processes the second needed data value 60-*c*1-*pro*-*v*2.

After the second server 618*b* receives from the switching network 650 the new request for a second needed data value 600-*req*2, the second server 618*b* executes this request 600-*req*2-*exe* by locating, optionally using the second key which is included in the new request 600-*req*2, the needed data value within the server 618*b* and preparing to send it to the switching network 650. The period of time from which the first compute element 600-*c*1 sends a new request for a second needed data value 600-*req*2 until that request is received by the second server 618*b* is a request propagation time 600-*req*2-*prop*. During the propagation period 600-

*req*2-prop, the period during which the second server 618*b* executes the data request 600-*req*2-*exe*, and the time period 618-*get*2 during which the second needed data value is transferred from the second server 618*b* to the first compute element 600-*c*1, the first compute element 600-*c*1 processes the first needed data value 600-*c*1-*pro*-*v*1 and, in a first period 699, derives the server location of the third needed data value 600-*c*1-*der*-*s*3. This interleaving of activity between the various structural elements of the system 600 increases the utilization rate of the first compute element 600-*c*1 and thereby enhances the efficient usage of the first compute element 600-*c*1.

In the embodiment illustrated in FIG. 11C, processing of the first needed data value 600-*c*1-*pro*-*v*1 occurs before the derivation of server location for the third needed data value 600-*c*1-*der*-*s*3. This is only one of multiple embodiments. In some alternative embodiments, the derivation of server location for the third needed data value 600-*c*1-*der*-*s*3 occurs before the processing of the first needed data value 600-*c*1-*pro*-*v*1. In other alternative embodiments, the processing of the first needed data value 600-*c*1-*pro*-*v*1 occurs in parallel with the derivation of the server location for the third needed data value 600-*c*1-*der*-*s*3. All of these embodiments are possible, because in all of them the first compute element 600-*c*1 continues to be utilized, which means that the first compute element's 600-*c*1 utilization rate is relatively high, and therefore its usage is relatively efficient.

Figure 11D:
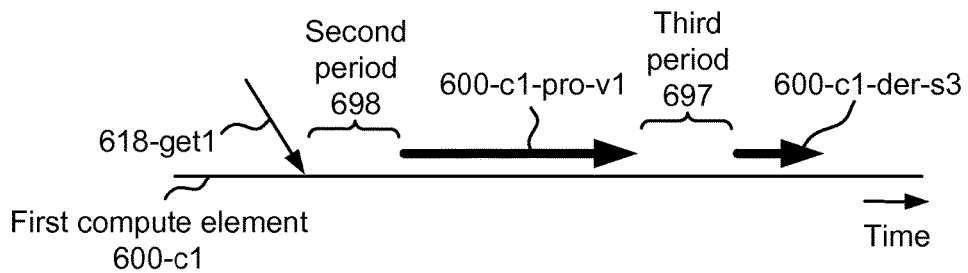
FIG. 11D illustrates one embodiment of a system configured to minimize or at least reduce the duration of time periods between general tasks executed by a first compute element.

FIG. 11D illustrates one embodiment of a system configured to minimize or at least reduce the duration of time periods between general tasks executed by a first compute element. In some embodiments, a first compute element 600-*c*1 is dedicated to the four general tasks described with respect to FIG. 11C above. In the specific embodiment illustrated in FIG. 11D, a first compute element 600-*c*1 is operating over time. The first compute element 600-*c*1 receives 618-*get*1 a first needed data value. There is a second period 698 after receipt 618-*get*1 of the first needed data value but before the first compute element 600-*c*1-prov-*v*1 processes that first needed data value. There is then a third period 697 after the first compute element 600-*c*1 has processed the first needed data value 600-*c*1-*pro*-*v*1 but before the first compute element 600-*c*1 derives the server location of a third needed data value 600-*c*1-*der*-*s*3. To increase system efficiency, it would be desirable to minimize, or at least to reduce the duration, of either or both of the second period 698 and the third period 697. The implementation of the four general tasks by the first compute element 600-*c*1, as presented and explained in reference to FIG. 11C, will minimize or at least reduce the duration of either or both of the second period 698 and the third period 697, and in this way increase the utilization rate of the first compute element 600-*c*1 and hence the relative efficiency in the usage of the first compute element 600-*c*1. In some alternative embodiments, the first compute element 600-*c*1 derives the server location of a third needed data value 600-*c*1-*der*-*s*3 before it processes the first needed data value 600-*c*1-*pro*-*v*1, in which case the second period 698 is between 618-*get*1 and 600-*c*1-*der*-*s*3 and the third period 697 is immediately after 600-*c*1-*pro*-*v*1.

Figure 11E:
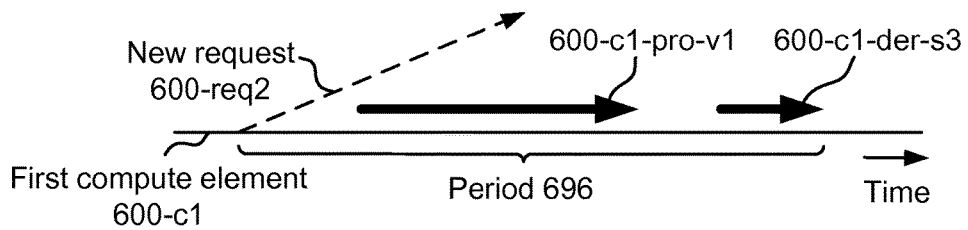
FIG. 11E illustrates one embodiment of a system configured to increase the utilization rate of a first compute element.

FIG. 11E illustrates one embodiment of a system configured to increase the utilization rate of a first compute element. In some embodiments, a first compute element 600-*c*1 is dedicated to the four general tasks described with respect to FIG. 11C above. In the specific embodiment illustrated in FIG. 11E, a first compute element 600-*c*1 is operating over time. After sending a new request for a second needed data value 600-*req*2, the first compute element 600-*c*1 processes the first needed data value 600-*c*1-*pro*-*v*1 and derives the server location of a third needed data value 600-*c*1-*der*-*s*3, either in the order shown in FIG. 11E, or by deriving the third needed data value 600-*c*1-*der*-*s*3 prior to processing the first needed data value 600-*c*1-*pro*-*v*1, or by performing both operations in a parallel manner. The duration of time during which the first compute element 600-*c*1 both processes the first needed data value 600-*c*1-*pro*-*v*1 and derives the server location of the third needed data value 600-*c*1-*der*-*s*3, in whatever chronological order, is period 696. In one embodiment, as a result of one or more of the dedication of the first compute element 600-*c*1 to the four general tasks, and/or the simultaneous operation of the first compute element 600-*c*1 and the second server 618*b* as illustrated and described in FIG. 11C, and/or of the operation of the cache memory in receiving some of the data values as illustrated and described in FIG. 11A, the first compute element 600-*c*1 consumes at least 50 (fifty) percent of the time during period 696 performing the two tasks 600-*c*1-*pro*-*v*1 and 600-*c*1-*der*-*s*3. This is a relatively high computational duty-cycle, and it allows the first compute element 600-*c*1 to process a plurality of keys, 618-*k*1, 618-*k*2, 618-*k*3 from FIG. 11A, and a plurality of values, 618-*v*1, 618-*v*2, 618-*v*3, from FIG. 11A, at an increased and relatively high rate, thus enhancing the relative efficiency of the first compute element 600-*c*1.

Figure 11F:
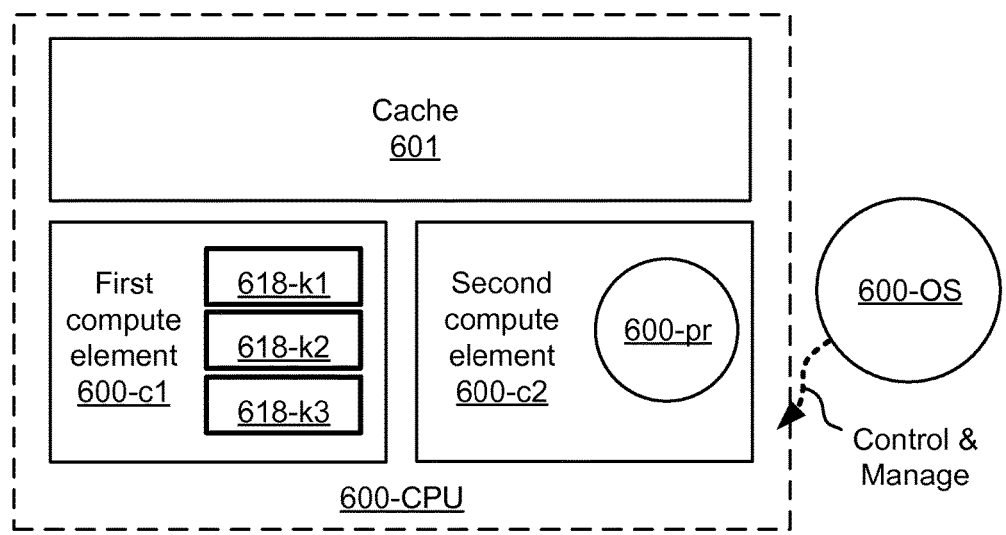
FIG. 11F illustrates one embodiment of a system configured to achieve a relatively high computational duty-cycle by at least temporarily blocking or redirecting the execution of certain processes.

FIG. 11F illustrates one embodiment of a system configured to achieve a relatively high computational duty-cycle by at least temporarily blocking or redirecting the execution of certain processes. In FIG. 11F, there is a central-processing-unit (CPU) 600-CPU that includes at least a cache memory 601, a first compute element 600-*c*1, and a second compute element 600-*c*2. The first compute element 600-*c*1 includes a plurality of keys, 618-*k*1, 618-*k*2, 618-*k*3, each of which is associated with a corresponding data value stored in a server (such data values and servers not shown in FIG. 11F). The first compute element 600-*c*1 executes the general tasks illustrated and described in FIG. 11C. The second compute element 600-*c*2 executes certain processes that are unrelated 600-*pr* to the general tasks executed by the first compute element 600-*c*1. The system includes also an operating system 600-OS configured to control and manage the first 600-*c*1 and second 600-*c*2 compute elements. The operating system 600-OS is further configured to manage the general tasks executed by the first compute element 600-*c*1 and the unrelated processes 600-*pr* that are executed by the second compute element 600-*c*2. The operating system 600-OS is further configured to help achieve dedication of the first compute element 600-*c*1 to the general tasks by blocking the unrelated processes 600-*pr* from running on the first compute element 600-*c*1, or by causing the unrelated processes 600-*pr* to run on the second compute element 600-*c*2, or both blocking or directing to the second compute element 600-*c*2 depending on the specific process, or on the time constraints, or upon the system characteristics at a particular point in time.

In one embodiment, at least part of cache memory 601 is dedicated for usage by only the first compute element 600-*c*1 in conjunction with execution of the general tasks illustrated and described in FIG. 11C, thus ensuring performance and timing in accordance with some embodiments.

It will be understood that the particular embodiment illustrated in FIG. 11F is only one of multiple possible embodiments. In some alternative embodiments, there is only a single compute element, but some of its sub-structures are dedicated to the general tasks illustrated and described in FIG. 11C, whereas other of its sub-structures executed unrelated processes. In some alternative embodiments, there are two compute elements, in which some sub-structures of a first compute element 600-*c*1 are dedicated to general tasks while others execute unrelated tasks, and similarly some sub-structures of a second compute element 600-*c*2 are dedicated to general tasks while others execute unrelated tasks. In some alternative embodiments, different sub-structures within a compute element are either dedicated to general tasks or execute unrelated processes, but the status of a particular sub-structure will change over time depending on system characteristics, processing demands, and other factors, provided that every instant of time there are some sub-structures that perform only general tasks while other sub-structures execute only unrelated processes.

One embodiment is a system 600 operative to efficiently use a compute element to process a plurality of values distributed over a plurality of servers using a plurality of keys, including a first compute element 600-*c*1 associated with a first cache memory 601, and a distributed key-value-store (KVS) 621 including a plurality of servers 618*a*, 618*b*, 618*c* configured to store a plurality of values 618-*v*1, 618-*v*2, 618-*v*3 associated with a plurality of keys 618-*k*1, 618-*k*2, 618-*k*3, in which the plurality of servers is communicatively connected with said first cache memory 601 via a switching network 650. Further, the system is configured to send, from the first compute element 600-*c*1, to a second 618*b* of the plurality of servers identified 600-*c*1-*der*-*s*2 using a second 618-*k*2 plurality of keys, via said switching network 650, a new request 600-*req*2 to receive a second 618-*v*2 of the plurality of values associated with the second key 618-*k*2. Further, the system is configured to receive 618-*get*1, via said switching network 650, from a first 618*a* of said plurality of servers, into said first cache memory 601, a first 618-*v*1 of said plurality of values previously requested. Further, after completion of the operations just described, the system is further configured to process 600-*c*1-*pro*-*v*1 in the first compute element 600-*c*1, in conjunction with the first cache memory 601, the first value 618-*v*1 received, simultaneously with the second server 618*b* and switching network 650 handling the new request 600-*req*2. The system is further configured to derive 600-*c*1-*der*-*s*3, in the first compute element 600-*c*1, from a third 618-*k*3 plurality of keys, during a first period 699 prior to receiving 618-*get*2 and processing 600-*c*1-*pro*-*v*2 the second value 618-*v*2, an identity of a third 618*c* of the plurality of servers into which to send a future request 600-*req*3 for a third 618-*v*3 of said plurality of values, thereby facilitating said efficient usage.

In one alternative embodiment to the system just described to efficiently use a compute element, the handling includes (i) propagation 600-*req*2-*prop* of the new request 600-*req*2 via the switching network 650, and (ii) executing 600-*req*2-*exe* the new request 600-*req*2 by the second server 618*b*.

In one possible configuration of the alternative embodiment just described, (i) the propagation 600-*req*2-*prop* takes between 150 to 2,000 nanoseconds, (ii) the executing 600-*req*2-*exe* of the new request 600-*req*2 takes between 200 and 2,500 nanoseconds, and (iii) the processing 600-*c*1-*pro*-*v*1 takes between 500 and 5,000 nanoseconds. In this way, the processing 600-*c*1-*pro*-*v*1 may extends over a period that is similar in magnitude to the handling, thereby making said simultaneity possibly more critical for achieving the efficient usage. In one possible embodiment of the possible configuration described herein, the distributed key-value-store 621 is a shared memory pool 512 that includes a plurality of memory modules 540-*m*1, 540-*m*2, 540-*mk*, wherein each of the plurality of servers 618*a*, 618*b*, 618*c* is associated with at least one of said plurality of memory modules 540-*m*1, 540-*m*2, 540-*mk*, and wherein the plurality of values 618-*v*1, 618-*v*2, 618-*v*3 are stored in the plurality of memory modules 540-*m*1, 540-*m*2, 540-*mk*.

In possible variation of the possible configuration described above, the plurality of memory modules 540-*m*1, 540-*m*2, 540-*mk* are based on random-access-memory, thereby facilitating the executing 600-*req*2-*exe* of the new request 600-*req*2 taking between 200 and 2,500 nanoseconds. This possible variation may be implemented whether or not the distributed key-value-store 621 is a shared memory pool 512.

In a second alternative embodiment to the system described above to efficiently use a compute element to process a plurality of values distributed over a plurality of servers using a plurality of keys, the system 600 is further configured to dedicate the first compute element 600-*c*1 for: (i) sending any one of the requests 600-*req*2, 600-*req*3 to receive respectively any one of the plurality of values 618-*v*2, 618-*v*3, (ii) processing 600-*c*1-*pro*-*v*1, 600-*c*1-*pro*-*v*2 any one of the plurality of values 618-*v*1, 618-*v*2, and (iii) deriving 600-*c*1-*der*-*s*2, 600-*c*1-*der*-*s*3 identities of any one of the plurality of servers 618*b*, 618*c* using respectively any one of the plurality of keys 618-*k*2, 618-*k*3. In this way, there are minimized at least: (i) a second period 698 between the receiving 618-*get*1 and the processing 600-*c*1-*pro*-*v*1, and (ii) a third period 697 between the processing 600-*c*1-*pro*-*v*1 and the deriving 600-*c*1-*der*-*s*3. This minimization of (i) and (ii) facilitates the efficient usage of a compute element 600-*c*1.

In a first variation to the second alternative embodiment described above, The system further includes a second compute element 600-*c*2, together with the first compute element 600-*c*1 belonging to a first central-processing-unit (CPU) 600-CPU, and an operating-system (OS) 600-OS configured to control and manage the first 600-*c*1 and second 600-*c*2 compute element, wherein the operating-system 600-OS is further configured to manage a plurality of processes comprising: (i) said sending 600-*req*2, receiving 618-*get*1, processing 600-*c*1-*pro*-*v*1, and deriving 600-*c*1-*der*-*s*3, and (ii) other unrelated processes 600-*pr*. Also, the operating-system 600-OS is further configured to achieve the dedication by blocking the other unrelated processes 600-*pr* from running on said first compute element 600-*c*1, and by causing the other unrelated processes 600-*pr* to run on the second compute element 600-*c*2.

In a second variation to the second alternative embodiment described above, as a result of the dedication, the simultaneity, and the first cache memory 601, the derivation 600-*c*1-*der*-*s*3 and the processing 600-*c*1-*pro*-*v*1 together account for at least 50 (fifty) per-cent of time spent by the first compute element 600-*c*1 over a period 696 extending from a beginning of said sending 600-*req*2 to an end of said deriving 600-*c*1-*der*-*s*3. This utilization rate thereby achieves a high computational duty-cycle, which thereby allows the first compute element 600-*c*1 to process the plurality of keys 618-*k*1, 618-*k*2, 618-*k*3 and values 618-*v*1, 618-*v*2, 618-*v*3 at an increased rate.

In a first configuration to the second variation to the second alternative embodiment, described above, further the period 696 extending from the beginning of the sending to the end of the deriving, is less than 10 (ten) microseconds.

In a second configuration to the second variation to the second alternative embodiment, described above, further the increased rate facilitates a sustained transaction rate of at least 100,000 (one hundred thousand) of the plurality of keys and values per second.

In a third alternative embodiment to the system described above to efficiently use a compute element to process a plurality of values distributed over a plurality of servers using a plurality of keys, further the derivation is done by applying on the third key 618-$k$3 a technique selected from a group consisting of: (i) hashing, (ii) table-based mapping, and (iii) any mapping technique either analytical or using look-up tables.

In a fourth alternative embodiment to the system described above to efficiently use a compute element to process a plurality of values distributed over a plurality of servers using a plurality of keys, further the first compute element 600-$c$1 and the first cache memory 601 belong to a first central-processing-unit (CPU) 600-CPU, such that the first compute element 600-$c$1 has a high bandwidth access to the first cache memory 601, thereby allowing the processing 600-$c$1-$pro$-$v$1 to conclude in less than 5 (five) microseconds.

In one possible configuration of the fourth alternative embodiment just described, the high bandwidth is more than 100 (one hundred) Giga-bits-per-second.

In a fifth alternative embodiment to the system described above to efficiently use a compute element to process a plurality of values distributed over a plurality of servers using a plurality of keys, the system further comprises a direct-memory-access (DMA) controller 677 configured to receive 618-get1 the first value 618-$v$1 via the switching network 650 directly into the first cache memory 601.

In one a variation of the fifth alternative embodiment just described, further the direct-memory-access controller 677 frees the first compute element 600-$c$1 to perform the identification 600-$c$1-$der$-$s$2 of the second server 618$b$ simultaneously with the receiving 618-get1 of the first value 618-$v$1. In this way, the efficient usage is facilitated.

In a sixth alternative embodiment to the system described above to efficiently use a compute element to process a plurality of values distributed over a plurality of servers using a plurality of keys, the system 600 is further configured to send to the third 618$c$ of the plurality of servers identified, via said switching network 650, the future request 600-$req$3 to receive the third value 618-$v$3, and to receive 618-get2, via the switching network 650, from the second server 618$b$, into the first cache memory 601, the second value 618-$v$2. The system is also configured, after completion of the send and receive operations just described, to process 600-$c$1-$pro$-$v$2 the second value 618-$v$2 received, simultaneously with the third server 618$c$ and switching network 650 handling of the future request 600-$req$3.

In a seventh alternative embodiment to the system described above to efficiently use a compute element to process a plurality of values distributed over a plurality of servers using a plurality of keys, system 600 further comprises a network-interface-card (NIC) 667 configured to associate the first compute element 600-$c$1 and the first cache memory 601 to the said switching network 650. Also, the network-interface-card 667 is further configured to block or delay any communication currently preventing the network-interface-card 667 from immediately performing the sending 600-$req$2, thereby preventing the first compute element 600-$c$1 from waiting before performing said sending, thereby facilitating the efficient usage of the first compute element 600-$c$1.

In an eighth alternative embodiment to the system described above to efficiently use a compute element to process a plurality of values distributed over a plurality of servers using a plurality of keys, further the deriving 600-$c$1-$der$-$s$3 is done simultaneously with the second server 618$b$ and the switching network 650 handling of the new request 600-$req$2.

In a ninth alternative embodiment to the system described above to efficiently use a compute element to process a plurality of values distributed over a plurality of servers using a plurality of keys, the system 600 further comprises a direct-memory-access (DMA) controller 677 configured to receive 618-get2 the second value 618-$v$2 via the switching network 650 directly into the first cache memory 601, wherein the direct-memory-access controller 677 frees the first compute element 600-$c$1 to perform the processing 600-$c$1-$pro$-$v$1 simultaneously with the receiving 618-get2 of the second value 618-$v$2. The operation described in this ninth alternative embodiment thereby facilitates efficient usage of the first compute element 600-$c$1.

In the various system embodiment described above, the processing 600-$c$1-$pro$-$v$1 is depicted as occurring before the deriving 600-$c$1-$der$-$s$3. However, this particular order of events is not required. In various alternative embodiments, the deriving 600-$c$1-$der$-$s$3 occurs before the processing 600-$c$1-$pro$-$v$1. Also, in different alternative embodiments, the deriving 600-$c$1-$der$-$s$3 occurs in parallel with the processing 600-$c$1-$pro$-$v$1.

Figure 12:
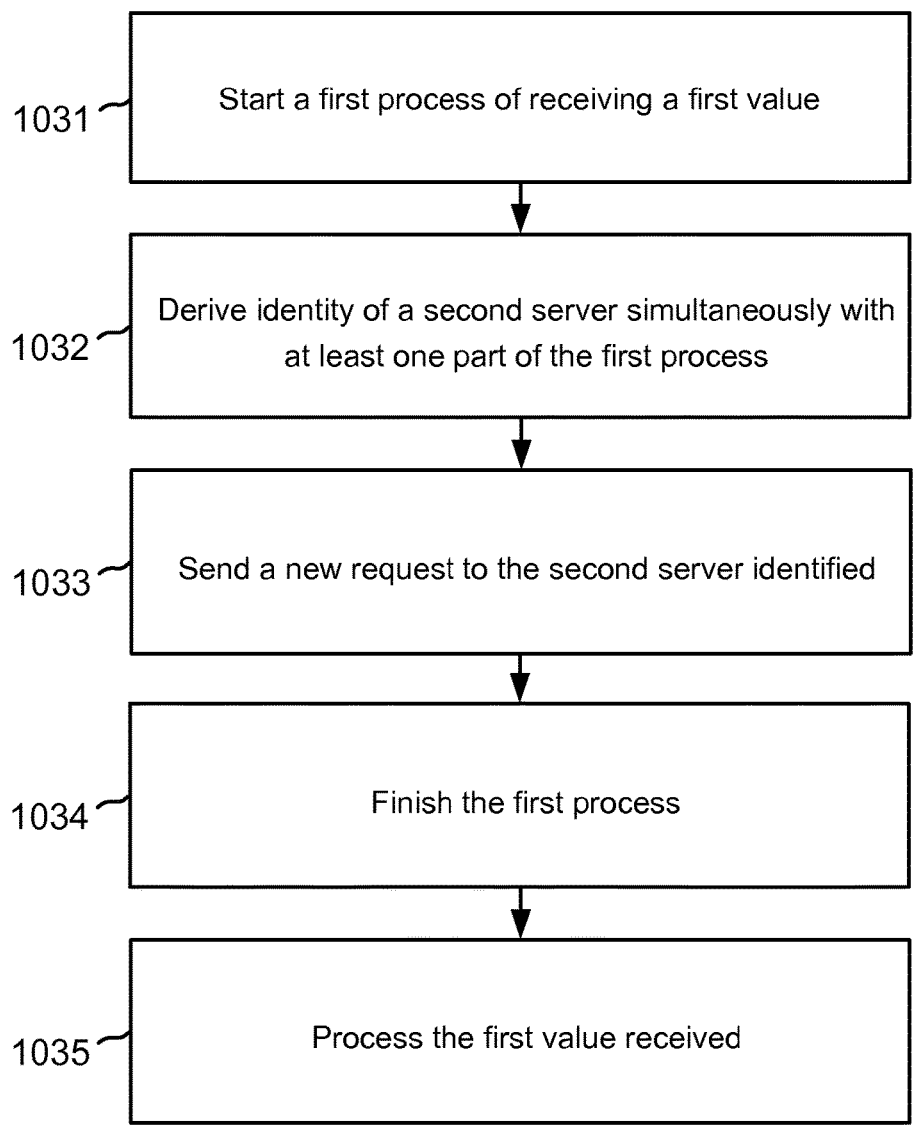
FIG. 12 illustrates one embodiment of a method for mixing and timing, relatively efficiently, at least two key-value transactions in conjunction with a distributed key-value-store (KVS)

FIG. 12 illustrates one embodiment of a method for mixing and timing, relatively efficiently, at least two key-value transactions in conjunction with a distributed key-value-store (KVS) 621. In step 1031: a direct-memory-access (DMA) controller 677, starts a first process of receiving 618-get1 via a switching network 650, from a first 618$a$ of a plurality of servers 618$a$, 618$b$, 618$c$ directly into a first cache memory 601 associated with a first compute element 600-$c$1, a first 618-$v$1 of a plurality of values 618-$v$1, 618-$v$2, 618-$v$3 previously requested and associated with a first 618-$k$1 of a plurality of keys 618-$k$1, 618-$k$2, 618-$k$3. In step 1032: a first compute element 600-$c$1 derives 600-$c$1-$der$-$s$2 from a second 618-$k$2 of the plurality of keys, simultaneously with at least one part of the first process, an identity of a second 618$b$ of the plurality of servers into which to send a new request 600-$req$2 for a second 618-$v$2 of said plurality of values. In step 1033: the first compute element 600-$c$1 sends, via the switching network 650, to the second server 618$b$ identified, the new request 600-$req$2. In step 1034: the direct-memory-access controller 677 finishes the first process of receiving 618-get1 the requested data element. In step 1035: the first compute element 600-$c$1 processes 600-$c$1-$pro$-$v$1 the first value 618-$v$1 received, simultaneously with the second server 618$b$ and the switching network 650 handling the new request 600-$req$2.

In a first alternative embodiment to the method just described, further the first compute element 600-$c$1 derives 600-$c$1-$der$-$s$3 from a third of the plurality of keys 618-$k$3, during a first period 699 prior to receiving 618-get2 and processing 600-$c$1-$pro$-$v$2 the second value 618-$v$2, an identity of a third 618$c$ of the plurality of servers into which to send a future request 600-$req$3 for a third 618-$v$3 of the plurality values.

Figure 13A:
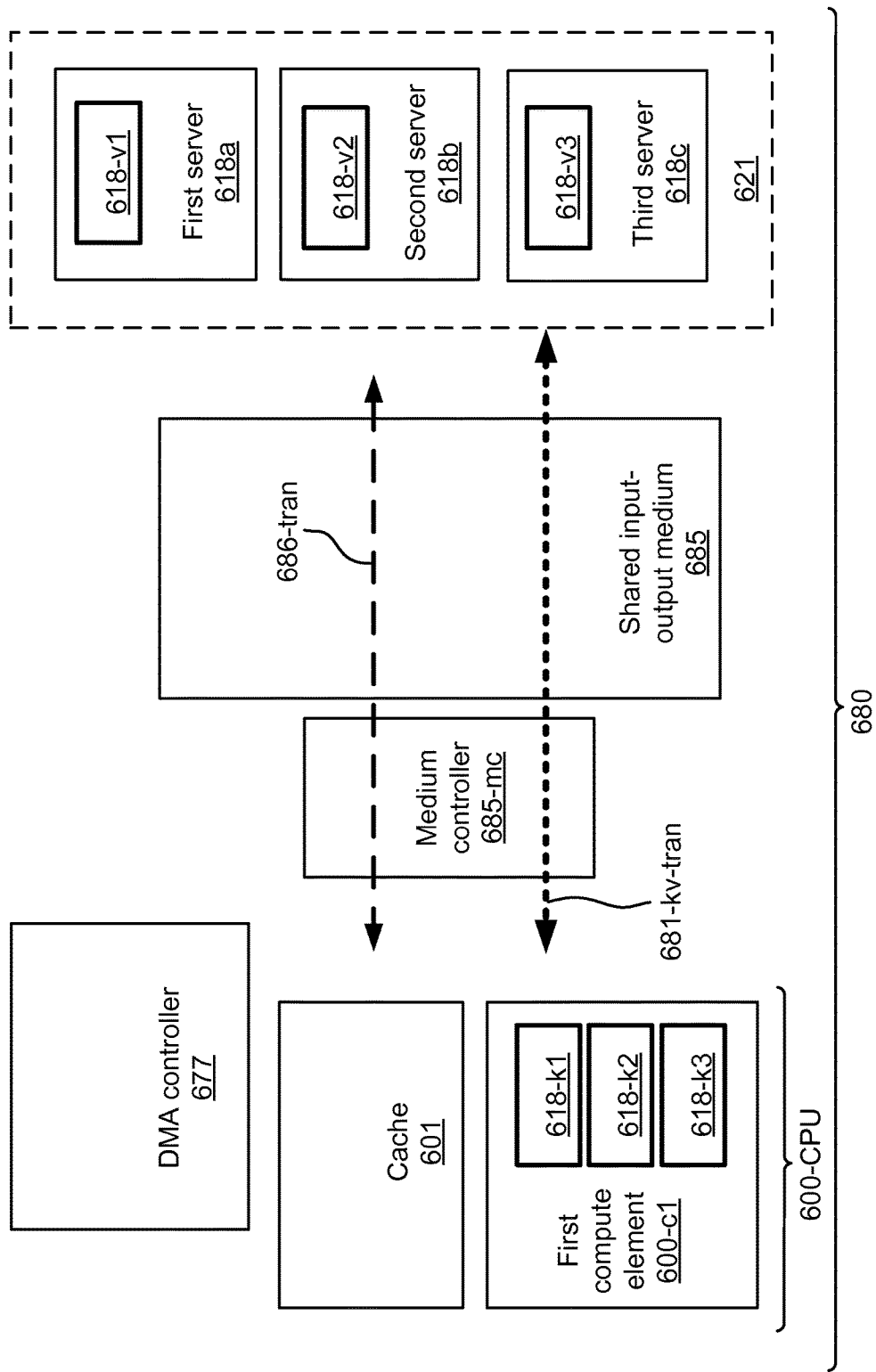
FIG. 13A illustrates one embodiment of a system configured to interleave high priority key-value transactions together with lower priority transactions over a shared input-output medium.

FIG. 13A illustrates one embodiment of a system 680 configured to interleave high priority key-value transactions 681-$kv$-$tran$ together with lower priority transactions 686-$tran$ over a shared input-output medium 685. The system 680 includes a plurality of values 618-$v$1, 618-$v$2, 618-$v$3, distributed over a plurality of servers 618$a$, 618$b$, 618$c$, using a plurality of keys 618-$k$1, 618-$k$2, 618-$k$3. The system 680 includes a cache memory 601, and a first compute element 600-*c*1 associated with and in communicative contact with the cache memory 601. The first compute element 600-*c*1 includes two or more keys, 618-*k*1, 618-*k*2, 618-*k*3, where each key is associated with a respective data value, 618-*k*1 with 618-*v*1, 618-*k*2 with 618-*v*2, and 618-*k*3 with 618-*v*3. The data values are stored in multiple servers. In FIG. 13A, 618-*v*1 is stored in first server 618*a*, 618-*v*2 is stored in second server 618*b*, and 618-*v*3 is stored in third server 618*c*. It will be understood, however, that two or more specific data values may be served in a single server, although the entire system 680 includes two or more servers. The servers as a whole are a server stack that is referenced herein as a distributed key-value-store (KVS) 621.

The first compute element 600-*c*1 and the distributed KVS 621 are in communicative contact through a shared input-output medium 685 and a medium controller 685-*mc*, which together handle requests for data values from the first compute element 600-*c*1 to the KVS 621, and which handle also data values sent from the KVS 621 to either the first compute element 600-*c*1 or to the cache memory 601. In some embodiments, the system 680 includes also a direct-memory-access (DMA) controller 677, which receives data values from the shared input-output medium 685 and medium controller 685-*mc*, and which may pass such data values directly to the cache memory 601 rather than to the first compute element 600-*c*1, thereby at least temporarily freeing the first compute element 600-*c*1.

In some embodiments illustrated in FIG. 13A, the KVS 621 is a shared memory pool 512 from FIG. 10B, which includes multiple memory modules 540-*m*1, 540-*m*2, 540-*mk*, and wherein one of the memory modules is configured to store the first value 618-*v*1. In some embodiments, the multiple memory modules 540-*m*1, 540-*m*2, 540-*mk*, are based on random-access-memory, thereby facilitating fast extraction of at least the desired value 618-*v*1. In some embodiments, "fast extraction" can be executed in less than 3 (three) microseconds. In some embodiments, the blocking of lower priority transactions 686-*tran* enables sending of the new request 600-*req*2 from FIGS. 11B and 11C in less than 3 (three) microseconds, thereby matching timing of the extraction, and consequently thereby facilitating overall fast key-value transactions 618-*kv-tran*, each such fast transaction taking less than 10 (ten) microseconds.

FIG. 13B illustrates one embodiment of a system configured to interleave high priority key-value transactions 681-*kv-tran* together with lower priority transactions 686-*tran* over a shared input-output medium, in which both types of transactions are packet-based transactions and the system is configured to stop packets of the lower priority transactions 686-*tran* in order to commence communication of packets of the high priority transactions 681-*kv-tran*. In FIG. 13B, the first transaction processed by the system is one of a plurality of low priority transactions 686-*tran*, including packets P1, P2, and Pn at the top of FIG. 13B, and the second transaction processed by the system is one of a plurality of high priority key-value transactions 681-*kv-tran*, including packets P1, P2, and Pn at the bottom of FIG. 13B. In the particular embodiment illustrated in FIG. 13B, all of the transactions are packet-based transactions, and they are performed via a medium controller in the system 685-*mc* from FIG. 13A in conjunction with a shared input-output medium 685 from FIG. 13A. The medium controller 685-*mc* is configured to stop 686-stop the on-going communication of a first packet 686-*tran*-first-P belonging to one of the lower priority transactions 686-*tran*, and immediately thereafter to commence communication of a second packet 681-*kv*-second-P belonging to one of the high priority key-value transactions 681-*kv-tran*. After the second packet 681-*kv-tran*-second-P has been communicated, the medium controller 685-*mc* is configured to resume 686-resume communication of the first packet 686-*tran*-first-P.

FIG. 13C illustrates one embodiment of part of a system configured to interleave high priority key-value transactions 681-*kv-tran* together with lower priority transactions 686-*tran* over a shared input-output medium, comprising a network-interface-card (NIC) 685-NIC including a medium-access-controller (MAC) 685-*mac*. In FIG. 13C, a shared input-output medium 685 from FIG. 13A is a network-interface-card 685-NIC together with a medium-access-controller (MAC) 685-*mac* that is located on the network-interface-card (NIC) 685-NIC. The elements shown help communicate both high priority key-value transactions 681-*kv-tran* and lower priority transactions 686-*tran*, either of which may be communicated either (i) from a KVS 621 to a cache 601 or first compute element 600-*c*1, or (ii) from a cache 601 or first compute element 600-*c*1 to a KVS 621. The lower priority transactions 686-*tran* are not necessarily related to KVS 621, and may be, as an example, a general network communication unrelated with keys or values.

One embodiment is a system 680 configured to interleave high priority key-value transactions 681-*kv-tran* together with lower priority transactions 686-*tran* over a shared input-output medium 685, including a shared input-output medium 685 associated with a medium controller 685-*mc*, a central-processing-unit (CPU) 600-CPU including a first compute element 600-*c*1 and a first cache memory 601, and a key-value-store (KVS) 621 communicatively connected with the central-processing-unit 600-CPU via the shared input-output medium 685. Further, the central-processing-unit 600-CPU is configured to initiate high priority key-value transactions 681-*kv-tran* in conjunction with the key-value-store (KVS) 621 said shared input-output medium 685, and the medium controller 685-*mc* is configured to block lower priority transactions 686-*tran* via the shared input-output medium 685 during at least parts of the high priority key-value transactions 681-*kv-tran*, thereby achieving the interleaving without delaying the high priority key-value transactions 681-*kv-tran*.

In one alternative to the system 680 to interleave transactions, further the key-value-store (KVS) 621 is configured to store a first value 618-*v*1 associated with a first key 618-*k*1. Further, the high priority key-value transactions 681-*kv-tran* include at least a new request 600-*req*2 from FIGS. 11B and 11C for the first value 618-*v*1, wherein the new request 600-*req*2 is sent from the first compute element 600-*c*1 to the key-value-store 621 via the shared input-output medium 685, and the new request 600-*req*2 conveys the first key 618-*k*1 to the key-value-store 621.

In some embodiments, the key-value-store (KVS) 621 is a distributed key-value-store, including a plurality of servers 618*a*, 618*b*, 618*c*. In some forms of these embodiments, the distributed key-value-store is a shared memory pool 512 including a plurality of memory modules 540-*m*1, 540-*m*2, 540-*mk*, wherein one of the plurality of memory modules is configured to store the first value 618-*v*1. In some forms of these embodiments, the plurality of memory modules 540-*m*1, 540-*m*2, 540-*mk* are based on random-access-memory, thereby facilitating fast extraction of at least the first value 618-*v*1. In some forms of these embodiments, "fast extraction" is done in less than 3 (three) microseconds. In some forms of these embodiments, the blocking of lower priority transactions 686-*tran* enables sending of the new request in less than 3 (three) microseconds, thereby matching timing of the extraction, thereby consequently facilitating overall fast key-value transactions, each transaction taking less than 10 (ten) micro second.

In a second alternative to the system 680 to interleave transactions, further the high priority key-value transactions 681-*kv-tran* are latency-critical key-value transactions, and the medium controller 685-*mc* is configured to interrupt any of the lower priority transactions 686-*tran* and immediately commence at least one of the high priority key-value transactions 681-*kv-tran*, thereby facilitating said latency criticality.

In one possible configuration of the second alternative embodiment just described, further both the high priority key-value transaction 681-*kv-tran* and the lower priority transactions 686-*tran* are packet-based transactions performed via the medium controller 685-*mc* in conjunction with the shared input-output medium 685. Further, the medium controller 685-*mc* is configured to stop 686-stop on-going communication of a first packet 686-*tran*-first-P belonging to the lower priority transactions 686-*tran* via the shared input-output medium 685, and immediately to commence communication of a second packet 681-*kv-tran*-second-P belonging to the high priority key-value transaction 681-*kv-tran* via the shared input-output medium 685 instead, thereby achieving the communication interruption at the packet level.

In one possible variation of the configuration just described, the medium controller 685-*mc* is configured to resume 686-resume communication of the first packet 686-*tran*-first-P after the second packet 681-*kv-tran*-second-P has finished communicating, thereby facilitating packet fragmentation.

In a third alternative to the system 680 to interleave transactions, further the shared input-output medium is based on an interconnect element selected from a group consisting of: (i) peripheral-component-interconnect-express (PCIE) computer expansion bus 105-*pcie* from FIG. 3A, (ii) Ethernet 105-*eth* from FIG. 3B, and (iii) a network-interface-card (NIC) 685-NIC.

In some embodiments associated with the PCIE computer expansion bus 105-pcie from FIG. 3A, the medium controller 685-*mc* may be implemented as part of a root-complex 105-root from FIG. 3A associated with the PCIE computer expansion bus 105-pcie.

In some embodiments associated with the Ethernet 105-*eth* from FIG. 3B, the medium controller 685-*mc* may be implemented as part of a media-access-controller (MAC) 105-*mac* from FIG. 3B associated with the Ethernet 105-*eth*.

In some embodiments associated with the NIC 685-NIC, the medium controller 685-*mc* may be implemented as part of a media-access-controller (MAC) 685-*mac* associated with the NIC 685-NIC. In some forms of these embodiments, the NIC 685-NIC is in compliance with Ethernet.

In a fourth alternative to the system 680 to interleave transactions, further both the high priority key-value transactions 681-*kv-tran* and the lower priority transactions 686-*tran* are packet-based transactions performed via the medium controller 685-*mc* in conjunction with the shared input-output medium 685. Further, the medium controller 685-*mc* is configured to deny access to the shared input-output medium 685 from a first packet 686-*tran*-first-P belonging to the lower priority transactions 686-*tran*, and instead grant access to the shared input-output medium 685 to a second packet 681-*kv-tran*-second-P belonging to the high priority key-value transactions 681-*kv-tran*, thereby giving higher priority to the high priority key-value transactions 681-*kv-tran* over the lower priority transactions 686-*tran*.

In a fifth alternative to the system 680 to interleave transactions, further the key-value-store 621 is configured to store a first value 618-*v*1 associated with a first key 618-*k*1. Further, the high priority key-value transactions 681-*kv-tran* include at least sending of the first value 618-*v*1 from the key-value-store (KVS) 621 to the central-processing-unit 600-CPU via the shared input-output medium 685.

In one possible configuration of the fifth alternative just described, the system includes further a direct-memory-access (DMA) controller 677 configured to receive the first value 618-*v*1 via the shared input-output medium 685 directly into the first cache memory 601.

In a sixth alternative embodiment to the system 680 to interleave transactions, further the shared input-output medium 685 includes an electro-optical interface 107-*a* from FIG. 5A and an optical fiber 107-fiber-ab from FIG. 5A which are operative to transport the high priority key-value transactions 681-*kv-tran* and the lower priority transactions 686-*tran*.

Figure 14A:
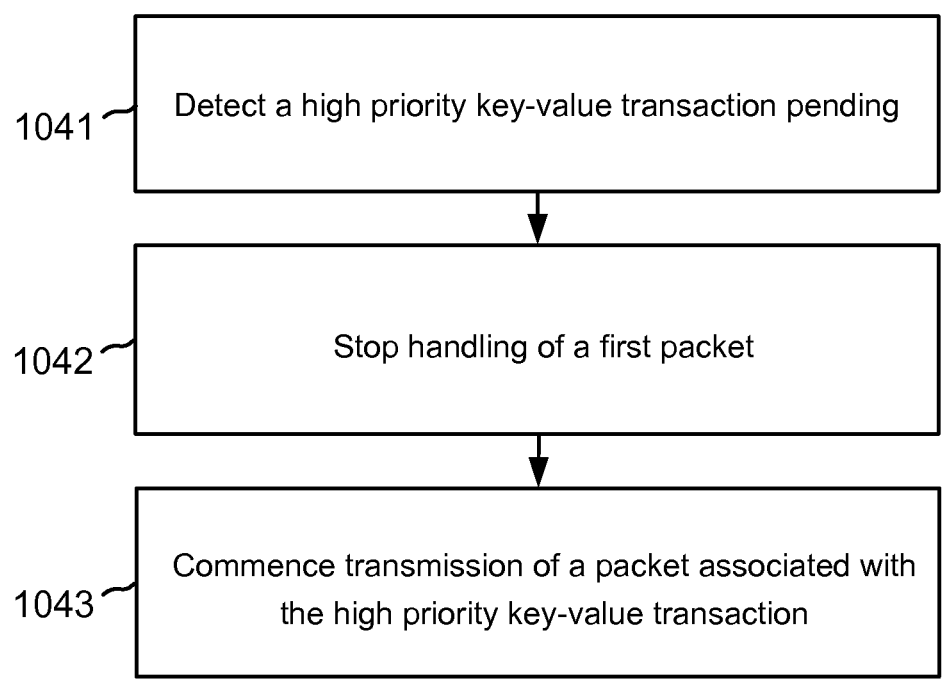
FIG. 14A illustrates one embodiment of a method for mixing high priority key-value transaction together with lower priority transactions over a shared input-output medium without adversely affecting performance.

FIG. 14A illustrates one embodiment of a method for mixing high priority key-value transactions 681-*kv-tran* over a shared input-output medium 685, together with lower priority transactions 686-*tran* over the same shared input-output medium 685, without adversely affecting system performance. In step 1041, a medium controller 685-*mc* associated with a shared input-output medium 685 detects that a second packet 681-*kv-tran*-second-P associated with high priority key-value transactions 681-*kv-tran* is pending; meaning, as an example, that the second packet 681-*kv-tran*-second-P has been recently placed in a transmission queue associated with the input-output medium 685.

In step 1042, as a result of the detection, the medium controller 685-*mc* stops handling of a first packet 686-*tran*-first-P associated with a lower priority transactions 686-*tran* via the shared input-output medium 685. In step 1043, the medium controller 685-*mc* commences transmission of the second packet 681-*kv-tran*-second-P via said shared input-output medium 685, thereby preventing the lower priority transactions 686-*tran* from delaying the high priority key-value transaction 681-*kv-tran*.

In a first alternative to the method just described for mixing high priority key-value transactions 681-*kv-tran* together with lower priority transactions 686-*tran*, further the prevention leads to a preservation of timing performance of the high priority key-value transactions 681-*kv-tran*, wherein such timing performance is selected from a group consisting of: (i) latency of the high priority key-value transactions 681-*kv-tran*, and (ii) bandwidth of the high priority key-value transactions 681-*kv-tran*.

In a second alternative to the method described for mixing high priority key-value transactions 681-*kv-tran* together with lower priority transactions 686-*tran*, further the prevention leads to a preservation of latency of the high priority key-value transactions 681-*kv-tran*, and as a result, such latency of the high priority key-value transactions 681-*kv-tran* is shorter than a time required to transmit a shortest packet belonging to said lower priority transactions 686-*tran*.

Figure 14B:
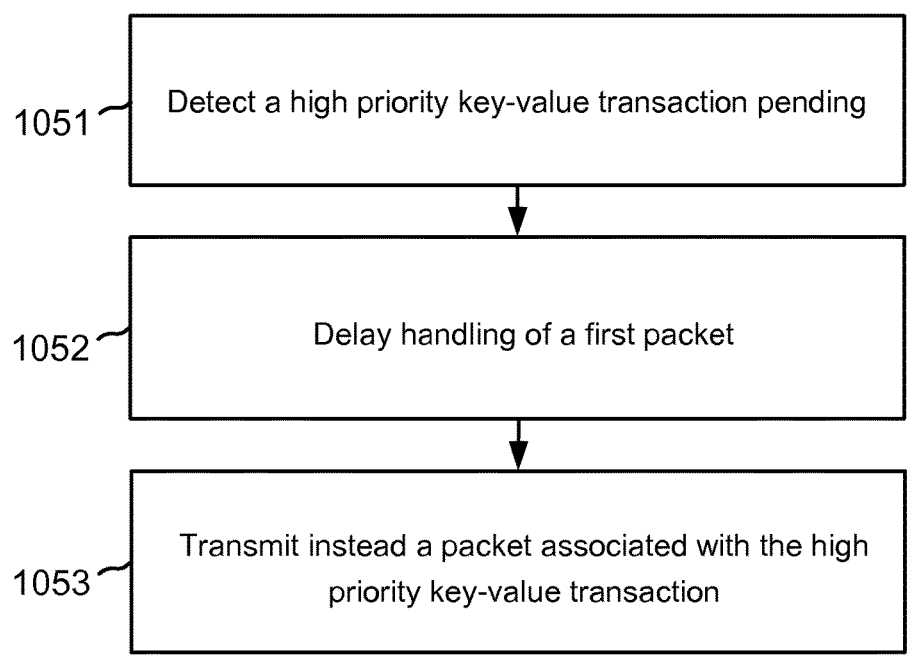
FIG. 14B illustrates one embodiment of a method for mixing high priority key-value transactions together with lower priority transactions over a shared input-output medium without adversely affecting performance.

FIG. 14B illustrates one embodiment of a method for mixing high priority key-value transactions 681-*kv-tran* over a shared input-output medium 685, together with lower priority transactions 686-*tran* over the same shared input-output medium 685, without adversely affecting system performance. In step 1051, a medium controller 685-*mc* associated with a shared input-output medium 685 detects that a second packet 681-*kv-tran*-second-P associated with high priority key-value transactions 681-*kv-tran* is pending. In step 1052, as a result of the detection, the medium controller 685-*mc* delays handling of a first packet 686-*tran*-first-P associated with a lower priority transactions 686-*tran* via the shared input-output medium 685. In step 1053, the medium controller 685-*mc* transmits the second packet 681-*kv-tran*-second-P via said shared input-output medium 685, thereby preventing the lower priority transactions 686-*tran* from delaying the high priority key-value transaction 681-*kv-tran*.

In a first alternative to the method just described for mixing high priority key-value transactions 681-*kv-tran* together with lower priority transactions 686-*tran*, further the prevention leads to a preservation of timing performance of the high priority key-value transactions 681-*kv-tran*, wherein such timing performance is selected from a group consisting of: (i) latency of the high priority key-value transactions 681-*kv-tran*, and (ii) bandwidth of the high priority key-value transactions 681-*kv-tran*.

In a second alternative to the method described for mixing high priority key-value transactions 681-*kv-tran* together with lower priority transactions 686-*tran*, further the prevention leads to a preservation of latency of the high priority key-value transactions 681-*kv-tran*, and as a result, such latency of the high priority key-value transactions 681-*kv-tran* is shorter than a time required to transmit a shortest packet belonging to lower priority transactions 686-*tran*.

Figure 14C:
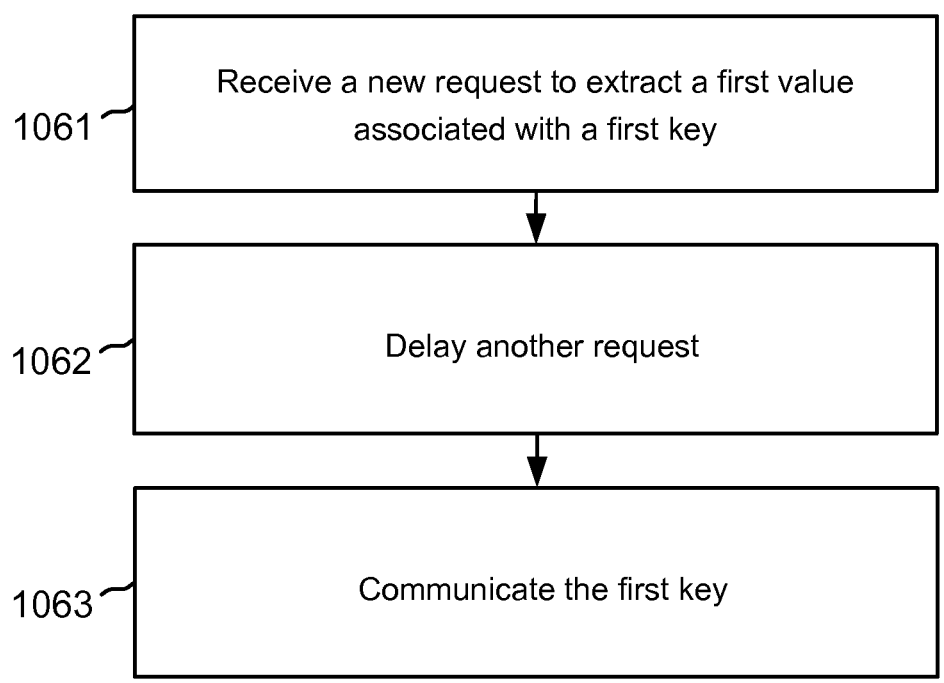
FIG. 14C illustrates one embodiment of a method for reducing latency associated with a key-value transaction involving a distributed data store interconnected by a network.

FIG. 14C illustrates one embodiment of a method for reducing latency associated with key-value transactions 686-*dv-tran* involving a distributed data store interconnected by a network. In step 1061, a first network-interface-card (NIC) 685-NIC receives, from a first compute element 600-*c1*, a new request 600-*req2* from FIGS. 11B and 11C to extract with high priority a first value 618-*v1* associated with a first key 618-*k1*. In step 1062, consequently the first network-interface-card 685-NIC delays a lower priority transaction 686-*tran* or other network-related activity that prevents or that might prevent, the first network-interface-card 685-NIC from immediately communicating the first key 618-*k1* to a destination server 618*a* storing the first value 618-*v1* and belonging to a key-value-store 621 comprising a plurality of servers 618*a*, 618*b*, 618*c*. In step 1063, as a result of such delaying, the first network-interface card 685-NIC communicates immediately the first key 618-*k1* to the destination server 618*a*, thereby allowing the destination server 618*a* to start immediately processing of the first key 618-*k1* as required for locating, within the destination server 618*a*, the first value 618-*v1* in conjunction with said new request 600-*req2*. It is understood that the phrase "lower priority transaction 686-*tran* or other network-related activity" includes the start of any lower priority transaction 686-*tran*, a specific packet in the middle of a lower priority transaction 686-*tran* which is delayed to allow communication of a high priority transaction 681-*kv-tran* or of any packet associated with a high priority transaction 681-*kv-tran*, and any other network activity that is not associated with the high priority transaction 681-*kv-tran* and that could delay or otherwise impede the communication of a high priority transaction 681-*kv-tran* or any packet associated with a high priority transaction 681-*kv-tran*.

In one embodiment, said delaying comprises prioritizing the new request 600-*req2* ahead of the lower priority transaction 686-*tran* or other network-related activity, such that lower priority transaction 686-*tran* or other network related activity starts only after the communicating of the first key 618-*k1*.

One embodiment is a system 680 (FIG. 13A) configured to facilitate low latency key-value transactions, including: a shared input-output medium 685 associated with a medium controller 685-*mc*; a central-processing-unit (CPU) 600-CPU; and a key-value-store 621 comprising a first data interface 523-1 (FIG. 10B) and a first memory module 540-*m1* (FIG. 10B), said first data interface is configured to find a first value 618-*v1* (FIG. 13A) in said first memory module and extract said first value from said first memory module using random access read cycles, and said key-value-store 621 is communicatively connected with said central-processing-unit 600-CPU via said shared input-output medium 685. In one embodiment, the central-processing-unit 600-CPU is configured to initiate a high priority key-value transaction 681-*kv-tran* (FIG. 13A) in conjunction with said key-value-store 621, by sending to said key-value-store, via said shared input-output medium 685, a new request 600-*req2* (FIG. 11C) for said first value 618-*v1*, said new request comprising a first key 618-*k1* associated with said first value and operative to facilitate said finding; and the medium controller 685-*mc* is configured to block lower priority transactions 686-*tran* via said shared input-output medium 685, thereby preventing said lower priority transactions from delaying said new request 600-*req2*, thereby allowing the system to minimize a time between said sending of the new request to said extraction of the first value 618-*v1*. In one embodiment, said prevention of delay and said random access read cycles together result in said minimization, such that said time between said sending of the new request 600-*req2* to said extraction of the first value 618-*v1* is kept below 5 (five) microseconds. In one embodiment, as a result from said minimization, said high priority key-value transaction 681-*kv-tran* results in the delivery of said first value 618-*v1* to said central-processing-unit 600-CPU in less than 10 (ten) microseconds from said initiation.

Figure 15A:
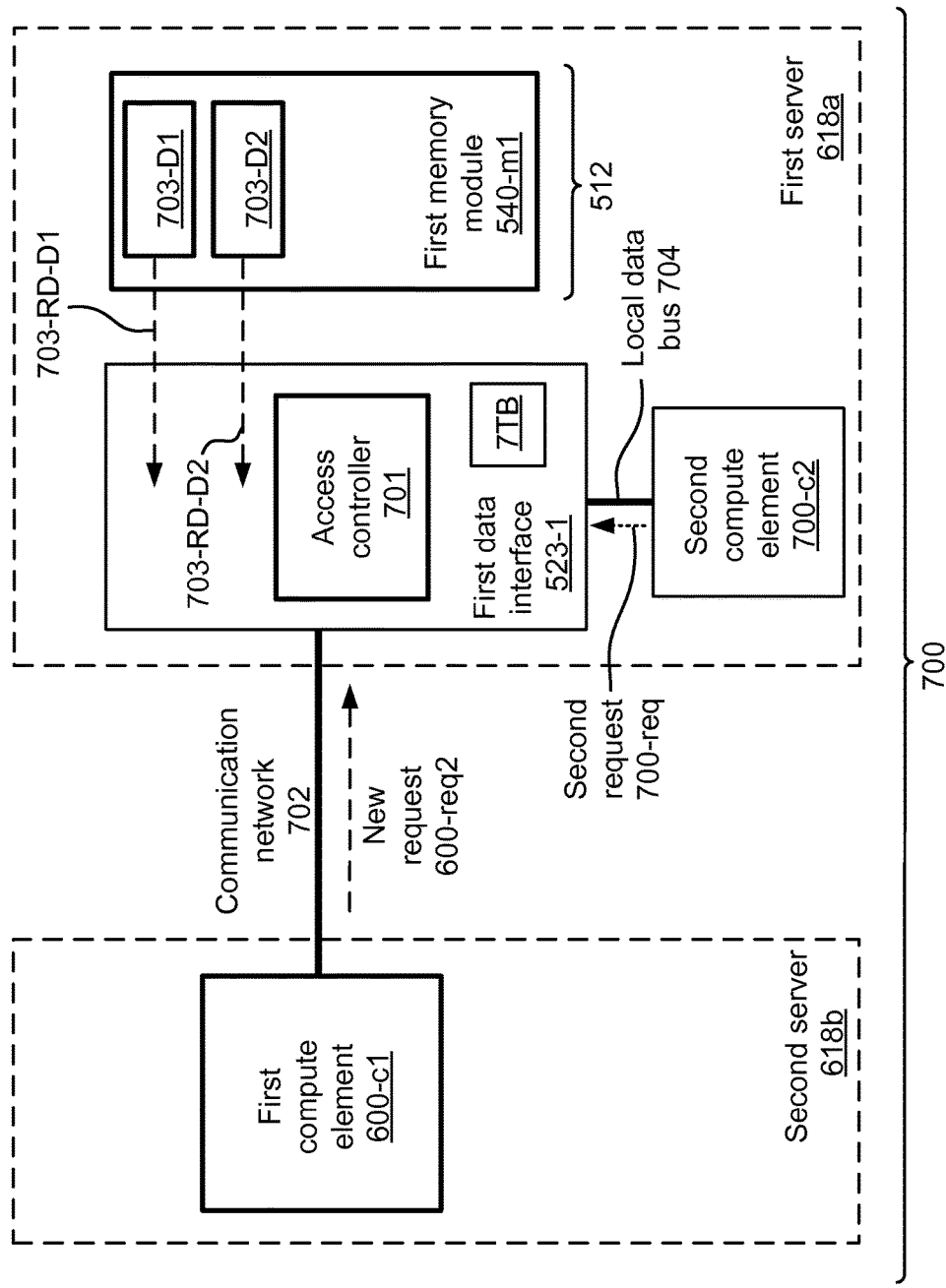
FIG. 15A illustrates one embodiment of a system operative to control random memory access in a shared memory pool.

FIG. 15A illustrates one embodiment of a system 700 configured to control random access memory in a shared memory pool 512. There is a first server 618*a*, which includes a first memory module 540-*m1*, a first data interface 523-1, and a second compute element 700-*c2*. The first memory module 540-*m1* includes various data sets which may be requested by a first compute element 600-*c1* located on a second server 618*b*. The first compute element 600-*c1* may request access 600-*req2* to a data set 703-D1 over a communication network 702 that is in communicative contact with the first server 618*a*, in which the request is sent to the first data interface 523-1. Simultaneously: (i) the first data interface 523-1 performs a first random access read cycle 703-RD-D1 in conjunction with the first memory module 540-*m1* to retrieve the requested first data set 703-D1, and (ii) the access controller 701 determines if the first compute element 600-*c1* is authorized to have access to the requested data set 703-D1, such that the determination does not delay the first random access read cycle 703-RD-D1. If the first compute element 600-*c1* is authorized to access the first data set 703-D1, then the first server 618*b* will provide the requested data set 703-D1 to the first compute element 600-*c1*. If the first compute element 600-*c1* is not authorized to receive the first data set 703-D1, then the access controller 701 will prevent delivery of the first data set 703-D1.

In an alternative embodiment illustrated in FIG. 15A, a second compute element 700-*c2* is co-located on the first server 618*a* with the first data interface 523-1 and the first memory module 540-*m*1. The second compute element 700-*c*2 is in communicative contact with the first data interface 523-1 via a local data bus 704, which could be, for example, a PCIE bus or Infiniband. The second compute element 700-*c*2 requests 700-*req* a second data set 703-D2 from the first memory module 540-*m*1. The processing of the second request 700-*req* is similar to the processing of the request 600-*req*2 from the first compute element 600-*c*1. This second request 700-*req* is sent to the first data interface 523-1. Simultaneously: (i) the access controller 701 determines if the second compute element 700-*c*2 is authorized to access the second data set 703-D2, while (ii) the first data interface 523-1 in conjunction with the first memory module 540-*m*1 perform a second random access read cycle 703-RD-D2 resulting in the retrieval of the second data set 703-D2. If the access controller 701 determines that the second compute element 700-*c*2 is authorized to access the second data set 703-D2, then the second data set 703-D2 is sent to the second compute element 700-*c*2 over the local data bus 704. If the second compute element 700-*c*2 is not authorized to access the second data set 703-D2, then the access controller 701 prevents delivery of the second data set 703-D2 to the second compute element 700-*c*2.

In an alternative embodiment illustrated in FIG. 15A, a system is configured to allow or not allow a compute element to write a data set into the shared memory pool. In one embodiment, a first compute element 600-*c*1 requests to write a third data set into a third address located within the first memory module 540-*m*1. This third request is sent from the first compute element 600-*c*1 over the communication network 702 to the first data interface 523-1, and the third data set is then temporarily stored in buffer 7TB. After the first compute element 600-*c*1 sends this third request, the first compute element 600-*c*1 can continue doing other work without waiting for an immediate response to the third request. If the access controller 701 determines that the first compute element 600-*c*1 is authorized to write the third data set into the third address, then the first data interface 523-1 may copy the third data set into the third address within the first memory module 540-*m*1. If the first compute element is not authorized to write into the third address, then the access controller 701 will prevent the copying of the third data set into the third address within the first memory module 540-*m*1.

In an alternative to the alternative embodiment just described, the requesting compute element is not the first compute element 600-*c*1 but rather the second compute element 700-*c*2, in which case the third request is conveyed by the local data bus 704, and the rest of the process is essentially as described above, all with the second compute element 700-*c*2 rather than the first compute element 600-*c*1.

In the various embodiments illustrated in FIG. 15A, different permutations are possible. For example, if a particular compute element, be it the first 600-*c*1 or the second 700-*c*2 or another compute element, makes multiple requests, all of which are rejected by the access controller 701 due to lack of authorization, that compute element may be barred from accessing a particular memory module, or barred even from accessing any data set in the system.

Figures 15B, 15C:
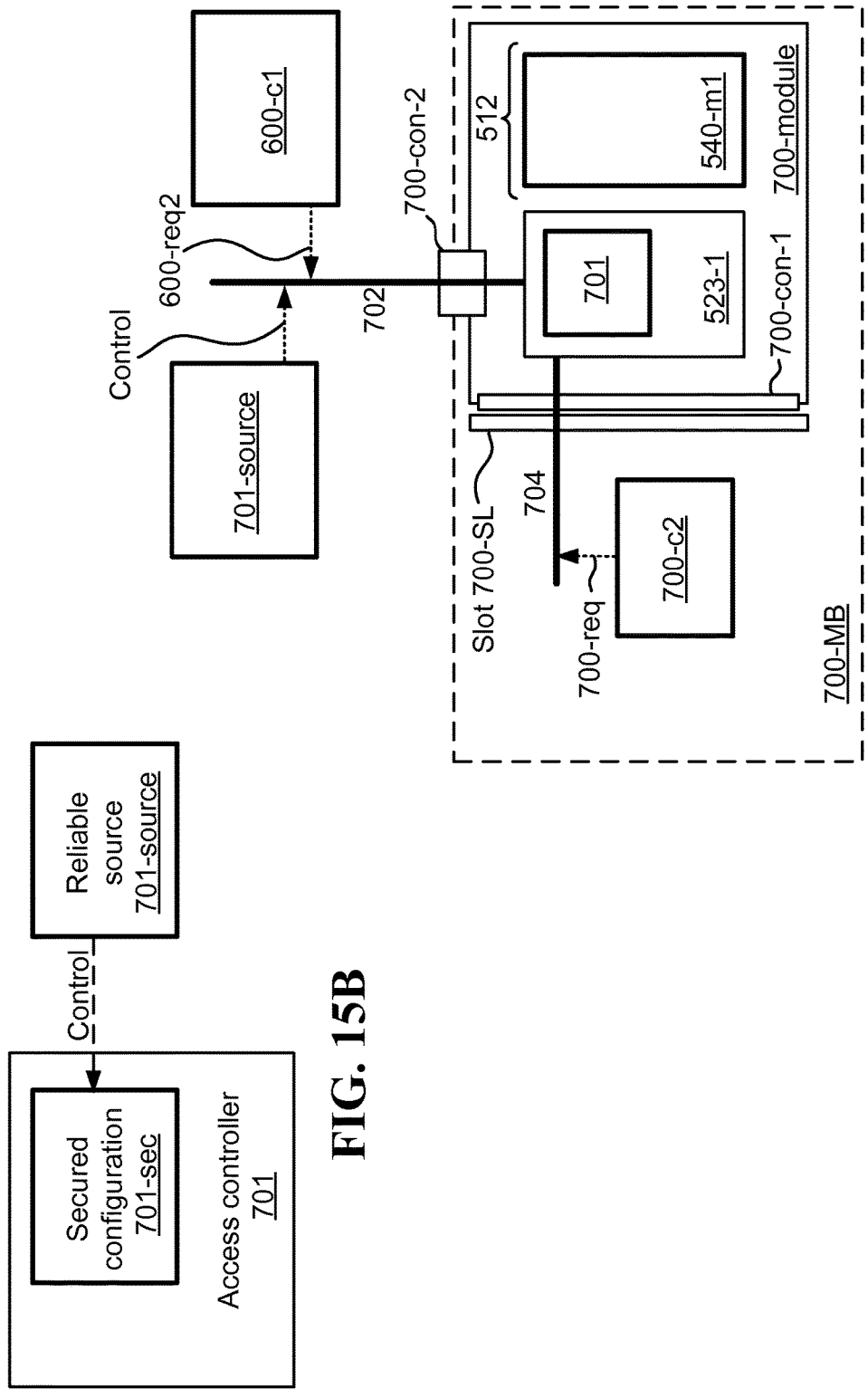
FIG. 15B illustrates one embodiment of a sub-system with an access controller that includes a secured configuration which may be updated by a reliable source.
FIG. 15C illustrates one alternative embodiment of a system operative to control random memory access in a shared memory pool.

FIG. 15B illustrates one embodiment of a sub-system with an access controller 701 that includes a secured configuration 701-*sec* which may be updated by a reliable source 701-source. This is a sub-system of the entire system 700. Access controller 701 is implemented as a hardware element having a secured configuration function 701-*sec* operative to set the access controller into a state in which a particular compute element (600-*c*1, or 700-*c*2, or another) is authorized to access some data set located in first memory module 540-*m*1, but a different compute element (600-*c*1, or 700-*c*2, or another) is not authorized to access the same data set. The rules of authorization are located within a secured configuration 701-*sec* which is part of the access controller 701. These rules are created and controlled by a reliable source 701-source that is not related to any of the particular compute elements. The lack of relationship to the compute elements means that the compute elements cannot create, delete, or alter any access rule or state of access, thereby assuring that no compute element can gain access to a data set to which it is not authorized. FIG. 15B shows a particular embodiment in which the reliable source 701-source is located apart from the access controller, and thereby controls the secured configuration 701-*sec* remotely. In alternative embodiments, the reliable source 701-source may be located within the access controller 701, but in all cases the reliable source 701-source lacks a relationship to the compute elements.

The communicative connection between the reliable source 701-source and the secured configuration 701-*sec* is any kind of communication link, while encryption and/or authentication techniques are employed in order to facilitate said secure configuration.

FIG. 15C illustrates one alternative embodiment of a system operative to control random memory access in a shared memory pool. Many of the elements described with respect to FIGS. 15A and 15B. appear here also, but in a slightly different configuration. There is a motherboard 700-MB which includes the second compute element 700-*c*2, the first data interface 523-1, and the shared memory pool 512, but these structural elements do not all reside on a single module within the motherboard 700-MB. The first memory module 540-*m*1, and the first data interface 523-1, including the access controller 701, are co-located on one module 700-module which is placed on the motherboard 700-MB. The second compute element 700-*c*2, which still makes requests 700-*req* over the local data bus 704, is not co-located on module 700-module, but rather is in contact with module 700-module through a first connection 700-*con*-1 which is connected to a first slot 700-SL in the motherboard. In FIG. 15C, the first compute element 600-*c*1 still makes requests 600-*req*2 over a communication network 702 that is connected to the motherboard 700-MB through a second connection 700-*con*-2, which might be, for example, and Ethernet connector. In the particular embodiment illustrated in FIG. 15C, there is a reliable source 701-source that controls authorizations of compute elements to access data sets, such reliable source 701-source is located outside the motherboard 700-MB, and the particular connection between the reliable source 701-source and the motherboard 700-MB is the communication network 702 which is shared with the first compute element 600-*c*1. This is only one possible embodiment, and in other embodiments, the reliable source 701-source does not share the communication network 702 with the first compute element 600-*c*1, but rather has its own communication connection with the motherboard 700-MB. In some embodiments, the length of the local data bus 704 is on the order of a few centimeters, whereas the length of the communication network 702 is on the order of a few meters to tens of meters.

One embodiment is a system 700 operative to control random memory access in a shared memory pool, including a first data interface 523-1 associated with a first memory module 540-*m*1 belonging to a shared memory pool 512, an access controller 701 associated with the first data interface 523-1 and with the first memory module 540-m1, and a first compute element 600-c1 connected with the first data interface 523-1 via a communication network 702, whereas the first memory module 540-m1 is an external memory element relative to the first compute element 600-c1. That is to say, there is not a direct connection between the first compute element 600-c1 and the first memory module 540-m1 (e.g. the two are placed on different servers). Further, the first data interface 523-1 is configured to receive, via the communication network 702, a new request 600-req2 from the first compute element 600-c1 to access a first set of data 703-D1 currently stored in the first memory module 540-m1. Further, the first data interface 523-1 is further configured to retrieve the first set of data 703-D1, as a response to the new request 600-req2, by performing at least a first random access read cycle 703-RD-D1 in conjunction with the first memory module 540-m1. Further, the access controller 701 is configured to prevent delivery of said first set of data 703-D1 to said first compute element 600-c1 when determining that said first compute element is not authorized to access the first set of data, but such that the retrieval is allowed to start anyway, thereby preventing the determination from delaying the retrieval when the first compute element is authorized to access the first set of data.

In one embodiment, said retrieval is relatively a low latency process due to the read cycle 703-RD-D1 being a random access read cycle that does not require sequential access. In one embodiment, the retrieval, which is a relatively low latency process, comprises the random access read cycle 703-RD-D1, and the retrieval is therefore executed entirely over a period of between 10 nanoseconds and 1000 nanoseconds, thereby making said retrieval highly sensitive to even relatively short delays of between 10 nanoseconds and 1000 nanoseconds associated with said determination, thereby requiring said retrieval to start regardless of said determination process.

In one alternative embodiment to the system 700 operative to control random memory access in a shared memory pool 512, the system includes further a second compute element 700-c2 associated with the first memory module 540-m1, whereas the first memory module is a local memory element relative to the second compute element. The system 700 includes further a local data bus 704 operative to communicatively connect the second compute element 700-c2 with the first data interface 523-1. Further, the first data interface 523-1 is configured to receive, via the local data bus 704, a second request 700-req from the second compute element 700-c2 to access a second set of data 703-D2 currently stored in the first memory module 540-m1. Further, the first data interface 523-1 is configured to retrieve the second set of data 703-D2, as a response to said second request 700-req, by performing at least a second random access read cycle 703-RD-D2 in conjunction with the first memory module 540-m1. Further, the access controller 701 is configured to prevent delivery of the second set of data 703-D2 to the second compute element 700-c2 after determining that the second compute element in not authorized to access the second set of data.

In one possible configuration of the alternative embodiment described above, further the access controller 701 is implemented as a hardware element having a secured configuration function 701-sec operative to set the access controller into a state in which the second compute element 700-c2 is not authorized to access the second data set 703-D2. Further, the secured configuration function 701-sec is controllable only by a reliable source 701-source that is not related to the second compute element 700-c2, thereby preventing the second compute element 700-c2 from altering the state, thereby assuring that the second compute element does not gain access to the second data set 703-D2.

In a second possible configuration of the alternative embodiment described above, further the second compute element 700-c2, the first data interface 523-1, the access controller 701, and the first memory module 540-m1 are placed inside a first server 618a. Further, the first compute element 600-c1 is placed inside a second server 618b, which is communicatively connected with the first server 618a via the communication network 702.

In one variation of the second possible configuration described above, further the first data interface 523-1, the access controller 701, and the first memory module 540-m1 are packed as a first module 700-module inside the first server 618a In one option of the variation described above, further the second compute element 700-c2 is placed on a first motherboard 700-MB. Further, the first module 700-module has a form factor of a card, and is connected to the first motherboard 700-MB via a first slot 700-SL in the first motherboard.

In a second alternative embodiment to the system 700 operative to control random memory access in a shared memory pool 512, further the retrieval is performed prior to the prevention, such that the retrieval is performed simultaneously with the determination, thereby avoiding delays in the retrieval. Further, the prevention is achieved by blocking the first set of data 703-D1 retrieved from reaching the first compute element 600-c1.

In a third alternative embodiment to the system 700 operative to control random memory access in a shared memory pool 512, further the prevention is achieved by interfering with the retrieval after the determination, thereby causing the retrieval to fail.

In a fourth alternative embodiment to the system 700 operative to control random memory access in a shared memory pool 512, further the shared memory pool is a key-value store, the first data set 703-D1 is a first value 618-v1 (FIG. 13A) associated with a first key 618-k1, the first key 618-k1 is conveyed by said new request 600-req2, and the retrieval comprises finding the first value 618-v1 in the first memory module 540-m1 using the first key 618-k1 conveyed, prior to the performing of the first random access read cycle 703-RD-D1.

In one possible configuration of the fourth alternative embodiment described above, further the authorization is managed by a reliable source 701-source at the key-value store level, such that the first compute element 600-c1 is authorized to access a first plurality of values associated respectively with a first plurality of keys, and such that the first compute element is not authorized to access a second plurality of values associated respectively with a second plurality of keys, wherein the first value 618-v1 belongs to said second plurality of values.

In a fifth alternative embodiment to the system 700 operative to control random memory access in a shared memory pool 512, further the first memory module 540-m1 is based on a random-access-memory (RAM), the first data set 703-D1 is located in a first address associated with the random-access-memory, and the first address is conveyed by the new request 600-req2.

In one possible configuration of the fifth alternative embodiment described above, further the authorization is managed by a reliable source 701-source at the random-access-memory address level, such that the first compute element 600-c1 is authorized to access a first range of addresses, and such that the first compute element is not authorized to access a second range of addresses, wherein the first data set 703-D1 has an address that is within the second range of addresses. In some embodiments, the random-access-memory (RAM) is DRAM. In some embodiments, random-access-memory (RAM), is Flash memory.

One embodiment is a system 700 operative to control random memory access in a shared memory pool 512, including a first data interface 523-1 associated with a first memory module 540-*m*1 belonging to a shared memory pool 512, an access controller 701 and a temporary write buffer 7TB associated with the first data interface 523-1 and the first memory module 540-*m*1, and a first compute element 600-*c*1 connected with the first data interface 523-1 via a communication network 702 whereas the first memory module 540-*m*1 is a memory element that is external relative to the first compute element. Further, the first data interface 523-1 is configured to receive, via the communication network 702, a third request from the first compute element 600-*c*1 to perform a random write cycle for a third set of data into a third address within the first memory module 540-*m*1. Further, the first data interface 523-1 is configured to temporarily store the third set of data and third address in the temporary write buffer 7TB, as a response to the third request, thereby allowing the first compute element 600-*c*1 to assume that the third set of data is now successfully stored in the first memory module 540-*m*1. Further, the first data interface 523-1 is configured to copy the third set of data from the temporary write buffer 7TB into the third address within the first memory module 540-*m*1, using at least one random access write cycle, but only after said access controller 701 determining that the first compute element 600-*c*1 is authorized to write into the third address.

One embodiment is a system 700-module operative to control data access in a shared memory pool 512, including a first memory module 540-*m*1 belonging to a shared memory pool 512, configured to store a first 703-D1 and a second 703-D2 set of data. The system includes also a first data interface 523-1 associated with the first memory module 540-*m*1, and having access to (i) a first connection 700-*con*-1 with a local data bus 704 of a second system 700-MB, and to (ii) a second connection 700-*con*-2 with a communication network 702. The system includes also an access controller 701 associated with the first data interface 523-1 and the first memory module 540-*m*1. Further, the first data interface 523-1 is configured to facilitate a first memory transaction associated with the first set of data 703-D1, via the communication network 702, between a first compute element 600-*c*1 and the first memory module 540-*m*1. Further, the first data interface 523-1 is configured to facilitate a second memory transaction associated with the second set of data 703-D2, via the local data bus 704, between a second compute element 700-*c*2 belonging to the second system 700-MB and the first memory module 540-*m*1. Further, the access controller 701 is configured to prevent the second compute element 700-*c*2 from performing a third memory transaction via the local data bus 704 in conjunction with the first set of data 703-D1, by causing the first data interface 523-1 to not facilitate the third memory transaction.

In an alternative embodiment to the system 700-module operative to control data access in a shared memory pool 512, further the second system 700-MB is a motherboard having a first slot 700-SL, and the first connection 700-*con*-1 is a connector operative to connect with said first slot.

In one possible configuration of the alternative embodiment just described, further the first local bus 704 is selected from a group of interconnects consisting of: (i) peripheral-component-interconnect-express (PCIE) computer expansion bus, (ii) Ethernet, and (iii) Infiniband.

In a second alternative embodiment to the system 700-module operative to control data access in a shared memory pool 512, further the communication network 702 is based on Ethernet, and the second connection 700-*con*-2 in an Ethernet connector. In one embodiment, system 700-module is a network interface card (NIC).

Figure 16A:
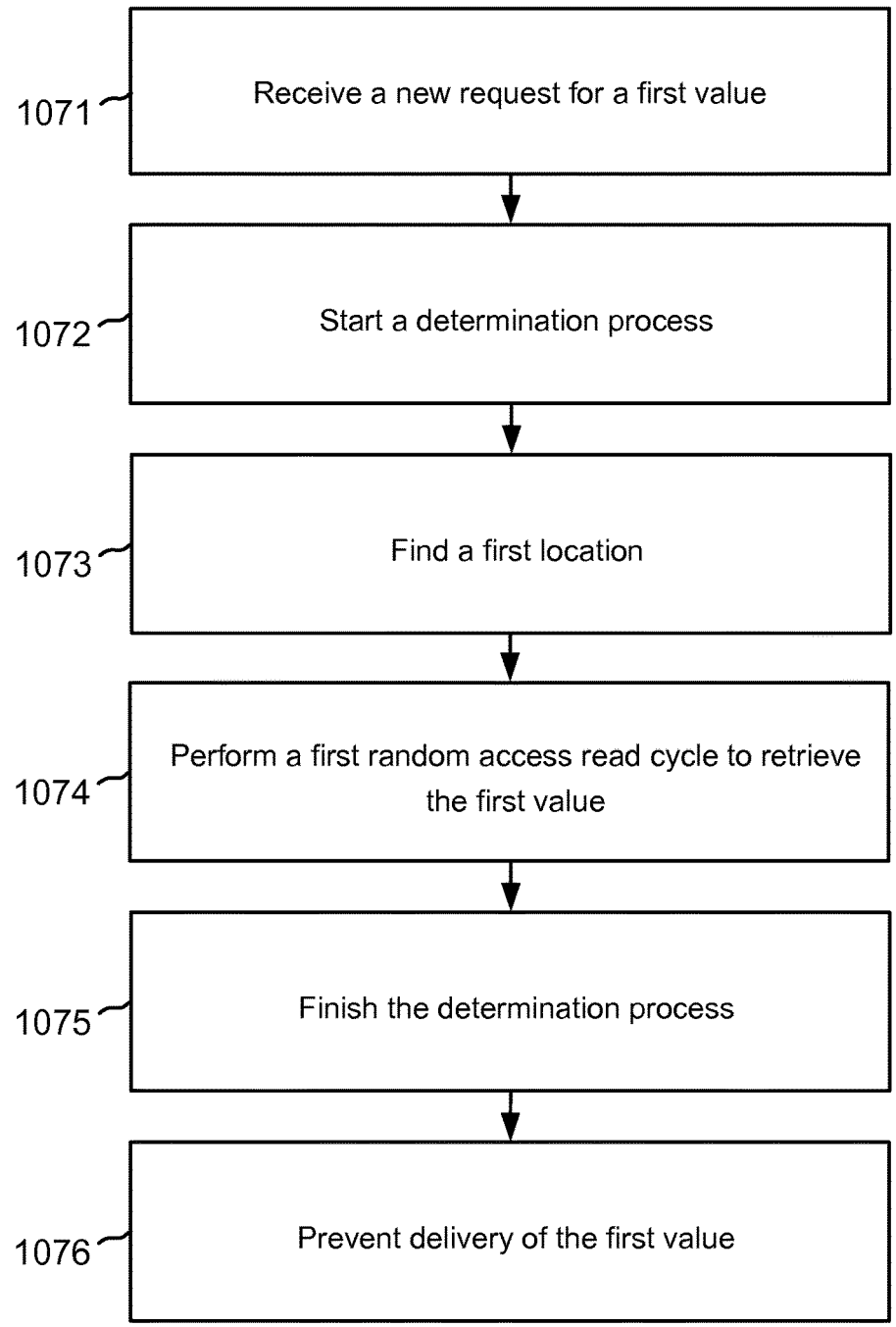
FIG. 16A illustrates one embodiment of a method for determining authorization to retrieve a value in a key-value store while preserving low latency associated with random-access retrieval.

FIG. 16A illustrates one embodiment of a method for determining authorization to retrieve a first value 681-*v*1 in a key-value store 621 while preserving low latency associated with random-access retrieval. In step 1071, a first data interface 523-1 receives a new request 600-*req*2 from a first compute element 600-*c*1 to access a first value 618-*v*1 (FIG. 13A) currently stored in a first memory module 540-*m*1 associated with the first data interface, wherein the first memory module belongs to a key-value store 621 (FIG. 13A), and the first value is associated with a first key 618-*k*1 that is conveyed by the new request 600-*req*2. In step 1072, a determination process is started in which an access controller 701 associated with the first data interface 523-1 determines whether or not the first compute element 600-*c*1 is authorized to access the first value. In step 1073, using the first key 618-*k*1, the first data interface 523-1 finds in the memory module 540-*m*1 a first location that stores the first value 618-*v*1, and this finding occurs simultaneously with the determination process described in step 1072. In step 1074, the first data interface 523-1 performs a first random access read cycle 703-RD-D1 in conjunction with the first memory module 540-*m*1, thereby retrieving the first value 618-*v*1, and this cycle is performed simultaneously with the determination process described in step 1072. In step 1075, the access controller 701 finishes the determination process. In step 1076, when the determination process results in a conclusion that the first compute element 600-*c*1 is not authorized to access the first value 618-*v*1, the access controller 701 prevents delivery of the first value 618-*v*1 retrieved for the first compute element 600-*c*1. In some embodiments, the finding in step 1073 and the performing in step 1074 are associated with random-access actions done in conjunction with the first memory module 540-*m*1, and the result is that the retrieval has a low latency, which means that the simultaneity of steps 1073 and 1074 with the determination process facilitates a preservation of such low latency.

In an alternative embodiment to the method just described for determining authorization to retrieve a first value 618-*v*1 in a key-value store 621 while preserving low latency associated with random-access retrieval, further when the determination process results in a conclusion that the first compute element 600-*c*1 is authorized to access said value 618-*v*1, the access controller 701 allows delivery of the retrieved value 618-*v*1 to the first compute element 600-*c*1.

Figure 16B:
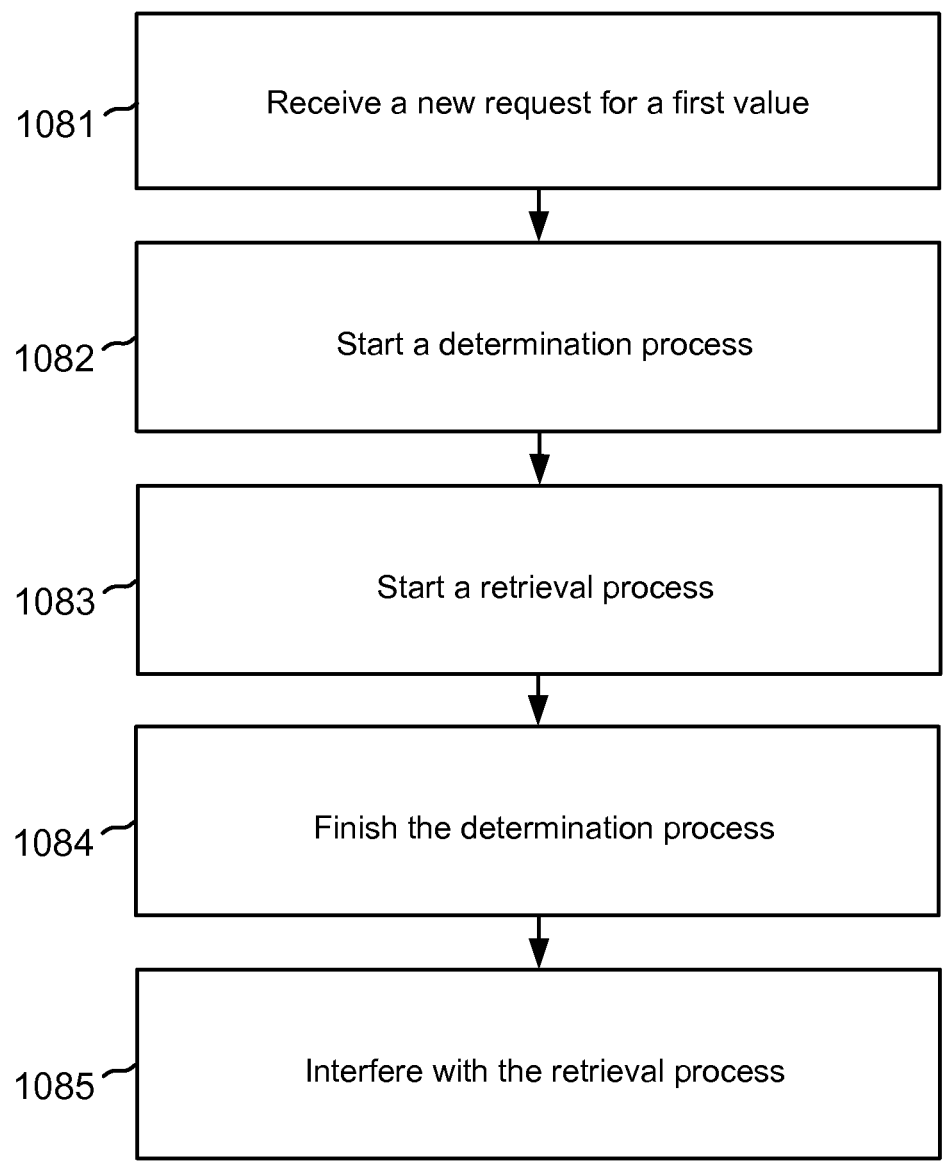
FIG. 16B illustrates one alternative embodiment of a method for determining authorization to retrieve a value in a key-value store while preserving low latency associated with random-access retrieval.

FIG. 16B illustrates one embodiment of a method for determining authorization to retrieve a first value 618-*v*1 in a key-value store 621 while preserving low latency associated with random-access retrieval. In step 1081, a first data interface 523-1 receives a new request 600-*req*2 from a first compute element 600-*c*1 to access a first value 618-*v*1 (FIG. 13A) currently stored in a first memory module 540-*m*1 associated with the first data interface, wherein the first memory module belongs to a key-value store 621 (FIG. 13A), and the first value is associated with a first key 618-*k*1 that is conveyed by the new request 600-*req*2. In step 1082, a determination process is started in which an access controller 701 associated with the first data interface 523-1 determines whether or not the first compute element 600-*c*1 is authorized to access the first value. In step 1083, using a the first key 618-*k*1, the first data interface 523-1 starts a retrieval process that includes (i) finding in the first memory module 540-*m*1 a first location that stores the first value 618-*v*1, and (ii) performing a first random access read cycle 703-RD-D1 at the first location to obtain the first value 618-*v*1, such that the retrieval process occur simultaneously with the determination process performed by the access controller 701. In step 1084, the access controller finishes the determination process. In step 1085, when the determination process results in a conclusion that the first compute element 600-*c*1 is not authorized to access the first value 618-*v*1, the access controller 701 interferes with the retrieval process, thereby causing the retrieval process to fail, thereby preventing delivery of the first value 618-*v*1 to the first compute element 600-*c*1.

Figure 17A:
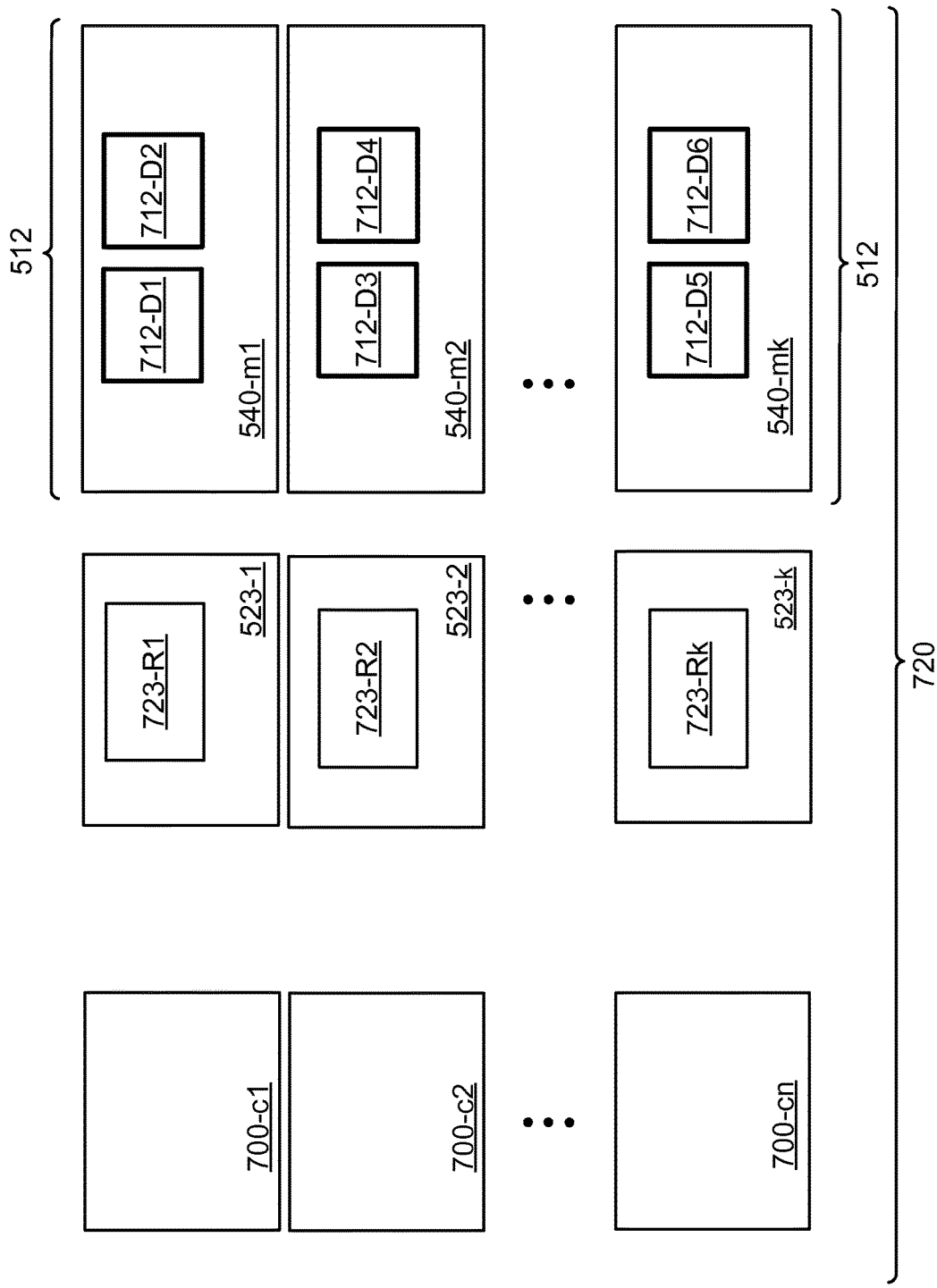
FIG. 17A illustrates one embodiment of a system operative to distributively process a plurality of data sets stored on a plurality of memory modules.

FIG. 17A illustrates one embodiment of a system 720 operative to distributively process a plurality of data sets 712-D1, 712-D2, 712-D3, 712-D4, 712-D5, 712-D6 stored on a plurality of memory modules 540-*m*1, 540-*m*2, 540-*mk* In this system 720, a plurality of compute elements 700-*c*1, 700-*c*2, 700-*cn* send requests for data to one or more data interfaces 523-1, 523-2, 523-*k*. Data is held in data sets which are located in memory modules 540-*m*1, 540-*m*2, 540-*mk*, which together comprise a shared memory pool 512. Each data interface is associated with one or more memory modules 540-*m*1, 540-*m*2, 540-*mk*. As an example, data interface 523-1 is associated with memory module 540-*m*1. In the embodiment shown in FIG. 17A, each data registry 723-R1, 723-R2, 723-Rk is associated with one of the data interfaces. Each memory module includes one or more data sets. In the embodiment shown, memory module 540-*m*1 includes data sets 712-D1, 712-D2, memory module 540-*m*2 includes data sets 712-D3, 712-D4, and memory module 540-*mk* includes data sets 712-D5, 712-D6. It is understood that a memory module may include one, or two, or any other number of data sets. It is understood that the shared memory pool 512 may include two, three, or any other plurality number of memory modules. It is understood that the system may include one, two, or any other number of data interfaces, and one, two, or any other number of compute elements. Various functions of each data interface may be: to know the location of each data set included within an associated memory module, to receive requests for data from compute elements, to extract from the associated memory modules data sets, to send as responses to the compute elements the data sets, and to keep track of which data sets have already been served to the compute elements. Within each data registry is an internal registry which facilitates identification of which data sets have not yet been served, facilitates keeping track of data sets which have been served, and may facilitate the ordering by which data sets that have not yet been served to the compute elements will be served. In FIG. 17A, data interface 523-1 includes internal registry 723-R1, data interface 523-2 including internal registry 723-R2, and data interface 523-*k* includes internal registry 523-Rk.

In an embodiment alternative to the embodiment shown in FIG. 17A, the internal registries 723-R1, 723-R2, and 723-Rk, are not part of data interfaces. Rather, there is a separate module between the data interfaces 523-1, 523-2, 523-*k*, and the memory modules 540-*m*1, 540-*m*2, 540-*mk*. This separate module includes one or more internal registries, and the functions of the internal registries, as described above, are implemented in this separate module rather than in the data interfaces illustrated in FIG. 17A.

Figure 17B:
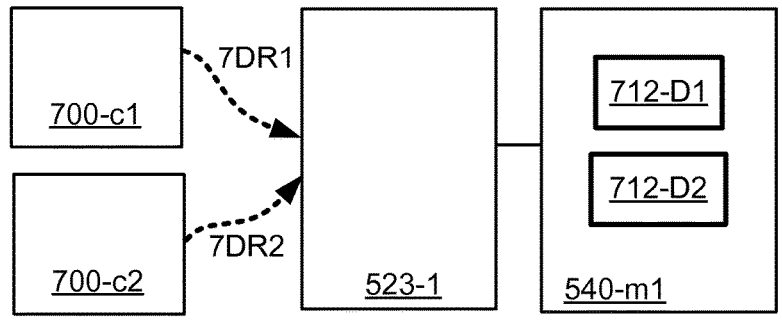
FIG. 17B illustrates one embodiment of a system in which a plurality of compute elements send data requests to a single data interface.

FIG. 17B illustrates one embodiment of a system in which a plurality of compute elements 700-*c*1, 700-*c*2 send data requests 7DR1, 7DR2 to a single data interface 523-1 which then accesses multiple data sets 712-D1, 712-D2 stored in a single memory module 540-*m*1. In various embodiments, any number of compute elements may send data requests to any number of data interfaces. In the particular embodiment illustrated in FIG. 17B, a plurality of compute elements 700-*c*1, 700-*c*2 send their requests to a single data interface 523-1. It is understood that three or any higher number of compute elements may send their requests to single data interface 523-1. FIG. 17B shows only one memory module 540-*m*1 associated with data interface 523-1, but two or any other number of memory modules may be associated with data interface 523-1. FIG. 17B shows two data sets 712-D1, 712-D2 included within memory module 540-*m*1, but there may be three or any other higher number of included data sets. FIG. 17B shows two data requests 7DR1, 7DR2, but there may be three or any other number of data requests send by the compute elements.

Figure 17C:
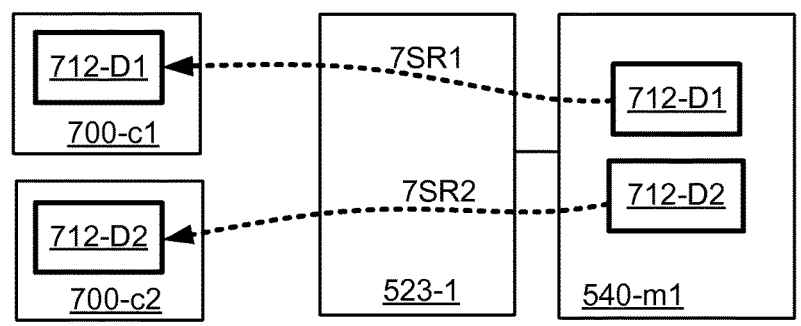
FIG. 17C illustrates one embodiment of a system in which the data interface then accesses multiple data sets stored in a single memory module, and then sends each such data set to the correct compute element.

FIG. 17C illustrates one embodiment of a system in which a single data interface 523-1 extracts from a single memory module 540-*m*1 some data sets and sends those data sets as multiple responses 7SR1, 7SR2 to the correct compute element. In this sense, a "correct" compute element means that the compute element which requested data set receives a data set selected for it by the data interface. FIG. 17C is correlative to FIG. 17B. After data interface 523-1 has received the data requests, the data interface 523-1 sends 7SR1 the first data set 712-D1, as a response to request 7DR1, to compute element 700-*c*1, and the data interface 523-1 sends 7SR2 the second data set 712-D2, as a response to request 7DR2, to compute element 700-*c*2. It is noted that data interface 523-1 sends data set 712-D2 as a response to request 7DR2 only after concluding, based on sending history as recorded in 723-R1, that data set 712-D2 was not served before.

Figure 17D:
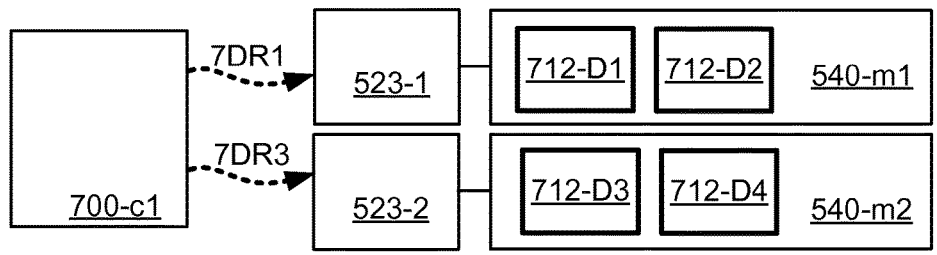
FIG. 17D illustrates one embodiment of a system in which a single compute element sends a plurality of data requests to a plurality of data interfaces.

FIG. 17D illustrates one embodiment of the system in which a single compute element 700-*c*1 sends a plurality of data requests 7DR1, 7DR3 to a plurality of data interfaces 523-1, 523-2 in which each data interface then accesses data sets stored in an associated memory module. Compute element 700-*c*1 sends data request 7DR1 to data interface 523-1, which then accesses associated memory module 540-*m*1 containing data sets 712-D1 and 712-D2. Compute element 700-*c*1 also sends data request 7DR3 to data interface 523-2, which then accesses associated memory module 540-*m*2 containing data sets 712-D3 and 712-D4. These two requests 7DR1 and 7DR3 may be sent essentially simultaneously, or with a time lag between the earlier and the later requests. It is understood that compute element 700-*c*1 may send data requests to three or even more data interfaces, although FIG. 17D shows only two data requests. It is understood that either or both of the data interfaces may have one, two, or more associated memory modules, although FIG. 17D shows only one memory module for each data interface. It is understood that any memory module may have more than two data sets, although FIG. 17D shows exactly two data sets per memory module.

Figure 17E:
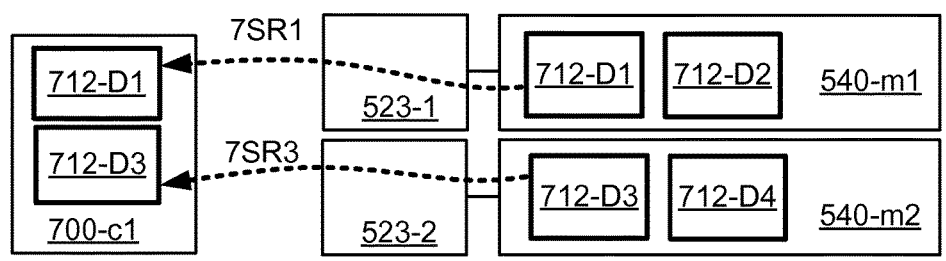
FIG. 17E illustrates one embodiment of a system in which a single compute element receives responses to data requests that the compute element sent to a plurality of data interfaces, in which each data interface fetches a response from an associated memory module and sends that response to the compute element.

FIG. 17E illustrates one embodiment of the system in which a single compute element 700-*c*1 receives responses to data requests that the compute element 700-*c*1 sent to a plurality of data interfaces 523-1, 523-2, in which each data interface accesses an associated memory module and sends the accessed data to the compute element 700-*c*1. FIG. 17E is correlative to FIG. 17D. Data interface 523-1, as a response to request 7DR1, selects data set 712-D1 since it was not served yet, extracts data set 712-D1 from memory module 540-*m*1, and serves 7SR1 data set 712-D1 to compute element 700-c1. Data interface 523-2, as a response to request 7DR3, selects data set 712-D3 since it was not served yet, extracts data set 712-D3 from memory module 540-m2, and serves 7SR3 data set 712-D3 to compute element 700-c1. The two responses 7DR1 and 7DR2 may be sent essentially simultaneously, or with a time lag between the earlier and the later. It is noted that data interface 523-2 sends data set 712-D3 as a response to request 7DR3 only after concluding, based on sending history as recorded in 723-R2, that data set 712-D3 was not served before. After serving data set 712-D3, data interface 523-2 may record that fact in 723-R2, and therefore may guarantee that data set 712-D3 is not served again as a result of future requests made by any of the compute elements.

One embodiment is a system 720 that is operative to distributively process a plurality of data sets stored on a plurality of memory modules. One particular form of such embodiment includes a plurality of compute elements 700-c1, 700-c2, 700-cn, a shared memory pool 512 with a plurality of memory modules 540-m1, 540-m2, 540-mk configured to distributively store a plurality of data sets 712-D1, 712-D2, 712-D3, 712-D4, 712-D5, 712-D6, and a plurality of data interfaces 523-1, 523-2, 523-k associated respectively with the plurality of memory modules 540-m1, 540-m2, 540-mk. Further, each of the data interfaces is configured to:
(i) receive data requests 7DR1, 7DR2 from any one of the plurality of compute elements, such as 7DR1 from 700-c1, or 7DR2 from 700-c2;
(ii) identify from the data sets 712-D1, 712-D2 of the memory module 540-m1 the data sets 712-D1, 712-D2 that were not served yet;
(iii) serve 7SR1, 7SR2, as replies to the data requests 7DR1, 7DR2, respectively, the data sets identified 712-D1, 712-D2, respectively; and
(iv) keep track of the data sets already served, such that, as an example, after responding with 712-D1 to data request 7DR1, data interface 523-1 keeps a record of the fact that 712-D1 was just served, and therefore data interface 523-1 knows not to respond again with 712-D1 to another data request such as 7DR2, but rather to respond with 712-D2 to data request 7DR2, since 712-D2 has not yet been served.

Further, each of the plurality of compute elements is configured to:
(i) send some of the data requests 7DR1, 7DR3 to at least some of the plurality of data interfaces 523-1, 523-2 respectively;
(ii) receive respectively some of the replies 7SR1, 7SR3 comprising some of the data sets 712-D1, 712-D3 respectively; and
(iii) process the data sets received,
Further, the compute elements continue to send data requests, receive replies, and process data, until a first condition is met. For example, one condition might be that all of the data sets that are part of the data corpus are served and processed.

In one alternative embodiment to the system just described, further the data requests 7DR1, 7DR2, 7DR3 do not specify certain which of the plurality of data sets 712-D1, 712-D2, 712-D3, 712-D4, 712-D5, 712-D6 should be served to the compute elements 700-c1, 700-c2. Rather, the identification and the keeping track constitute the only way by which the plurality of data interfaces 523-1, 523-2, 523-k know which one of the plurality of data sets is to be specifically served to the specific compute element making the data request, and thereby identification and keeping track constitute the only way by which the system 720 insures that none of the data sets is served more than once. As a non-limiting example, when sending data request 7DR1, compute element 700-c1 does not specify in the request that data set 712-D1 is to be served as a response. The decision to send data set 712-D1 as a response to data request 7DR1 is made independently by data interface 523-1 based on records kept indicating that data set 712-D1 was not yet served. The records may be kept within the internal register 723-R1 of data interface 523-1.

In one possible configuration of the alternative embodiment just descried, further the plurality of compute elements 700-c1, 700-c2, 700-cn comprises a first compute element 700-c1 and a second compute element 700-c2, the plurality of data interfaces 523-1, 523-2, 523-k comprises a first data interface 523-1 including a first internal registry 723-R1 that is configured to facilitate the identification and the keeping track, and the plurality of memory modules 540-m1, 540-m2, 540-mk comprises a first memory module 540-m1 associated with the first data interface 523-1 and configured to store a first data set 712-D1 and a second data set 712-D2. Further, the first compute element 700-c1 is configured to send a first data request 7DR1 to the first data interface 523-1, and the first data interface is configured to (i) conclude, according to the first internal registry 723-R1, that the first data set 712-D1 is next for processing from the ones of the data sets 712-D1, 712-D2 stored in the first memory module 540-m1, (ii) extract the first data set 712-D1 from the first memory module 540-m1, (iii) serve 7SR1 the first data set 712-D1 extracted to the first compute element 700-c1, and (iv) update the first internal registry 723-R1 to reflect said serving of the first data set. Further, the second compute element 700-c2 is configured to send a second data request 7DR2 to the first data interface 523-1, and the first data interface is configured to (i) conclude, according to the first internal registry 723-R1, that the second data set 712-D2 is next for processing from the ones of the data sets 712-D1, 712-D2 stored in the first memory module 540-m1, (ii) extract the second data set 712-D2 from the first memory module 540-m1, (iii) serve the second data set 712-D2 extracted to the second compute element 700-c2, and (iv) update the first internal registry 723-R1 to reflect said serving of the second data set.

In one possible variation of the configuration just described, further the plurality of data interfaces 523-1, 523-2, 523-k comprises a second data interface 523-2 including a second internal registry 723-R2 that is configured to facilitate the identification and the keeping track, and the plurality of memory modules 540-m1, 540-m2, 540-mk comprises a second memory module 540-m2 associated with said second data interface 523-2 and configured to store a third data set 712-D3 and a fourth data set 712-D4. Further, the first compute element 700-c1 is configured to send a third data request 7RD3 to the second data interface 523-2, and the second data interface is configured to (i) conclude, according to the second internal registry 723-R2, that the third data set 712-D3 is next for processing from the ones of the data sets 712-D3, 712-D4 stored in the second memory module 540-m2, (ii) extract the third data set 712-D3 from the second memory module 540-m2, (iii) serve the third data set 712-D3 extracted to the first compute element 700-c1, and (iv) update the second internal registry 723-R2 to reflect said serving of the third data set. Further, the second compute element 700-c2 is configured to send a fourth of said data requests to the second data interface 523-2, and the second data interface is configured to (i) conclude, according to the second internal registry 723-R2, that the fourth data set 712-D4 is next for processing from the ones of the data sets 712-D3, 712-D4 stored in the second memory module 540-m2, (iii) extract the fourth data set 712-D4 from the second memory module 540-m2, (iii) serve the fourth data set 712-D4 extracted to the second compute element 700-c2, and (iv) update the second internal registry 723-R2 to reflect said serving of the fourth data set.

In a second alternative embodiment to the system described to be operative to distributively process a plurality of data sets stored on a plurality of memory modules, further the plurality of compute elements 700-c1, 700-c2, 700-cn are configured to execute distributively a first task associated with the plurality of data sets 712-D1, 712-D2, 712-D3, 712-D4, 712-D5, 712-D6 by performing the processing of the data sets received.

In one possible configuration of the second alternative embodiment just described, further the execution of the first task can be done in any order of the processing of plurality of data sets, such that any one of the plurality of data sets can be processed before or after any other of the plurality of data sets. In other words, there is flexibility in the order in which data sets may be processed.

In one possible variation of the configuration just described, further the plurality of data sets 712-D1, 712-D2, 712-D3, 712-D4, 712-D5, 712-D6 constitute a first data corpus, and the first task is selected from a group consisting of: (i) counting number of occurrences of specific items in the first data corpus, (ii) determining size of the data corpus, (iii) calculating a mathematical property for each of the data sets, and (iv) running a mathematical filtering process on each of the data sets.

In a third alternative embodiment to the system described to be operative to distributively process a plurality of data sets stored on a plurality of memory modules, further each of the compute elements 700-c1, 700-c2, 700-cn is configured, per each of the sending of one of the data requests made by such compute element, to select one of the plurality of data interfaces as a target of receiving such data request, wherein the selection is done using a first technique. As a non-limiting example, compute element 700-c1 chooses to send data request 7DR1 to data interface 523-1, and then chooses to send data request 7DR3 to data interface 523-2, but compute element 700-c1 could have, instead, chosen to send data request 7DR3 to data interface 523-k, and in that event compute element 700-c1 would have received a different data set, such as data set 712-D5, as a response to data request 7DR3.

In one possible configuration of the third alternative embodiment just described, further the first technique is round robin selection.

In one possible configuration of the third alternative embodiment just described, further the first technique is pseudo-random selection.

In one possible configuration of the third alternative embodiment just described, further the selection is unrelated and independent of the identification and the keeping track.

In a fourth alternative embodiment to the system described to be operative to distributively process a plurality of data sets stored on a plurality of memory modules, further the keeping track of the data sets already served facilitates a result in which none of the data sets is served more than once.

In a fifth alternative embodiment to the system described to be operative to distributively process a plurality of data sets stored on a plurality of memory modules, further the first condition is a condition in which the plurality of data sets is served and processed in its entirety.

Figure 18:
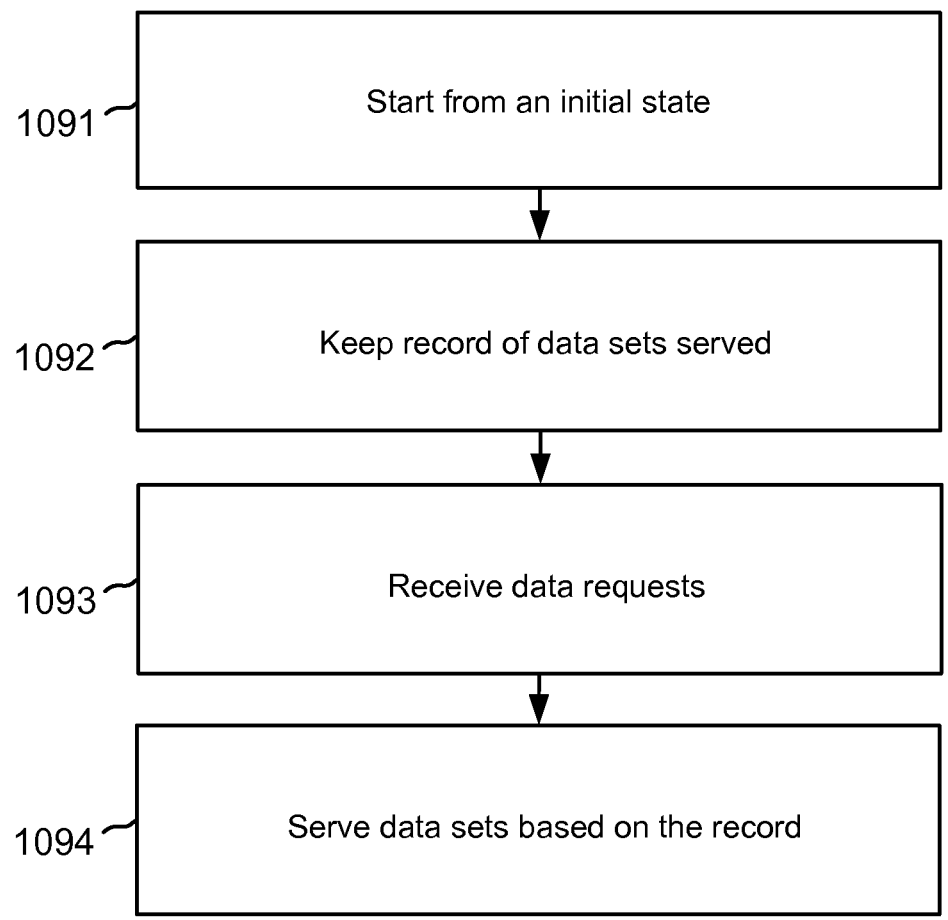
FIG. 18 illustrates one embodiment of a method for storing and sending data sets in conjunction with a plurality of memory modules.

FIG. 18 illustrates one embodiment of a method for storing and sending data sets in conjunction with a plurality of memory modules. In step 1091, a system is configured in an initial state in which a plurality of data sets 712-D1, 712-D2, 712-D3, 712-D4, 712-D5, 712-D6 belonging to a first data corpus are stored among a plurality of memory modules 540-m1, 540-m2, 540-mk, and such memory modules are associated, respectively, with a plurality of data interfaces 523-1, 523-2, 523-k, such that each of the plurality of data sets is stored only once in only one of the plurality of memory modules. In step 1092, each of the data interfaces 523-1, 523-2, 523-k, respectively, keeps a record 723-R1, 723-R2, 723-Rk about (i) which of the plurality of data sets are stored in the respective memory modules associated with the various data interfaces and (ii) which of the various data sets were served by the data interface to any one of the compute elements 700-c1, 700-c2, 700-cn. In step 1093, each of the data interfaces, 523-1, 523-2, 523-k, receives data request such as 7DR1, 7DR2, 7DR3, from any one of the plurality of compute elements 700-c1, 700-c2, 700-cn. In step 1094, each of the data interfaces selects and serves, as a response to each of the data requests received by that data interface, one of the data sets, wherein the data set selected is stored in a memory module associated with that data interface, and wherein the data interface knows and guarantees that the data set served as a response was not previously served by the data interface since the start of the initial state. For example, data interface 523-1 might serve, as a response to receiving data request 7DR1, one data set such as 712-D1, where that data set is stored in a memory module 540-m1 associated with data set 523-1, and the selection of that data set 712-D1 is based on the record 723-R1 kept by the data interface 523-1 which indicates that this data set 712-D1 has not been previously sent as a response since the start of the initial state. In some embodiments, eventually all of the data sets 712-D1, 712-D2, 712-D3, 712-D4, 712-D5, 712-D6, are served distributively to the plurality of compute elements 700-c1, 700-c2, 700-cn, thereby allowing the plurality of compute elements to distributively process the entire first data corpus.

In one alternative embodiment to the method just described, further the plurality of data sets is a plurality of values associated with a respective plurality of keys, and the data requests are requests for the values associated with the keys. For example, a plurality of values, 618-v1, 618-v2, 618-v3 (all from FIG. 13A), may be associated respectively with a plurality of keys, e.g. 618-k1, 618-k2, 618-k3 (all from FIG. 13A), and the data requests are requests for the values associated with the keys.

In one possible configuration of the alternative embodiment just described, the plurality of compute elements 700-c1, 700-c2, 700-cn, do not need to keep track of which values have already been served because a record of served values is already kept by each data interface. Therefore, the requests do not need to specify specific keys or values, because the data interfaces already know which keys and values can still be served to the plurality of compute elements.

Figure 19A:
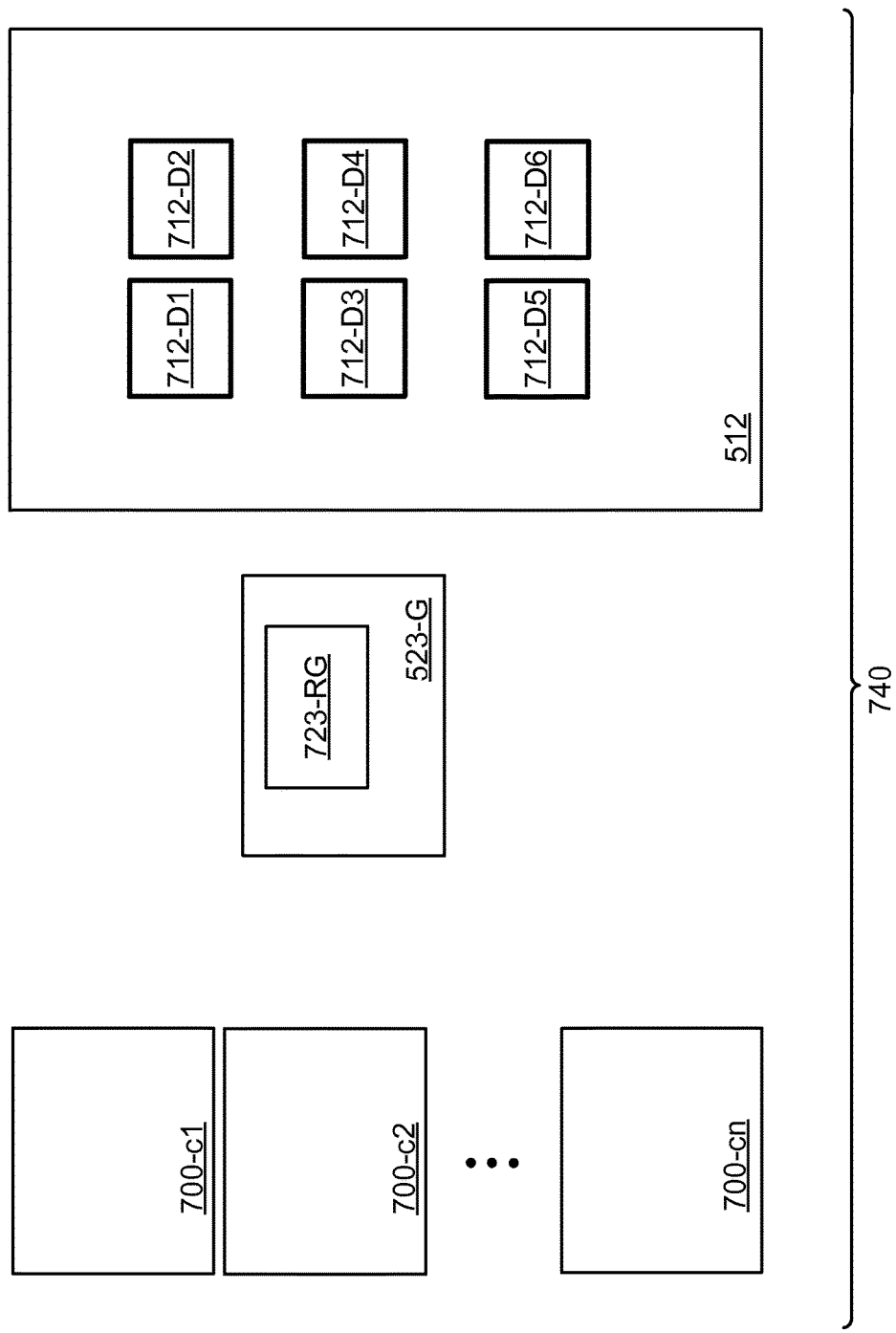
FIG. 19A illustrates one embodiment of a system operative to achieve load balancing among a plurality of compute elements accessing a shared memory pool.

FIG. 19A illustrates one embodiment of a system 740 operative to achieve load balancing among a plurality of compute elements 700-c1, 700-c2, 700-cn, accessing a shared memory pool 512. The system 740 includes a first data interface 523-G that is communicatively connected to both the compute elements 700-c1, 700-c2, 700-cn and the shared memory pool 512. The shared memory pool 512 includes a plurality of data sets 712-D1, 712-D2, 712-D3, 712-D4, 712-D5, 712-D6 which comprise a data corpus related to a particular task to be processed by the compute elements 700-c1, 700-c2, 700-cn. The data sets 712-D1, 712-D2, 712-D3, 712-D4, 712-D5, 712-D6 may be stored in the shared memory pool 512 in any manner, including individually as shown in FIG. 19A, or within various memory modules not shown in FIG. 19A, or in a combination in which some of the various data sets are stored individually while others are stored in memory modules. Upon receiving requests from the compute elements 700-c1, 700-c2, 700-cn for data sets related to a particular task being processed by the compute elements 700-c1, 700-c2, 700-cn, the first data interface 523-G extracts the data sets 712-D1, 712-D2, 712-D3, 712-D4, 712-D5, 712-D6 from the shared memory pool 512 and serves them to the compute elements 700-c1, 700-c2, 700-cn. The rate at which the first data interface 523-G extracts and serves data sets to a particular compute element is proportional to the rate at which that compute elements requests to receive data sets, and each compute element may request data sets as the compute element finishes processing of an earlier data set and becomes available to receive and process additional data sets. Thus, the first data interface 523-G, by extracting and serving data sets in response to specific data requests, helps achieve a load balancing of processing among the various compute elements 700-c1, 700-c2, 700-cn, such that there is a balance between available capacity for processing and the receipt of data sets to be processed, such that utilization of system capacity for processing is increased. The first data interface 523-G includes an internal registry 723-RG that is configured to keep track of which of the data sets 712-D1, 712-D2, 712-D3, 712-D4, 712-D5, 712-D6 have been extracted from the shared pool 512 and served to the compute elements 700-c1, 700-c2, 700-cn. The first data interface 523-G may extract and serve each of the data sets 712-D1, 712-D2, 712-D3, 712-D4, 712-D5, 712-D6 exactly once, thereby insuring that no data set is processed multiple times.

Figure 19B:
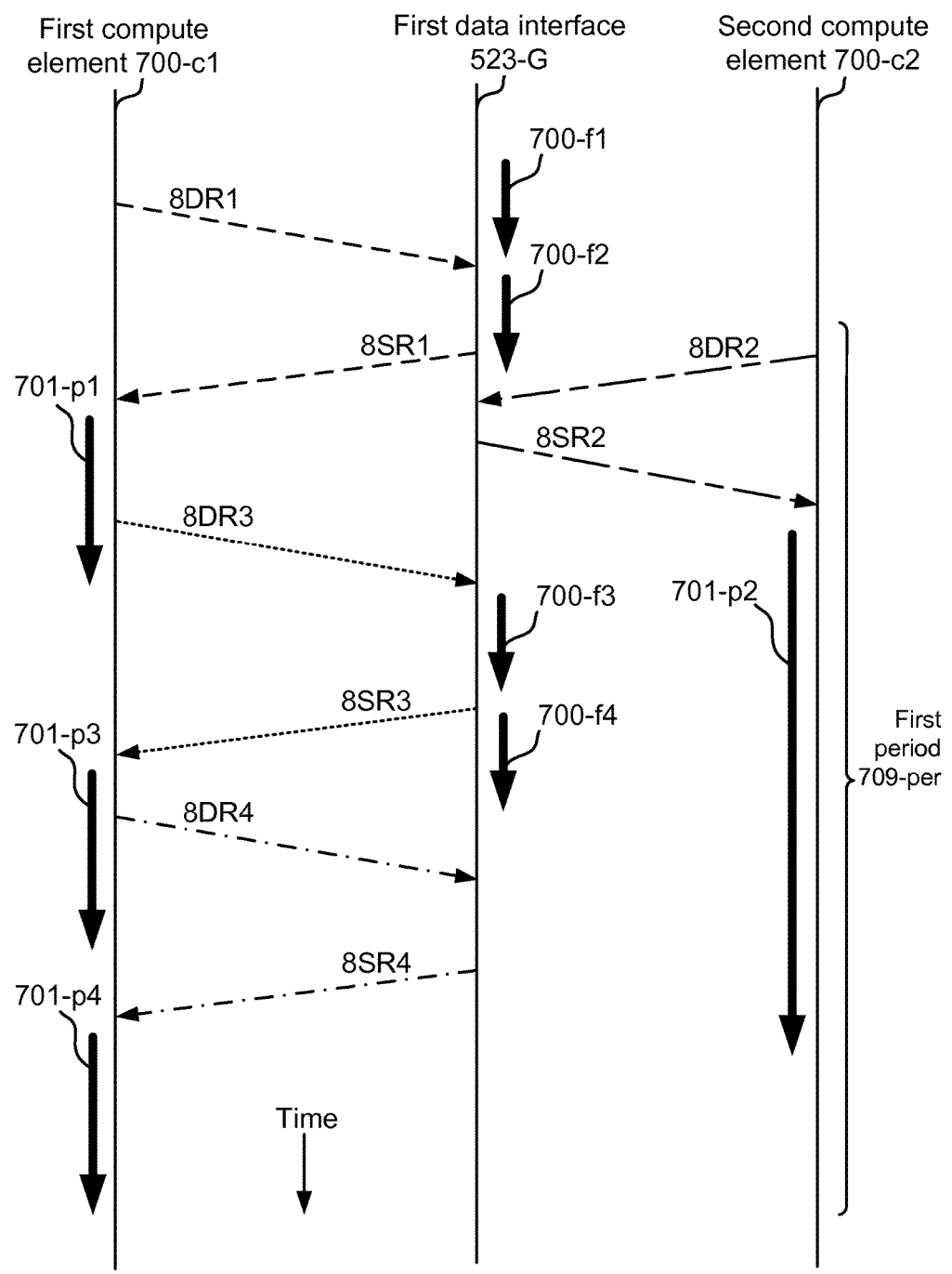
FIG. 19B illustrates one embodiment of a system including multiple compute elements and a first data interface, in which the system is operative achieve load balancing by serving data sets to the compute elements proportional to the rate at which the compute elements request data sets for processing.

FIG. 19B illustrates one embodiment of a system 740 including multiple compute elements 700-c1, 700-c2 and a first data interface 523-G, in which the system 740 is operative achieve load balancing by serving data sets to the compute elements 700-c1, 700-c2 proportional to the rate at which the compute elements 700-c1, 700-c2 request data sets for processing. As it becomes or is about to become available to process additional data sets, the first compute element 700-c1 sends a first data request 8DR1 to the first data interface 523-G. The first data interface 523-G concludes, based on information in the internal registry 723-RG, that a first data set 712-D1 is the next for processing, so the first data interface 523-G extracts 700-f1 the first data set 712-D1 from the shared memory 512, serves 8SR1 the first data set 712-D1 to the first compute element 700-c1, and updates the internal registry 723-RG to reflect the serving of the first data set. The first compute element 700-c1 continues to perform processing 701-p1 of data sets related to the task, here by processing the first data set received in response 8SR1. As it becomes available or is about to become available to process additional data sets, the second compute element 700-c2 sends a second data request 8DR2 to the first data interface 523-G. The first data interface 523-G concludes, based on information in the internal registry 723-RG, that the first data set has already been served to one of the compute elements but a second data set is the next for processing, so the first data interface 523-G extracts 700-f2 the second data set 712-D2 from the shared memory 512, serves 8SR2 the second data set to the second compute element 700-c2, and updates the internal registry 723-RG to reflect the serving of the second data set. The second compute element 700-c2 continues to perform processing 701-p2 of data sets related to the task, here by processing the second data set received in response 8SR2.

As it becomes available or is about to become available to process additional data sets, the first compute element 700-c1 sends a third data request 8DR3 to the first data interface 523-G. The first data interface 523-G concludes, based on information in the internal registry 723-RG, that the first and second data sets have already been served to the compute elements but a third data set is next for processing, so the first data interface 523-G extracts 700-f3 the third data set 712-D3 from the shared memory 512, serves 8SR3 the third data set to the first compute element 700-c1, and updates the internal registry 723-RG to reflect the serving of the third data set. The first compute element 700-c1 continues to perform processing 701-p3 of data sets related to the task, here by processing the third data set received in response 8SR3.

As it becomes available or is about to become available to process additional data sets, the first compute element 700-c1 sends a fourth data request 8DR4 to the first data interface 523-G. The first data interface 523-G concludes, based on information in the internal registry 723-RG, that the first, second, and third data sets have already been served to the compute elements but a fourth data set is next for processing, so the first data interface 523-G extracts 700-f4 the fourth data set 712-D4 from the shared memory 512, serves 8SR4 the fourth data set to the first compute element 700-c1, and updates the internal registry 723-RG to reflect the serving of the fourth data set. The first compute element 700-c1 continues to perform processing 701-p4 of data sets related to the task, here by processing the third data set received in response 8SR4.

It is understood that in all of the steps described above, the compute elements 700-c1, 700-c2 can process data sets only after they have received such data sets from the first data interface 523-G. The first data interface 523-G, however, has at least two alternative modes for fetching and sending data sets to the compute elements 700-c1, 700-c2. In one mode, the first data interface 523-G fetches a data set only after it has received a data request from one of the compute elements. This mode is reflected in element 700-f3, in which the first data interface 523-G first receives a data request 8DR3 from the first compute element 700-c1, the first data interface 523-G then fetches 700-f3 the third data set, and the first data interface 523-G then serves 8SR3 third data set to the first compute element 700-c1. In a second mode, the first data interface 523-G first fetches the next available data set before the first data interface 523-G has received any data request from any of the compute elements, so the first data interface 523-G is ready to serve the next data set immediately upon receiving the next data request from one of the compute elements 700-c1, 700-c2. This mode is illustrated in 700-f1, in which the first data interface 523-G fetches a first data set prior to receiving the first data request 8DR1 from the first compute element 700-c1, in 700-f2, in which the first data interface 523-G fetches a second data set prior to receiving the second data request 8DR2 from the second compute element 700-c2, and in 700-f4, in which the first data interface 523-G fetches a fourth data set prior to receiving the fourth data request 8DR4 from the first compute element 700-c1. By this second mode, there is no loss of time that might have resulted if the first data interface 523-G were fetching a data set while the requesting compute element was waiting for data.

FIG. 19B illustrates a time line, in which time begins at the top and continues towards the bottom. In one embodiment, over a first period 709-*per*, the first compute element 700-*c*1 issues exactly three data requests 8DR1, 8DR3, and 8DR4, receiving respectively responses 8SR1, 8SR3, and 8SR4 which include, respectively, a first data set 712-D1, a third data set 712-D3, and a fourth data set 712-D4, which the first compute element 700-*c*1 then processes, 701-*p*1, 701-*p*3, 701-*p*4, respectively. The first compute element 700-*c*1 does not issue additional data requests during the first period 709-*per*, because the first compute element 700-*c*1 will not be able to process received data within the time of 709-*per*. In one embodiment, 8DR3 is issued only after 701-*p*1 is done or about to be done, and 8DR4 is issued only after 701-*p*3 is done or about to be done, such that the first compute element 700-*c*1 issues data requests at a rate that is associated with the processing capabilities or availability of the first compute element 700-*c*1.

In one embodiment, over the same first period 709-*per*, the second compute element 700-*c*2 issues only one data request 8DR2, because the corresponding processing 701-*p*2 of the corresponding second data set 712-*d*2 requires long time, and further processing by the second compute element 700-*c*2 will not fit within the time period of 709-*per*. In this way, the second compute element 700-*c*2 issues data requests at a rate that is associated to the processing capabilities or availability of the second compute element 700-*c*2.

As explained above, each of the first compute element 700-*c*1 and the first compute element 700-*c*2 issues data requests in accordance with its processing capabilities or availability within a given time period. It is to be understood that data requests, receiving of data sets, and processing of data sets by the compute elements 700-*c*1 and 700-*c*2 are not synchronized, and therefore are unpredictably interleaved. Further, the compute elements 700-*c*1, 700-*c*2 are not aware of exactly which data set is received per each data request, but the compute elements 700-*c*1, 700-*c*2 do not request specific data sets, do not make the selection of which data sets they will receive, and do not know which data sets have been received from the first data interface 523-G. It is the first data interface 523-G that decides which data sets to serve based on the records kept in the internal registry 723-RG, the data sets selected have never yet been served to the compute element 700-*c*1, 700-*c*2, and the data sets are served by the first data interface 523-G in response to specific data requests from the compute elements 700-*c*1, 700-*c*2. The keeping of records in the internal registry 723-RG and the selection of data sets to be served based on those records, allows the achievement of load balancing among the various compute elements 700-*c*1, 700-*c*2, and this is true whether or not the various compute elements have the same processing capabilities or processing availabilities.

One embodiment is a system 740 operative to achieve load balancing among a plurality of compute elements 700-*c*1, 700-*c*2, 700-*cn* accessing a shared memory pool 512. One particular form of such embodiment includes a shared memory pool 512 configured to store and serve a plurality of data sets 712-D1, 712-D2, 712-D3, 712-D4, 712-D5, 712-D6 comprising at least a first data set 712-D1 and a second data set 712-D2; a first data interface 523-G configured to extract and serve any of the plurality of data sets 712-D1, 712-D2, 712-D3, 712-D4, 712-D5, 712-D6 from the shared memory pool 512, and comprising an internal registry 723-RG configured to keep track of the data sets extracted and served; and a plurality of compute elements 700-*c*1, 700-*c*2, 700-*cn* comprising at least a first compute element 700-*c*1 and a second compute element 700-*c*2, wherein the plurality of compute elements 700-*c*1, 700-*c*2 are communicatively connected with the first data interface 523-G, and the plurality of compute elements 700-*c*1, 700-*c*2 are configured to execute distributively a first task associated with the plurality of data sets 712-D1, 712-D2, 712-D3, 712-D4, 712-D5, 712-D6. Further, the first compute element 700-*c*1 is configured to send a first data request 8DR1 to the first data interface 523-G after deciding that the first compute element is currently available or will be soon available to start or continue contributing to execution of the task (i.e., processing one of the data sets), and the first data interface 523-G is configured to (i) conclude, according to the records kept in the internal registry 723-RG, that the first data set 712-D1 is next for processing, (ii) extract 700-*f*1 the first data set 712-D1 from the shared memory pool 512, (iii) serve 8SR1 the first data set extracted to the first compute element 700-*c*1 for performing said contribution 701-*p*1 (i.e., processing data set 712-D1), and (iv) update the internal registry 723-RG to reflect the serving of the first data set 712-D1 to the first compute element 700-*c*1. Further, the second compute element 700-*c*2 is configured to send a second data request 8DR2 to the first data interface 523-G after deciding that the second compute element 700-*c*2 is currently available or will be soon available to start or continue contributing to execution of the task, and the first data interface 523-G is configured to (i) conclude, according to the internal registry 723-RG reflecting that the first data set 712-D1 has already been served, that the second data set 712-D2 is next for processing, (ii) extract 700-*f*2 the second data set from the shared memory pool 512, (iii) serve 8SR2 the second data set extracted to the second compute element 700-*c*2 for performing the contribution 701-*p*2 (i.e., processing data set 712-D2), and (iv) update the internal registry 723-RG to reflect the serving of the second data set 712-D2 to the second server 700-*c*2. As herein described, the decisions regarding the availabilities facilitate the load balancing in conjunction with the executing distributively of the first task, all without the plurality of compute elements 700-*c*1, 700-*c*2, 700-*cn* being aware of the order in which the plurality of data sets are extracted and served by the first data interface 523-G.

In one alternative embodiment to the system just described, further the plurality of data sets further comprises at least a third data set 712-D3. Also, the first compute element 700-*c*1 is further configured to send a next data request 8DR3 to the first data interface 523-G after deciding that the first compute element 700-*c*1 is currently available or will be soon available to continue contributing to the execution of the task, and the first data interface 523-G is configured to (i) conclude, according to the internal registry 723-RG, that the third data set 712-D3 is next for processing, (ii) extract 700-13 the third data set from the shared memory pool 512, (iii) serve 8SR3 the third data set extracted to the first compute element 700-*c*1 for performing the contribution 701-*p*3 (i.e., processing data set 712-D3), and (iv) update the internal registry 723-RG to reflect the serving of the third data set 712-D3.

In one possible configuration of the first alternative embodiment just described, further the next data request 8DR3 is sent only after the first compute element 700-*c*1 finishes the processing 701-*p*1 of the first data set 712-D1, thereby further facilitating said load balancing.

In a second possible configuration of the first alternative embodiment just described, further the first data request 8DR1 and next data request 8DR3 are sent by the first compute element 700-c1 at a rate that corresponds to a rate at which the first compute element 700-c1 is capable of processing 701-p1, 701-p3 the first data set 712-D1 and the third data set 712-D3, thereby further facilitating said load balancing.

In a second alternative embodiment to the above described system 740 operative to achieve load balancing among a plurality of compute elements 700-c1, 700-c2, 700-cn accessing a shared memory pool 512, further the concluding and the updating guarantee that no data set is served more than once in conjunction with the first task.

In a third alternative embodiment to the above described system 740 operative to achieve load balancing among a plurality of compute elements 700-c1, 700-c2, 700-cn accessing a shared memory pool 512, further the conclusion by said first data interface 523-G regarding the second data set 712-D2 is made after the second data request 8DR2 has been sent, and as a consequence of the second data request 8DR2 being sent.

In a fourth alternative embodiment to the above described system 740 operative to achieve load balancing among a plurality of compute elements 700-c1, 700-c2, 700-cn accessing a shared memory pool 512, further the conclusion by the first data interface 523-G regarding the second data set 712-D2 is made as a result of the first data set 712-D1 being served 8SR1, and before the second data request 8DR2 has been sent, such that by the time the second data request 8DR2 has been sent, the conclusion by the first data interface 523-G regarding the second data set 712-D2 has already been made.

In a fifth alternative embodiment to the above described system 740 operative to achieve load balancing among a plurality of compute elements 700-c1, 700-c2, 700-cn accessing a shared memory pool 512, further the extraction 700-f2 of the second data set 712-D2 from the shared memory pool 512 is done after the second data request 8DR2 has been sent, and as a consequence of the second data request 8DR2 being sent.

In a sixth alternative embodiment to the above described system 740 operative to achieve load balancing among a plurality of compute elements 700-c1, 700-c2, 700-cn accessing a shared memory pool 512, further the extraction 700-f2 of the second data set 712-D2 from the shared memory pool 512 is done as a result of the first data set 712-D1 being served 8SR1, and before the second data request 8DR2 has been sent, such that by the time the second data request 8DR2 has been sent, the second data set 712-D2 is already present in the first data interface 523-G and ready to be served by the first data interface 523-G to a compute element.

Figure 20:
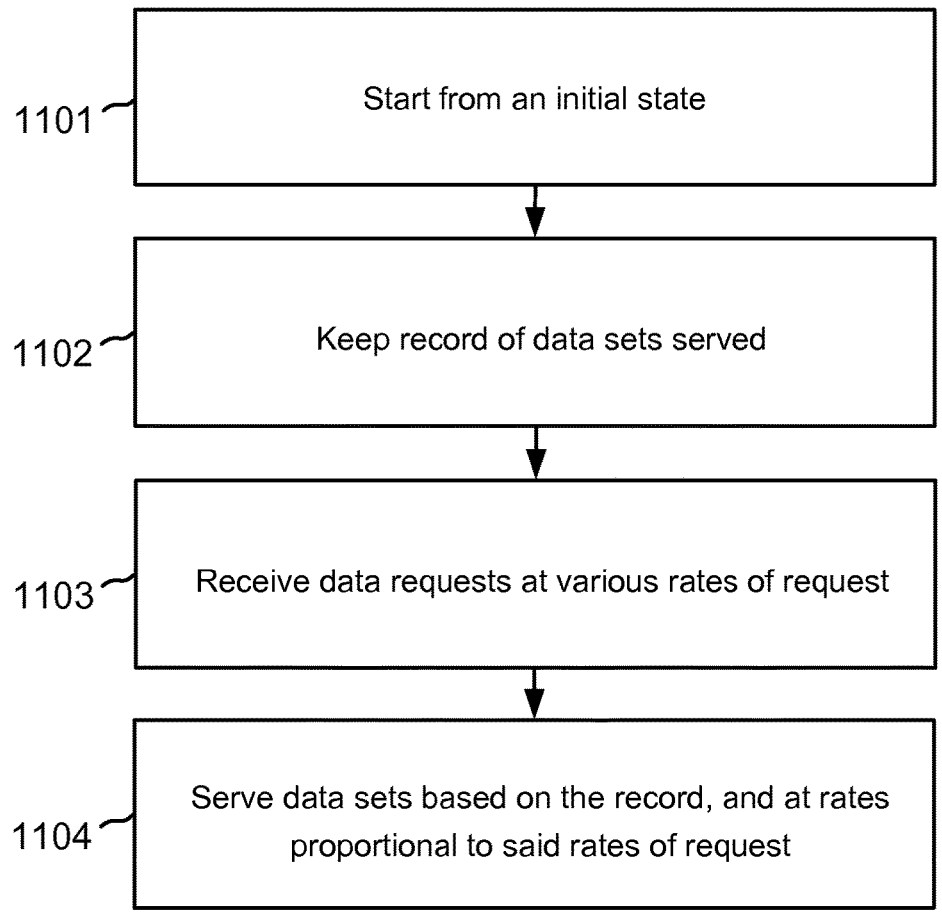
FIG. 20 illustrates one embodiment of a method for load balancing a plurality of compute elements accessing a shared memory pool.

FIG. 20 illustrates one embodiment of a method for load balancing a plurality of compute elements accessing a shared memory pool. In step 1101, a system is configured in an initial state in which a plurality of data sets 712-D1, 712-D2, 712-D3, 712-D4, 712-D5, 712-D6 belonging to a first data corpus are stored in a shared memory pool 512 associated with a first data interface 523-G, such that each of the plurality of data sets is stored only once. In step 1102, the internal registry 723-RG of a first data interface 523-G keeps a record about which of the plurality of data sets 712-D1, 712-D2, 712-D3, 712-D4, 712-D5, 712-D6 are stored in the shared memory pool 512 and which of the plurality of data sets 712-D1, 712-D2, 712-D3, 712-D4, 712-D5, 712-D6 were served by the first data interface 523-G to any one of the plurality of compute elements 700-c1, 700-c2, 700-cn. In step 1103, the first data interface 523-G receives data requests 8DR1, 8DR2, 8DR3, 8DR4 from any of plurality of compute elements 700-c1, 700-c2, 700-cn, in which the rates of request from the various compute elements 700-c1, 700-c2, 700-cn may vary based on factors such as the processing capabilities of the various compute elements 700-c1, 700-c2, 700-cn and the availability of processing time and resources given the various processing activities being executed by each of the compute elements 700-c1, 700-c2, 700-cn. In step 1104, in response to the each of the data requests sent by a compute element and received by the first data interface 523-G, the first data interface 523-G serves one of the data sets 712-D1, 712-D2, 712-D3, 712-D4, 712-D5, 712-D6 that is stored in the shared memory pool 512 and that is selected for sending to the compute element making the data request, where the data set is selected and served on the basis of the records kept in the internal registry 723-RG such that the data set served is guaranteed not to have been sent previously by the first data interface 523-G since the start from the initial state of the system 740. For example, the first data interface 523-G may select and serve, based on the records kept in the internal registry 723-RG, the second data set 712-D2 to be sent in response to a second data request 8DR2 from the second compute element 700-c2, wherein the records kept in internal registry 723-RG guarantee that this second data set 712-D2 has not yet been served to any of the compute elements 700-c1, 700-c2, 700-cn. The results are that (i) each data set is served by the first data interface 523-G and processed by one of the compute elements only once; and (ii) each of the plurality of compute elements 700-c1, 700-c2, 700-cn is served data at a rate that is proportional to the rate at which such compute element makes data requests. This proportionality, and the serving of data sets in direct relation to such proportionality, means that load balancing is achieved among the plurality of compute elements 700-c1, 700-c2, 700-cn.

In one alternative embodiment to the method just described, further the initial state is associated with a first task to be performed by the plurality of compute elements 700-c1, 700-c2, 700-cn in conjunction with the first data corpus, and the initial state is set among the first data interface 523-G and the plurality of compute elements 700-c1, 700-c2, 700-cn in conjunction with the first task, thereby allowing the keeping record, receiving, and serving to commence.

In one possible configuration of the alternative embodiment just described, said record keeping, receiving, and serving allow the plurality of compute elements 700-c1, 700-c2, 700-cn to distributively perform the first task, such that each of the plurality of compute elements 700-c1, 700-c2, 700-cn performs a portion of the first task that is determined by the compute element itself according to the rate at which that compete element is making data requests to the first data interface 523-G.

In one possible variation of the configuration just described, the rate at which each compute element makes data requests is determined by the compute element itself according to the present load on the compute element or the availability of computational capability of the compute element.

In one option of the variation just described, the data requests 8DR1, 8DR2, 8DR3, 8DR4 do not specify specific identities of the data sets 712-D1, 712-D2, 712-D3, 712-D4, 712-D5, 712-D6 to be served, such that the specific identities of the data sets served are determined solely by the first data interface 523-G according to the records kept by the internal registry 723-RG, thereby allowing the plurality of compute elements 700-c1, 700-c2, 700-cn to perform the first task asynchronously, thereby allowing the plurality of compute elements 700-c1, 700-c2, 700-cn to achieve load balancing efficiently.

In a second possible configuration of the alternative embodiment described above, the receiving of data requests and the serving of data sets in response to the data requests, end when the entire first data corpus has been served to the plurality of compute element 700-c1, 700-c2, 700-cn.

In a possible variation of the second configuration just described, the execution of the first task is achieved after the entire data corpus has been served to the plurality of compute elements 700-c1, 700-c2, 700-cn, and after each of the compute elements has processed all of the data sets that were served to that compute element by the first data interface 523-G.

In a third possible configuration of the alternative embodiment described above, further the first data interface 523-G performs on the plurality of data sets 712-D1, 712-D2, 712-D3, 712-D4, 712-D5, 712-D6 a pre-processing activity associated with the first task, after the extracting 700-f1, 700-f2, 700-f3, 700-f4 of the data sets and prior to the serving 8SR1, 8SR2, 8SR3, 8SR4 of the data sets.

Figure 21A:
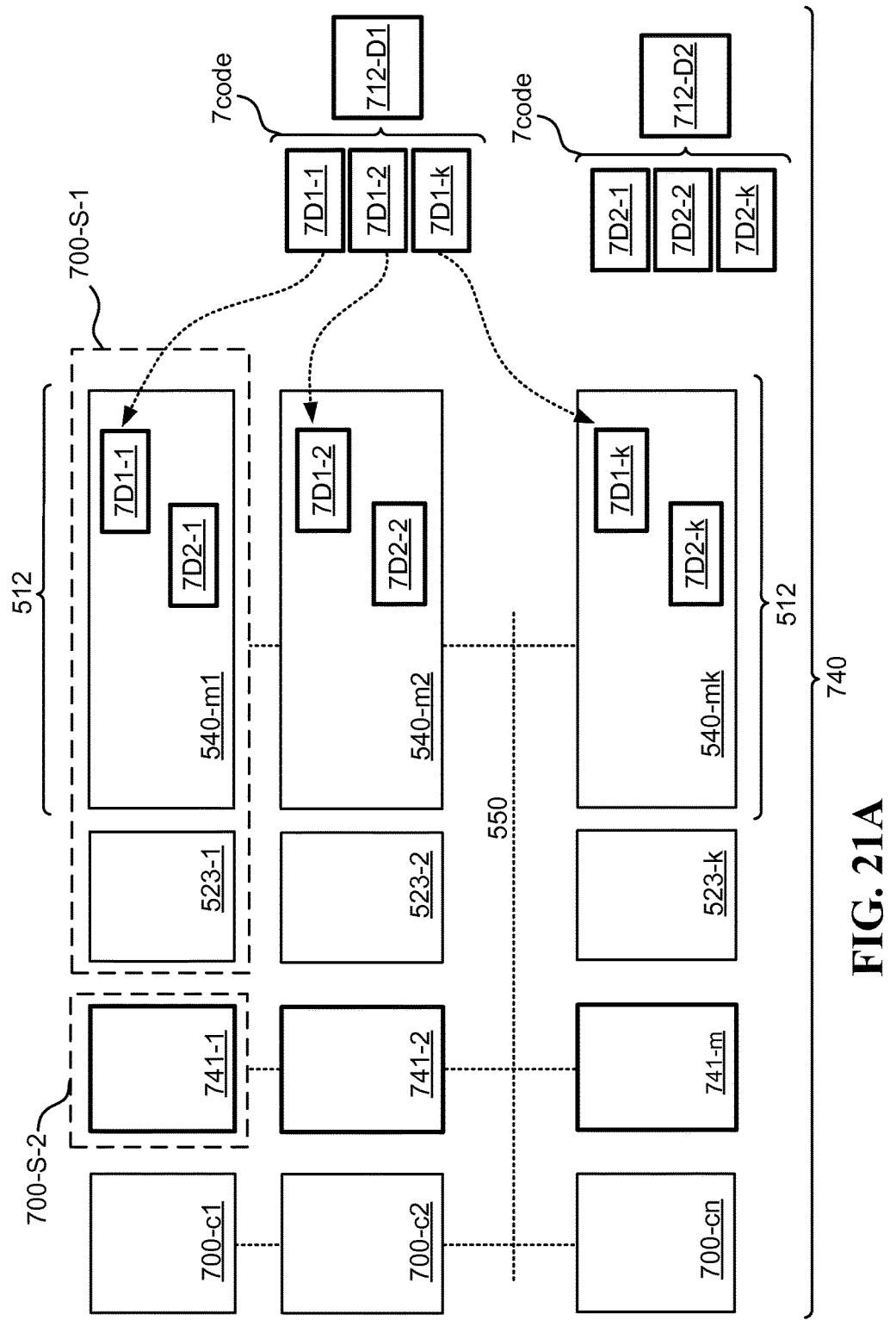
FIG. 21A illustrates one embodiment of a system operative to achieve data resiliency in a shared memory pool.

FIG. 21A illustrates one embodiment of a system 740 operative to achieve data resiliency in a shared memory pool 512. The system 740 includes multiple compute elements 700-c1, 700-c2, 700-cn, that execute various functions such as requesting data, receiving data, streaming request to write to memory, and processing data. The system 740 includes also multiple erasure-encoding interfaces 741-1, 741-2, 741-m, that execute various functions such as receiving data requests from compute elements, sending secondary data requests to data interfaces, receiving data fragments from data interfaces, reconstructing data sets, sending reconstructed data sets to compute elements as responses to requests for data, receiving streamed requests to write to memory, erasure-coding data sets into data fragments, creating multiple sub-streams of data fragments, and sending the sub-streams to memory modules to be added to memory. The system 740 includes also a shared memory pool 512 with multiple memory modules 540-m1, 540-m2, 540-mk, that execute various functions includes storing data sets in the form of data fragments. For example, as shown in FIG. 21A, a first data set 712-D1 has been coded 7code at the top into multiple data fragments 7D1-1, 7D1-2, 7D1-k, in which the various fragments are stored in different memory modules, first data fragment 7D1-1 in first memory module 540-m1, second data fragment 7D1-2 in second memory module 540-m2, and third data fragment 7D1-k in third memory module 540-mk. Similarly, FIG. 21A shows a second data set 712-D2 that has been coded 7code at the bottom into multiple data fragments 7D2-1, 7D2-2, 7D2-k, in which the various fragments are stored in different memory modules, first data fragment 7D2-1 in first memory module 540-m1, second data fragment 7D2-2 in second memory module 540-m2, and third data fragment 7D2-k in third memory module 540-mk Although only two data sets are shown in FIG. 21A, it is understood that there may be many more data sets in a system. Although each data set is shown in FIG. 21 to be coded into three data fragments, it is understood that any data set may be coded into two, four, or any higher number of data fragments. In the particular embodiment shown in FIG. 21A, there are at least two separate severs, a first server 700-S-1 that includes a first memory module 540-m1 and a first data interface 523-1, and a second server 700-S-2 that includes a first erasure-coding interface 741-1.

It should be understood that there may be any number of servers or other pieces of physical hardware in the system 740, and such servers or hardware may include any combination of the physical elements in the system, provided that the entire system 740 includes all of the compute elements 700-c1, 700-c2, 700-ck, all of the erasure-coding interfaces 741-1, 741-2, 741-k, all of the data interfaces 523-1, 523-2, 523-k, and all of the memory modules 540-m1, 540-m2, 540-mk, plus whatever other hardware elements have been added to the system 740. For example, one system might have a server including all of the memory modules and all of the data interfaces, a separate server including all of the erasure-coding interfaces, and a separate server including all of the compute elements. Or alternatively, there may be two more servers for the compute elements, and/or two or more servers for the erasure-coding interfaces, and/or two or more servers for the data interfaces and memory modules. In alternative embodiments, one or more compute elements may be co-located on a server with one or more erasure-coding interfaces and/or one or more data interfaces and memory modules, provided that all of the compute elements, erasure-coding interfaces, data interfaces, and memory modules are located on some server or other physical hardware.

Figure 21B:
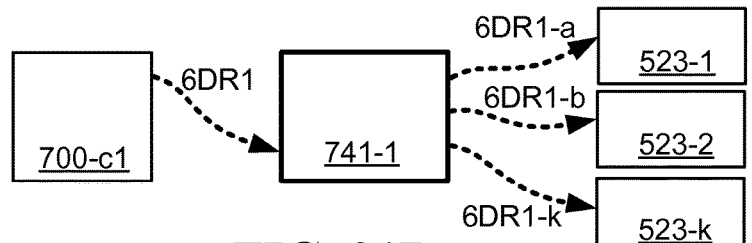
FIG. 21B illustrates one embodiment of a sub-system with a compute element making a data request to an erasure-encoding interface which converts the request to a plurality of secondary data requests and sends such secondary data requests to a plurality of data interfaces.

FIG. 21B illustrates one embodiment of a sub-system with a compute element 700-c1 making a data request 6DR1 to an erasure-encoding interface 741-1 which converts the request to a plurality of secondary data requests 6DR1-a, 6DR1-b, 6DR1-k, and sends such secondary data requests to a plurality of data interfaces 523-1, 523-2, 523-k. As shown, each secondary data request is sent to a separate data interface.

Figure 21C:
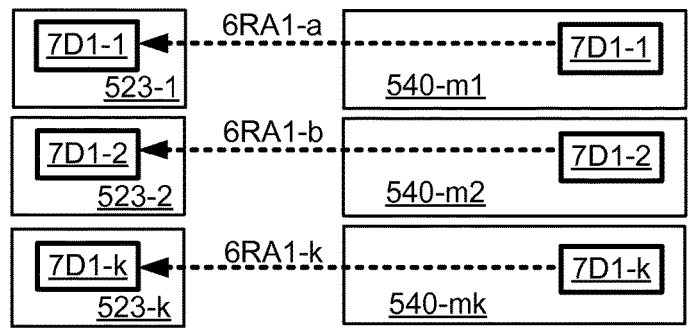
FIG. 21C illustrates one embodiment of a sub-system with the plurality of data interfaces using random-access read cycles to extract data fragments stored in associated memory modules.

FIG. 21C illustrates one embodiment of a sub-system with the plurality of data interfaces 523-1, 523-2, 523-k using random-access read cycles 6RA1-a, 6RA1-b, 6RA-k, to extract multiple data fragments 7D1-1, 7D1-2, 7D1-k stored in associated memory modules 540-m1, 540-m2, 540-mk In the embodiment illustrated in FIG. 21C, the data fragments are part of a data set 712-D1 not shown in FIG. 21C. In the embodiment illustrated in FIG. 21C, the data fragments are stored in random access memory (RAM), which means that the data interfaces extract and fetch the data fragments very quickly using a random access read cycle or several random access read cycles. In the embodiment shown in FIG. 21C, exactly one data interface is associated with exactly one memory module in order to support simultaneity in accessing the various data fragments 7D1-1, 7D1-2, 7D1-k, but in alternative embodiments the various data interfaces and memory modules may be associated otherwise, provided however that the multiple data fragments 7D1-1, 7D1-2, 7D1-k may be extracted in parallel by a plurality of data interfaces, such that the multiple data fragments 7D1-1, 7D1-2, 7D1-k may be fetched quickly by the various data interface, and possibly during several clock cycles in which the various data interfaces access the various memory modules in parallel using simultaneous random access read cycles. Such simultaneity in random access is critical for achieving low latency that is comparable to latencies associated with randomly accessing uncoded data stored in RAM.

Figure 21D:
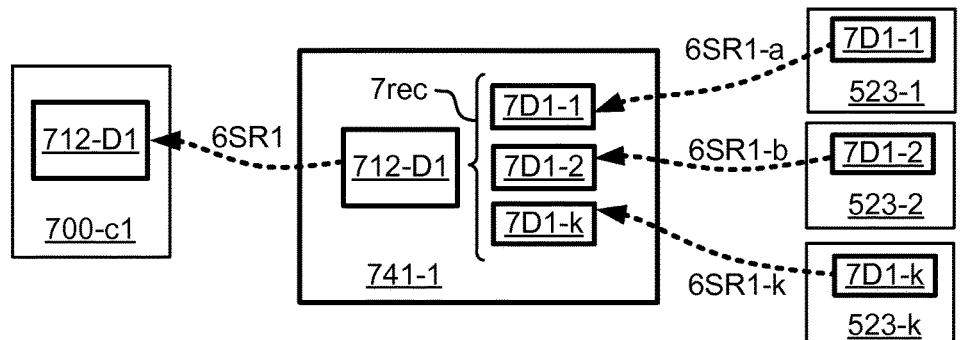
FIG. 21D illustrates one embodiment of a sub-system with the plurality of data interfaces sending, as responses to the secondary data requests, data fragments to the erasure-coding interface which reconstructs the original data set from the data fragments and sends such reconstructed data set to the compute element as a response to that compute element's request for data.

FIG. 21D illustrates one embodiment of a sub-system with the plurality of data interfaces 523-1, 523-2, 523-k, sending, as responses 6SR1-a, 6SR1-b, 6SR1-k to a secondary data requests 6DR1-a, 6DR1-b, 6DR1-k (shown in FIG. 21B), data fragments 7D1-1, 7D1-2, 7D1-k to an erasure-coding interface 741-1 which reconstructs 7rec the original data set 712-D1 from the data fragments and sends such reconstructed data set 712-D1 to a compute element 700-c1 as a response 6SR-1 to that compute element's request for data 6DR-1 (shown in FIG. 21B). The data fragments may be sent serially to the erasure-coding interface 741-1, which might be, for example, 7D1-1, then 7D1-2, then 7D1-$k$, then 7D2-1 (part of second data set 712-D2 shown in FIG. 21A), then 7D1-2 (part of data set 712-D2 shown in FIG. 21A), then 7D1-$k$ (part of data set 712-D2 shown in FIG. 21A). The data fragments 7D1-1, 7D1-2, 7D1-$k$ may be sent simultaneously to the erasure-coding interface 741-1 using a switching network such as switching network 550 (FIG. 21A), which may be selected from a group consisting of: (i) a non-blocking switching network, (ii) a fat tree packet switching network, and (iii) a cross-bar switching network, in order to achieve a low latency that is comparable to latencies associated with randomly accessing uncoded data stored in RAM. The erasure-coding interface 741-1 may reconstruct 7rec the data set 712-D1 even if one of the data fragments 7D1-1, 7D1-2, 7D1-$k$ is either missing or corrupted, and this is one aspect of data resiliency of the overall system 740. In the embodiment shown in FIG. 21D, all of the data interfaces are communicatively connected with a single erasure-coding interface 741-1 which is communicatively connected with exactly one compute element 700-$c1$, but in alternative embodiments the various data interfaces may be communicatively connected with various erasure-coding interfaces, and the various erasure-coding interfaces may be communicatively connected with various compute elements, through the switching network 550 discussed previously.

Figure 21E:
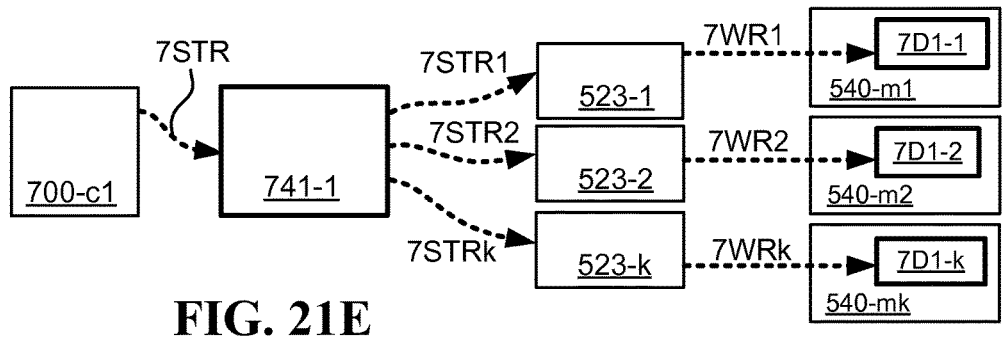
FIG. 21E illustrates one embodiment of a sub-system with a compute element streaming a data set to an erasure-coding interface which converts the data set into data fragments and streams such data fragments to multiple data interfaces, which then write each data fragment in real-time in the memory modules associated with the data interfaces.

FIG. 21E illustrates one embodiment of a sub-system with a compute element 700-$c1$ streaming 7STR a data set 712-D1 (shown in FIG. 21D) to an erasure-coding interface 741-1 which converts the data set into data fragments 7D1-1, 7D1-2, 7D1-$k$ and streams 7STR1, 7STR2, 7STR$k$ such data fragments to multiple data interfaces 523-1, 523-2, 523-$k$, which then write 7WR1, 7WR2, 7WR$k$ each data fragment in real-time in the memory modules 540-$m1$, 540-$m2$, 540-$mk$ associated with the data interfaces. The physical connection between the compute element 700-$c1$ and the erasure-coding interface, here in FIG. 21E or in any of the FIG. 21A, 21B, or 21D, may be a peripheral-component-interconnect-express (PCIE) computer expansion bus, an Ethernet connection, an Infiniband connection, or any other physical connection permitting high-speed transfer of data between the two physical elements, such as switching network 550. The coding of the data fragment streams 7STR1, STR2, STR$k$ by the erasure-coding interface 741-1 may be done very quickly, in "real-time". The data interfaces 523-1, 523-2, 523-$k$ write 7WR1, 7WR2, 7WR$k$ the data fragments 7D1-1, 7D1-2, 7D1-$k$ to the memory modules 540-$m1$, 540-$m2$, 540-$mk$ in RAM using fast random access cycles, which means that the writing process is very fast, possibly as fast as a single random access write cycle into a RAM.

One embodiment is a system 740 operative to achieve data resiliency in a shared memory pool 512. One particular form of such embodiment includes a plurality of memory modules 540-$m1$, 540-$m2$, 540-$mk$ belonging to a shared memory pool 512 and associated respectively with a plurality of data interfaces 523-1, 523-2, 523-$k$; a first erasure-coding interface 741-1 communicatively connected with the plurality of data interfaces 523-1, 523-2, 523-$k$; and a first compute element 700-$c1$ communicatively connected with the first erasure-coding interface 741-1. Further, the plurality of memory modules 540-$m1$, 540-$m2$, 540-$mk$ are configured to distributively store a plurality of data sets 712-D1, 712-D2, such that each data set is distributively stored among at least two of the memory modules in a form of a plurality of data fragments coded using a first erasure-coding scheme, and each data fragment is stored on a different one of the at least two memory modules. As an example, a first data set 712-D1 may include first data fragment 7D1-1 stored in first memory module 540-$m1$, second data fragment 7D1-2 stored in second memory module 540-$m2$, and third data segment 7D1-$k$ stored in third memory module 540-$mk$. As another example, as either a substitute for the first data set 712-D1, or in addition to the first data set 712-D1, there may be a second data set 712-D2, including a first data fragment 7D2-1 stored in first memory module 540-$m1$, a second data fragment 7D2-2 stored in second memory module 540-$m2$, and a third data segment 7D2-$k$ stored in third memory module 540-$mk$. Further, the first compute element 700-$c1$ is configured to send to the first erasure-coding interface 741-1 a request 6DR1 for one of the data sets. For example, the first erasure-encoding interface may request a first data set 712-D1. Further, the first erasure-coding interface 741-1 is configured to (i) convert the request into a first plurality of secondary data requests 6DR1-$a$, 6DR1-$b$, 6DR1-$k$; (ii) send the first plurality of secondary data requests, respectively, into at least a first sub-set of the plurality of data interfaces 523-1, 523-2, 523-$k$; (iii) receive as responses 6SR1-$a$, 6SR1-$b$, 6SR1-$k$ at least a sub-set of the plurality of data fragments 7D1-1, 7D1-2, 7D1-$k$ associated with the one of the data sets 712-D1; (iv) reconstruct 7rec the one of the data sets 712-D1, using the first erasure-coding scheme, from the data fragments received 7D1-1, 7D1-2, 7D1-$k$; and (v) send the reconstruction to the first compute element 700-$c1$ as a response 6SR1 to the request 6DR1 made. Further, each of the plurality of data interfaces, that is, each of 523-1, 523-2, 523-$k$, is configured to (i) receive, from the first erasure-coding interface 741-1, one of the plurality of secondary data requests (such as, for example secondary data request 6DR1-$a$ received at first date interface 523-1); (ii) extract, from the respective memory module (such as, for example, from first memory module 540-$m1$ associated with first data interface 523-1), using a random-access read cycle 6RA1-$a$, one of the data fragments 7D1-1 associated with the one secondary data request; and (iii) send 6SR1-$a$ the data fragment 7D1-1 extracted to the first erasure-coding interface 741-1 as part of the responses received by the first erasure-coding interface 741-1.

In a first alternative embodiment to the system just described, further one of the plurality of memory modules 540-$m1$ and its associated data interface 523-1 are located in a first server 700-S-1. Further, the first erasure-coding interface 741, the first compute element 700-$c1$, others of the plurality of memory modules 540-$m2$, 540-$mk$, and others of the associated data interfaces 523-2, 523-$k$, are all located outside the first server 700-S-1. The ultimate result is that, due to the uses of the first erasure-coding interface 741-1 and the first erasure-coding scheme, the system 740 is a distributed system that is configured to endure any failure in the first server 700-S-1, and further that the reconstruction 7rec is unaffected by the possible failure in the first server 700-S-1.

In one possible configuration of the first alternative embodiment just described, the system 740 includes also additional erasure-coding interfaces 741-2, 741-$m$, each configured to perform all tasks associated with the first erasure-coding interface 741-1, such that any failure of the first erasure-coding interface 741-1 still allows the system 740 to perform the reconstruction 7rec using at least one of the additional erasure-coding interfaces (such as the second erasure-coding interface 741-2) instead of the failed first erasure-coding interface 741-1.

In one possible variation of the configuration just described, further the first erasure-coding interface 741-1 is located in a second server 700-S-2, while the additional erasure-coding interfaces 714-2, 741-$m$, the first compute element 700-$c1$, the others of the plurality of memory modules 540-$m2$, 540-$mk$, and the associated data interfaces 523-2, 523-$k$, are all located outside said second server 700-S-2. The result is that the system 740 is further distributed, and is configured to endure any failure in the second server 700-S-2, such that the reconstruction 7$rec$ would still be possible even after a failure in the second server 700-S-2.

In a second alternative embodiment to the above-described system 740 operative to achieve data resiliency in a shared memory pool, the system 740 further includes additional erasure-coding interfaces 741-2, 741-$m$, each of which is configured to perform all tasks associated with the first erasure-coding interface 741-1. Further, the system 740 also includes additional compute elements 700-$c2$, 700-$cn$, each of which is configured to associate with at least one of the erasure-coding interfaces (for example, compute element 700-$c2$ with erasure-coding interface 741-2, and compute element 700-$cn$ with erasure-coding interface 741-$m$) in conjunction with erasure-coding transactions such as 7$rec$ and alike, associated with the plurality of memory modules 540-$m1$, 540-$m2$, 540-$mk$ and the plurality of data fragments 7D1-1, 7D1-2, 7D1-$k$, 7D2-1, 7D2-2, 7D2-$k$. As a result of the additions set forth in this second possible alternative, each of the plurality of compute elements, including the first compute element, is configured to receive one of the data sets 712-D1 reconstructed 7$rec$ using at least one of the additional erasure-coding interfaces 741-2, and also the shared memory pool 512 is configured to serve the plurality of data sets 712-D1, 712-D2 to the plurality of compute elements regardless of any failure in one of the memory modules 540-$m1$, 540-$m2$, 540-$mk$.

In one possible option for the second alternative embodiment just described, each erasure-coding interface 741-2, 741-2, 741-$m$ is associated with one of the compute elements 700-$c1$, 700-$c2$, 700-$cn$.

In another possible option for the second alternative embodiment just described, each of the compute elements 700-$c1$, 700-$c2$, 700-$cn$ can use any one or any combination of the erasure-encoding interfaces 741-2, 741-2, 741-$m$, thereby creating a resilient matrix of both data and erasure-coding resources, capable of enduring any single failure scenario in the system. In one possible option of this embodiment, the different elements in the resilient matrix are interconnected using a switching network or an interconnect fabric 550.

In one possible configuration of the second alternative embodiment, further the plurality of memory modules 540-$m1$, 540-$m2$, 540-$mk$ are based on dynamic-random-access-memory (DRAM), at least 64 (sixty four) memory modules are included in the plurality of memory modules, and the first erasure-coding interface 741-1 together with the additional erasure-coding interfaces 741-2, 741-$m$ are communicatively connected with the plurality of data interfaces 523-1, 523-2, 523-$k$ using a switching network 550 selected from a group consisting of: (i) a non-blocking switching network, (ii) a fat tree packet switching network, and (iii) a cross-bar switching network. One result of this possible configuration is a rate at which the data sets 712-D1, 712-D2 are being reconstructed 7$rec$ is at least 400 Giga-bits-per second.

In a third alternative embodiment to the above-described system 740 operative to achieve data resiliency in a shared memory pool, further the plurality of memory modules 540-$m1$, 540-$m2$, 540-$mk$ are based on random-access-memory (RAM), and therefore the random-access read cycles 6RA1-$a$, 6RA1-$b$, 6RA1-$k$ allow the extraction to proceed at data rates that support the first compute element 700-$c1$ in receiving said data sets 712-D1, 712-D2, after said reconstruction 7$rec$, at data rates that are limited only by the ability of the first compute element 700-$c1$ to communicate.

In one possible configuration of the third alternative embodiment, further the random-access-memory in memory modules 540-$m1$, 540-$m2$, 540-$mk$ is a dynamic-random-access-memory (DRAM), and the first erasure-coding interface 741-1 is communicatively connected with the plurality of data interfaces 523-1, 523-2, 523-$k$ using a switching network 550 selected from a group consisting of: (i) a non-blocking switching network, (ii) a fat tree packet switching network, and (iii) a cross-bar switching network. One result of this possible configuration is that a first period beginning in the sending of the request 6DR1 and ending in the receiving of the response 6SR1 to the request is bounded by 5 (five) microseconds. In one embodiment, said random-access read cycles 6RA1-$a$, 6RA1-$b$, 6RA-$k$ are done simultaneously, as facilitated by the plurality of data interfaces 523-1, 523-2, 523-$k$ acting together, thereby facilitating said bound of 5 (five) microseconds.

In a second possible configuration of the third alternative embodiment, further the random-access-memory in memory modules 540-$m1$, 540-$m2$, 540-$mk$ is a dynamic-random-access-memory (DRAM), and the first erasure-coding interface 741-1 is communicatively connected with the plurality of data interfaces 523-1, 523-2, 523-$k$ using a switching network 550 selected from a group consisting of: (i) a non-blocking switching network, (ii) a fat tree packet switching network, and (iii) a cross-bar switching network. One result of this possible configuration is that a rate at which the data sets 712-D2, 712-D2 are being reconstructed is at least 100 Giga-bits-per second.

In a fourth alternative embodiment to the above-described system 740 operative to achieve data resiliency in a shared memory pool, further the one of the data sets 712-D1 is a first value 618-$v1$ (illustrated in FIGS. 11A and 13A) associated with a first key 618-$k1$ (illustrated in FIGS. 11A and. 13A), and the first value 618-$v1$ is stored as one of the pluralities of data fragments 7D1-1, 7D1-2, 7D1-$k$ in the plurality of memory modules 540-$m1$, 540-$m2$, 540-$mk$. Further, the request 6DR1 for one of the data sets 712-D1 is a request for the first value 618-$v1$, in which the request 6DR1 conveys the first key 618-$k1$. Further, the first plurality of secondary data requests 6DR1-$a$, 6DR1-$b$, 6DR1-$k$ are requests for the one of the pluralities of data fragments 7D1-1, 7D1-2, 7D1-$k$, in which each of the requests for the one of the pluralities of data fragments conveys the first key 618-$k1$ or a derivative of the first key 618-$k1$ to the respective data interface 523-1, 523-2, 523-$k$. Further, the respective data interface 523-1, 523-2, 523-$k$ is configured to use the first key 618-$k1$ or a derivative of the first key to determine an address from which to perform said random access read cycles 6RA1-$a$, 6RA1-$b$, 6RA1-$k$.

One embodiment is a system 740 operative to stream data resiliently into a shared memory pool 512. One particular form of such embodiment includes a plurality of memory modules 540-$m1$, 540-$m2$, 540-$mk$ belonging to a shared memory pool 512 and associated respectively with a plurality of data interfaces 523-1, 523-2, 523-$k$, a first erasure-coding interface 741-1 communicatively connected with the plurality of data interfaces 523-1, 523-2, 523-k, and a first compute element 700-c1 communicatively connected with the first erasure-coding interface 741-1. Further, the first compute element 700-c1 is configured to stream 7STR a plurality of data sets 712-D1, 712-D2 into the first erasure-coding interface 741-1. Further, the first erasure-coding interface 741-1 is configured to (i) receive the stream; (ii) convert in real-time each of the plurality of data sets 712-D1, 712-D2 in the stream into a plurality of data fragments (for example, first plurality 7D1-1, 7D1-2, 7D1-k, and second plurality 7D2-1, 7D2-2, 7D2-k) using a first erasure-coding scheme; and stream each of the pluralities of data fragments respectively into the plurality of data interfaces (for example, 7D1-1, 7D1-2, and 7D1-k into 523-1, 523-2, and 523-k, respectively), such that a plurality of sub-streams 7STR1, 7STR2, 7STRk of data fragments are created in conjunction with the plurality of data interfaces. Further, each of the data interfaces 523-1, 523-2, 523-k is configured to (i) receive one of said sub-streams of data fragments (for example, 523-1 receiving sub-stream 7STR1 containing fragments 7D1-1 and 7D2-1), and (ii) write in real-time each of the data fragments in the sub-stream into the respective memory module (for example, into memory module 540-m1 associated with data interface 523-1) using a random-access write cycle 7WR1. One result of this embodiment is a real-time erasure-coding of the stream 7STR of data sets into the shared memory pool 512 as facilitated by the first erasure-coding interface 741-1 and multiple random-access write cycles 7WR1, 7WR2, 7WRk, each of which is associated with a data interface 523-1, 523-2, 523-k.

In an alternative embodiment to the system 740 just described to stream data resiliently into a shared memory pool 512, further the plurality of memory modules 540-m1, 540-m2, 540-mk are based on random-access-memory (RAM), and therefore the random-access write cycles 7WR1, 7WR2, 7WRk allow the writing to proceed at data rates that support the first compute element 700-c1 in writing the data sets 712-D1, 712-D2, after said conversion, at data rates that are limited only by the ability of the first compute element 700-c1 to communicate.

In one possible configuration of the alternative embodiment just described, further the random-access-memory 540-m1, 540-m2, 540-mk is a dynamic-random-access-memory (DRAM), and the first erasure-coding interface 741-1 is communicatively connected with the plurality of data interfaces 523-1, 523-2, 523-k using a switching network selected 550 from a group consisting of: (i) a non-blocking switching network, (ii) a fat tree packet switching network, and (iii) a cross-bar switching network. One result of this possible configuration is that any one of the data sets 712-D1, 712-D2 is written in the plurality of memory modules 540-m1, 540-m2, 540-mk no later than 5 (five) microseconds from being put in said stream 7STR. In one embodiment, said random-access write cycles 7WR1, 7WR2, 7WRk are done simultaneously, as facilitated by the plurality of data interfaces 523-1, 523-2, 523-k acting together, thereby facilitating said bound of 5 (five) microseconds.

In a second possible configuration of the alternative embodiment described above to the system 740 operative to stream data resiliently into a shared memory pool 512, further the random-access-memory 540-m1, 540-m2, 540-mk is a dynamic-random-access-memory (DRAM), and the first erasure-coding interface 741-1 is communicatively connected with the plurality of data interfaces 523-1, 523-2, 523-k using a switching network 550 selected from a group consisting of: (i) a non-blocking switching network, (ii) a fat tree packet switching network, and (iii) a cross-bar switching network. One result of this possible configuration is that a rate at which the data sets 712-D1, 712-D2 are being written is at least 100 Giga-bits-per second.

In this description, numerous specific details are set forth. However, the embodiments/cases of the invention may be practiced without some of these specific details. In other instances, well-known hardware, materials, structures and techniques have not been shown in detail in order not to obscure the understanding of this description. In this description, references to "one embodiment" and "one case" mean that the feature being referred to may be included in at least one embodiment/case of the invention. Moreover, separate references to "one embodiment", "some embodiments", "one case", or "some cases" in this description do not necessarily refer to the same embodiment/case. Illustrated embodiments/cases are not mutually exclusive, unless so stated and except as will be readily apparent to those of ordinary skill in the art. Thus, the invention may include any variety of combinations and/or integrations of the features of the embodiments/cases described herein. Also herein, flow diagram illustrates non-limiting embodiment/case example of the methods, and block diagrams illustrate non-limiting embodiment/case examples of the devices. Some operations in the flow diagram may be described with reference to the embodiments/cases illustrated by the block diagrams. However, the method of the flow diagram could be performed by embodiments/cases of the invention other than those discussed with reference to the block diagrams, and embodiments/cases discussed with reference to the block diagrams could perform operations different from those discussed with reference to the flow diagram. Moreover, although the flow diagram may depict serial operations, certain embodiments/cases could perform certain operations in parallel and/or in different orders from those depicted. Moreover, the use of repeated reference numerals and/or letters in the text and/or drawings is for the purpose of simplicity and clarity and does not in itself dictate a relationship between the various embodiments/cases and/or configurations discussed. Furthermore, methods and mechanisms of the embodiments/cases will sometimes be described in singular form for clarity. However, some embodiments/cases may include multiple iterations of a method or multiple instantiations of a mechanism unless noted otherwise. For example, a system may include multiple compute elements, each of which is communicatively connected to multiple servers, even though specific illustrations presented herein include only one compute element or a maximum of two compute elements.

Certain features of the embodiments/cases, which may have been, for clarity, described in the context of separate embodiments/cases, may also be provided in various combinations in a single embodiment/case. Conversely, various features of the embodiments/cases, which may have been, for brevity, described in the context of a single embodiment/case, may also be provided separately or in any suitable sub-combination. The embodiments/cases are not limited in their applications to the details of the order or sequence of steps of operation of methods, or to details of implementation of devices, set in the description, drawings, or examples. In addition, individual blocks illustrated in the figures may be functional in nature and do not necessarily correspond to discrete hardware elements. While the methods disclosed herein have been described and shown with reference to particular steps performed in a particular order, it is understood that these steps may be combined, subdivided, or reordered to form an equivalent method without departing from the teachings of the embodiments/cases. Accordingly, unless specifically indicated herein, the order and grouping of the steps is not a limitation of the embodiments/cases. Embodiments/cases described in conjunction with specific examples are presented by way of example, and not limitation. Moreover, it is evident that many alternatives, modifications and variations will be apparent to those skilled in the art. Accordingly, it is intended to embrace all such alternatives, modifications and variations that fall within the spirit and scope of the appended claims and their equivalents.

What is claimed is:

1. A system operative to achieve data resiliency in a shared memory pool, comprising:
   a plurality of random access memory modules belonging to a shared memory pool and associated respectively with a plurality of data interfaces;
   a first erasure-coding interface communicatively connected with said plurality of data interfaces using a switching network selected from a group consisting of: (i) a non-blocking switching network, (ii) a fat tree packet switching network, and (iii) a cross-bar switching network; and
   a first compute element communicatively connected with said first erasure-coding interface,
   wherein:
   said plurality of random access memory modules are configured to distributively store a plurality of data sets, such that each data set is distributively stored among at least two of the random access memory modules in a form of a plurality of data fragments coded using a first erasure-coding scheme, and each data fragment is stored on a different one of the at least two random access memory modules;
   said first compute element is configured to send to the first erasure-coding interface a request for one of the data sets;
   the first erasure-coding interface is configured to: convert said request into a first plurality of secondary data requests; send, via the switching network, said first plurality of secondary data requests respectively into at least a first sub-set of said plurality of data interfaces; receive as responses, via the switching network, at least a sub-set of said plurality of data fragments associated with said one of the data sets; reconstruct said one of the data sets, using said first erasure-coding scheme, from said data fragments received; and send said reconstruction to the first compute element as a response to said request made; and
   each of the plurality of data interfaces is configured to: receive, from the first erasure-coding interface, one of said plurality of secondary data requests; extract, from the respective random access memory module, using a random-access read cycle, one of the data fragments associated with said secondary data request; and send the data fragment extracted to said first erasure-coding interface as part of said responses received by the first erasure-coding interface,
   such that a combined result is that a first period beginning in said sending of the request and ending in said receiving of the response to said request is bounded by 5 (five) microseconds.

2. The system of claim 1, wherein:
   one of the plurality of random access memory modules and the associated data interface are located in a first server; and
   said first erasure-coding interface, said first compute element, others of the plurality of random access memory modules, and others of the associated data interfaces, are all located outside said first server;
   such that the system is a distributed system that is configured to endure any failure in the first server, and such that said reconstruction is unaffected by said failure, due the use of said first erasure-coding interface and the use of said first erasure-coding scheme.

3. A system operative to achieve data resiliency in a shared memory pool, comprising:
   a plurality of memory modules belonging to a shared memory pool and associated respectively with a plurality of data interfaces;
   a first erasure-coding interface communicatively connected with said plurality of data interfaces; and
   a first compute element communicatively connected with said first erasure-coding interface,
   wherein:
   said plurality of memory modules are configured to distributively store a plurality of data sets, such that each data set is distributively stored among at least two of the memory modules in a form of a plurality of data fragments coded using a first erasure-coding scheme, and each data fragment is stored on a different one of the at least two memory modules;
   said first compute element is configured to send to the first erasure-coding interface a request for one of the data sets;
   the first erasure-coding interface is configured to: convert said request into a first plurality of secondary data requests; send said first plurality of secondary data requests respectively into at least a first sub-set of said plurality of data interfaces; receive as responses at least a sub-set of said plurality of data fragments associated with said one of the data sets; reconstruct said one of the data sets, using said first erasure-coding scheme, from said data fragments received; and send said reconstruction to the first compute element as a response to said request made; and
   each of the plurality of data interfaces is configured to: receive, from the first erasure-coding interface, one of said plurality of secondary data requests; extract, from the respective memory module, using a random-access read cycle, one of the data fragments associated with said secondary data request and send the data fragment extracted to said first erasure-coding interface as part of said responses received by the first erasure-coding interface,
   in which the system further comprising:
   additional erasure-coding interfaces, each configured to perform all tasks associated with said first erasure-coding interface, such that any failure of the first erasure-coding interface still allows the system to perform said reconstruction using at least one of the additional erasure-coding interfaces instead of the first erasure-coding interface.

4. The system of claim 3, wherein:
   said first erasure-coding interface is located in a second server; and
   said additional erasure-coding interfaces, said first compute element, and said others of the plurality of memory modules and the associated data interfaces, are all located outside said second server,
   such that the system is a distributed system, and is configured to endure any failure in the second server, and such that said reconstruction is still possible even after a failure in the second server.

5. A system operative to achieve data resiliency in a shared memory pool, comprising:
- a plurality of memory modules belonging to a shared memory pool and associated respectively with a plurality of data interfaces;
- a first erasure-coding interface communicatively connected with said plurality of data interfaces; and
- a first compute element communicatively connected with said first erasure-coding interface, wherein:
- said plurality of memory modules are configured to distributively store a plurality of data sets, such that each data set is distributively stored among at least two of the memory modules in a form of a plurality of data fragments coded using a first erasure-coding scheme, and each data fragment is stored on a different one of the at least two memory modules;
- said first compute element is configured to send to the first erasure-coding interface a request for one of the data sets;
- the first erasure-coding interface is configured to: convert said request into a first plurality of secondary data requests; send said first plurality of secondary data requests respectively into at least a first sub-set of said plurality of data interfaces; receive as responses at least a sub-set of said plurality of data fragments associated with said one of the data sets; reconstruct said one of the data sets, using said first erasure-coding scheme, from said data fragments received; and send said reconstruction to the first compute element as a response to said request made; and
- each of the plurality of data interfaces is configured to: receive, from the first erasure-coding interface, one of said plurality of secondary data requests; extract, from the respective memory module, using a random-access read cycle, one of the data fragments associated with said secondary data request; and send the data fragment extracted to said first erasure-coding interface as part of said responses received by the first erasure-coding interface, in which the system further comprising:
- additional erasure-coding interfaces, each configured to perform all tasks associated with said first erasure-coding interface; and
- additional compute elements, each configured to associate with at least one of the erasure-coding interfaces in conjunction with erasure-coding transactions associated with the plurality of memory modules and the plurality of data fragments,
- such that each of the plurality of compute elements, including the first compute element, is configured to receive said one of the data sets reconstructed using at least one of said additional erasure-coding interfaces, and such that said shared memory pool is configured to serve said plurality of data sets to said plurality of compute elements regardless of any failure in one of the memory modules.

6. The system of claim 5, wherein:
- said plurality of memory modules are based on dynamic-random-access-memory (DRAM);
- at least 64 (sixty four) memory modules are included in said plurality of memory modules; and
- said first erasure-coding interface together with the additional erasure-coding interfaces are communicatively connected with said plurality of data interfaces using a switching network selected from a group consisting of: (i) a non-blocking switching network, (ii) a fat tree packet switching network, and (iii) a cross-bar switching network,
- such that a combined result is that a rate at which said data sets are being reconstructed is at least 400 Giga-bits-per second.

7. A system operative to achieve data resiliency in a shared memory pool, comprising:
- a plurality of random access memory modules belonging to a shared memory pool and associated respectively with a plurality of data interfaces;
- a first erasure-coding interface communicatively connected with said plurality of data interfaces using a switching network selected from a group consisting of: (i) a non-blocking switching network, (ii) a fat tree packet switching network, and (iii) a cross-bar switching network; and
- a first compute element communicatively connected with said first erasure-coding interface, wherein:
- said plurality of random access memory modules are configured to distributively store a plurality of data sets, such that each data set is distributively stored among at least two of the random access memory modules in a form of a plurality of data fragments coded using a first erasure-coding scheme, and each data fragment is stored on a different one of the at least two random access memory modules;
- said first compute element is configured to send to the first erasure-coding interface a request for one of the data sets;
- the first erasure-coding interface is configured to: convert said request into a first plurality of secondary data requests; send, via the switching network, said first plurality of secondary data requests respectively into at least a first sub-set of said plurality of data interfaces; receive as responses, via the switching network, at least a sub-set of said plurality of data fragments associated with said one of the data sets; reconstruct said one of the data sets, using said first erasure-coding scheme, from said data fragments received; and send said reconstruction to the first compute element as a response to said request made; and
- each of the plurality of data interfaces is configured to: receive, from the first erasure-coding interface, one of said plurality of secondary data requests; extract, from the respective random access memory module, using a random-access read cycle, one of the data fragments associated with said secondary data request; and
- send the data fragment extracted to said first erasure-coding interface as part of said responses received by the first erasure-coding interface,
- such that a combined result is that a rate at which said data sets are being reconstructed is at least 100 Giga-bits-per second.

8. A system operative to achieve data resiliency in a shared memory pool, comprising:
- a plurality of memory modules belonging to a shared memory pool and associated respectively with a plurality of data interfaces;
- a first erasure-coding interface communicatively connected with said plurality of data interfaces; and
- a first compute element communicatively connected with said first erasure-coding interface, wherein:

said plurality of memory modules are configured to distributively store a plurality of data sets, such that each data set is distributively stored among at least two of the memory modules in a form of a plurality of data fragments coded using a first erasure-coding scheme, and each data fragment is stored on a different one of the at least two memory modules;

said first compute element is configured to send to the first erasure-coding interface a request for one of the data sets;

the first erasure-coding interface is configured to: convert said request into a first plurality of secondary data requests; send said first plurality of secondary data requests respectively into at least a first sub-set of said plurality of data interfaces;

receive as responses at least a sub-set of said plurality of data fragments associated with said one of the data sets; reconstruct said one of the data sets, using said first erasure-coding scheme, from said data fragments received; and send said reconstruction to the first compute element as a response to said request made; and each of the plurality of data interfaces is configured to: receive, from the first erasure-coding interface, one of said plurality of secondary data requests; extract, from the respective memory module, using a random-access read cycle, one of the data fragments associated with said secondary data request; and send the data fragment extracted to said first erasure-coding interface as part of said responses received by the first erasure-coding interface, in which:

said one of the data sets is a first value associated with a first key;

said first value is stored as one of the pluralities of data fragments in said plurality of memory modules;

said request for one of the data sets is a request for the first value, in which the request conveys said first key;

said first plurality of secondary data requests are requests for said one of the pluralities of data fragments, in which each of said requests for said one of the pluralities of data fragments conveys said first key or a derivative of the first key to the respective data interface; and the respective data interface is configured to use said first key or a derivative of the first key to determine an address from which to perform said random access read cycles.

9. A system operative to stream data resiliently into a shared memory pool, comprising:

a plurality of random access memory modules belonging to a shared memory pool and associated respectively with a plurality of data interfaces;

a first erasure-coding interface communicatively connected with said plurality of data interfaces using a switching network selected from a group consisting of: (i) a non-blocking switching network, (ii) a fat tree packet switching network, and (iii) a cross-bar switching network; and a first compute element communicatively connected with said first erasure-coding interface, wherein:

the first compute element is configured to stream a plurality of data sets into said first erasure-coding interface;

the first erasure-coding interface is configured to: receive said stream; convert in real-time each of said plurality of data sets in the stream into a plurality of data fragments using a first erasure-coding scheme; and stream each of said pluralities of data fragments respectively into said plurality of data interfaces via the switching network, such that a plurality of sub-streams of data fragments are created in conjunction with said plurality of data interfaces; and each of the data interfaces is configured to: receive one of said sub-streams of data fragments; and write in real-time each of the data fragments in the sub-stream into the respective random access memory module using a random-access write cycle, thereby resulting in a real-time erasure-coding of said stream of data sets into said shared memory pool as facilitated by said first erasure-coding interface and said random-access write cycles, such that any one of said data sets is written in said plurality of memory modules no later than 5 (five) microseconds from being put in said stream.

10. A system operative to stream data resiliently into a shared memory pool, comprising:

a plurality of random access memory modules belonging to a shared memory pool and associated respectively with a plurality of data interfaces;

a first erasure-coding interface communicatively connected with said plurality of data interfaces using a switching network selected from a group consisting of: (i) a non-blocking switching network, (ii) a fat tree packet switching network, and (iii) a cross-bar switching network; and a first compute element communicatively connected with said first erasure-coding interface, wherein:

the first compute element is configured to stream a plurality of data sets into said first erasure-coding interface;

the first erasure-coding interface is configured to: receive said stream; convert in real-time each of said plurality of data sets in the stream into a plurality of data fragments using a first erasure-coding scheme; and stream each of said pluralities of data fragments respectively into said plurality of data interfaces via the switching network, such that a plurality of sub-streams of data fragments are created in conjunction with said plurality of data interfaces; and each of the data interfaces is configured to: receive one of said sub-streams of data fragments; and write in real-time each of the data fragments in the sub-stream into the respective random access memory module using a random-access write cycle, thereby resulting in a real-time erasure-coding of said stream of data sets into said shared memory pool as facilitated by said first erasure-coding interface and said random-access write cycles, such that a combined result is that a rate at which said data sets are being written is at least 100 Giga-bits-per second.

* * * * *